(12) United States Patent
Nozaki et al.

(10) Patent No.: US 6,773,867 B2
(45) Date of Patent: Aug. 10, 2004

(54) NEGATIVE RESIST COMPOSITION, METHOD FOR THE FORMATION OF RESIST PATTERNS AND PROCESS FOR THE PRODUCTION OF ELECTRONIC DEVICES

(75) Inventors: Koji Nozaki, Kawasaki (JP); Takahisa Namiki, Kawasaki (JP); Ei Yano, Kawasaki (JP); Junichi Kon, Kawasaki (JP); Miwa Kozawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/291,723

(22) Filed: Nov. 12, 2002

(65) Prior Publication Data

US 2003/0143482 A1 Jul. 31, 2003

Related U.S. Application Data

(62) Division of application No. 09/654,433, filed on Sep. 1, 2000, now Pat. No. 6,506,534.

(30) Foreign Application Priority Data

| Sep. 2, 1999 | (JP) | ............................................ | 11-248619 |
| Sep. 14, 1999 | (JP) | ............................................ | 11-260815 |
| Mar. 6, 2000 | (JP) | ......................................... | 2000-61090 |
| Mar. 6, 2000 | (JP) | ......................................... | 2000-61091 |
| Aug. 28, 2000 | (JP) | ...................................... | 2000-257661 |

(51) Int. Cl.$^7$ .............................................. G03C 5/00
(52) U.S. Cl. ......................... 430/313; 430/314; 430/325
(58) Field of Search ................................ 430/313, 325, 430/314

(56) References Cited

U.S. PATENT DOCUMENTS

| 5,541,036 A | 7/1996 | Igawa et al. |
| 5,563,011 A | 10/1996 | Shipley |
| 6,027,856 A | 2/2000 | Nozaki et al. |

FOREIGN PATENT DOCUMENTS

| EP | 0827025 A1 | 4/1998 |
| EP | 0887706 A1 | 12/1998 |
| JP | 04-216556 | 8/1992 |
| JP | 10003169 | 1/1998 |
| JP | 11-258801 | * 9/1999 |

OTHER PUBLICATIONS

Uchino et al; "Negative EB Resist Materials Using Anisotropic Acid–Diffusion Based on Acid–Catalyzed Dehydration of Phenylcarbinols" *J.Photopolymer Sc&Tech*. vol. 11, No. 4 (1998) pp. 555–564.

Kocon et al; "Process optimization of 200 nm wide trenches in $SiO_2$ using a chemically amplified acid catalyzed e–beam resist", *J. Vacuum Sc&Tech*. vol.B–10; (1992) No. 6; pp. 2548–2553.

Tsuchiya et al; "Investigation of Acid–Catalyzed Insolubilization Reactions for Alicyclic Polymers with Carboxyl Groups" *J.Photopolymer Sc&Tech*. vol. 10; No. 4 (1997) pp. 579–584.

Uchino et al; "Chemically amplified negative resists using acid–catalyzed etherification of carbinol"; *Microelectronic Eng.*; vol. 18, No. 4 (1992); pp. 341–351. French Office Action dated May. 18, 2001.

Chemical Abstract 131:250429.

* cited by examiner

*Primary Examiner*—Rosemary Ashton
(74) *Attorney, Agent, or Firm*—Armstrong, Kratz, Quintos, Hanson & Brooks, LLP

(57) ABSTRACT

The negative resist composition comprises (1) a film-forming polymer which is itself soluble in basic aqueous solutions, and contains a first monomer unit with an alkali-soluble group in the molecule and a second monomer unit with an alcohol structure on the side chain which is capable of reacting with the alkali-soluble group, and (2) a photo acid generator which, when decomposed by absorption of image-forming radiation, is capable of generating an acid that can induce reaction between the alcohol structure of the second monomer unit and the alkali-soluble group of the first monomer unit, or protect the alkali-soluble group of the first monomer unit. The resist composition can form intricate negative resist patterns with practical sensitivity and no swelling.

39 Claims, 5 Drawing Sheets

NEGATIVE RESIST COMPOSITION, METHOD FOR THE FORMATION OF RESIST PATTERNS AND PROCESS FOR THE PRODUCTION OF ELECTRONIC DEVICES

CROSS-REFERENCE TO RELATED APPLICATIONS

This application is a division of prior application Ser. No. 09/654,433 filed Sep. 1, 2000, now U.S. Pat. No. 6,506,534.

This application is based upon and claims priority of Japanese Patent Applications Nos. Hei 11-248619, Hei 11-260815, 2000-61090, 2000-61091, and 2000-257661, all filed, the contents being incorporated herein by reference.

BACKGROUND OF THE INVENTION

1. Field of the Invention

The present invention relates to a resist composition, and more specifically it relates to a chemical amplification resist composition that can be developed by a basic aqueous solution after exposure. The invention further relates to a negative resist pattern forming method employing the resist composition. The resist composition of the-invention can be used to form intricate negative resist patterns that have practical sensitivity without swelling. Furthermore, the present invention relates to electronic devices including semiconductor devices such as LSI and VLSI and magnetic recording heads such as MR heads, and the production process thereof.

2. Description of the Related Art

Higher integration of semiconductor integrated circuits has progressed to the current situation in which LSIs and VLSIs are feasible, and the minimal wiring widths of wiring patterns have reached the range of 0.2 Am and smaller. This has rendered essential the establishment of microworking techniques, and in the field of lithography the demand has largely been met by shifting the ultraviolet wavelengths of light exposure sources to shorter wavelengths in the far ultraviolet range; it has been predicted that light exposure techniques employing light sources with wavelengths in the deep ultraviolet range will soon be implemented in mass production processes. At the same time, development has been rapidly progressing with resist materials that exhibit lower light absorption of the aforementioned shorter wavelengths, have satisfactory sensitivity and also exhibit high dry etching resistance.

In recent years much research has been conducted in the field of photolithography employing as the exposure light sources krypton fluoride excimer lasers (wavelength: 248 nm, here under abbreviated to KrF), as a new light exposure technique for manufacture of semiconductor devices, and they are being widely used for mass production. H. Ito et al. of IBM, U.S.A. have already developed resist compositions based on the concept of "chemical amplification", as resists with high sensitivity and high resolution that are suitable for such short wavelength light exposure. (See, for example, J. M. J. Frechet et al., *Proc. Microcircuit Eng.*, 260(1982), H. Ito et al., Digest of Technical Papers of 1982 Symposium on VLSI Technology, 86(1983), H. Ito et al., "Polymers in Electronics", ACS Symposium Series 242, T. Davidson ed., ACS, 11(1984), and U.S. Pat. No. 4,491,628). As is readily understood from these publications, the fundamental concept of chemical amplification resist compositions is based on higher sensitivity through an improved apparent quantum yield achieved by a catalytic reaction in the resist film.

There may be cited the very widely used and researched chemical amplification resist type that comprises t-butoxycarbonyl polyvinylphenol (t-BOCPVP) and further contains a Photo Acid Generator (PAG), which has the function of generating an acid upon light exposure; "post exposure baking" (PEB) of the exposed sections of the resist results in loss of the t-BOC groups to give isobutene and carbon dioxide. The proton acid produced upon loss of t-BOC serves as a catalyst promoting a deprotection chain reaction, which greatly alters the polarity of the exposed sections. With this type of resist, an appropriate developer can be selected to match the large change in polarity of the exposed sections, to easily form an intricate resist pattern with no swelling.

Incidentally, one of the high-resolution techniques widely used in recent years is a method employing a mask that alters the phase of light, known as a phase-shift mask or Levenson mask, and it holds promise as a method that can give resolution below the exposure light wavelength and an adequate focal depth. When such masks are used, negative resists are usually appropriate due to restrictions of the mask pattern, and this has created a strong demand for provision of negative resists. When KrF is used as the light source, these masks are considered for applications in which resolution of under 0.20 $\mu$m is required, and this has led to spurring development of high performance resists that can resolve intricate patterns without swelling, as mentioned above. There has also been abundant research in the field of lithography using argon fluoride excimer lasers (wavelength: 193 nm, hereunder abbreviated to ArF) and electron beam (EB) sources, with even shorter wavelengths than KrF, and it is an essential technique for formation of patterns of less than 0.13 $\mu$m. The development of a negative resist that can be used for ArF, EB and the like on which more advanced microworking depends, will therefore provide many industrial advantages.

Alkali-developable negative resists for KrF and EB include those based on polar reaction caused by an acid-catalyzed reaction [for example, H. Ito et al., Proc. SPIE, 1466, 408(1991), S. Uchino et al., J. Photopolym. Sci. Technol., 11(4), 553–564(1998), etc.] and those based on acid catalyzed crosslinking reaction [for example, J. W. Thackeray et al., Proc. SPIE, 1086, 34(1989), M. T. Allen et al., J. Photopolym. Sci. Technol., 7, 4(3), 379–387(1991), Liu H. I., J. Vac. Sci. Technol., B6, 379(1988), etc.]. Crosslinkable types of negative resists for ArF are also known [for example, A. Katsuyama et al., Abstracted Papers of Third International Symposium on 193 nm Lithography, 51(1997), K. Maeda et al., J. Photopolym. Sci. Technol., 11(4), 507–512(1998), etc.]

However, despite the strong demand for a high performance negative resist that can be used for high resolution techniques employing the aforementioned phase-shift masks or Levenson masks and that can be applied for KrF, ArF and EB, the existing negative resists that are practical for use consist of only the crosslinkable types mentioned above. Crosslinkable negative resists accomplish patterning by utilizing a crosslinking reaction to increase the molecular weight at the exposed sections, thus producing a difference in solubility in the developing solution with respect to the unexposed sections; it is therefore difficult to increase contrast, and unlike resists based on polar reaction caused by an acid-catalyzed reaction, it is impossible to circumvent the limitations on microworking due to pattern swelling.

As described above, when negative chemical amplification resists are examined, they are found to be largely classified as types that contain in the resist an alkali-soluble base resin, a photoacid generator that decomposes upon absorption of image-forming radiation to release an acid and a substance that causes a polarity change due to the acid-catalyzed reaction, and types that contain in the resin an alkali-soluble base resin, a photoacid generator that decomposes upon absorption of image-forming radiation to release an acid and a substance that can cause crosslinking reaction within the resin. The former chemical amplification resists that utilize a polar reaction typically make use of a pinacol transfer reaction as disclosed, for example, in R. Sooriya-kumaran et al., SPIE, 1466, 419(1991) and S. Uchino et al., SPIE, 1466, 429(1991). The acid-catalyzed reaction in such a resist proceeds in the following manner.

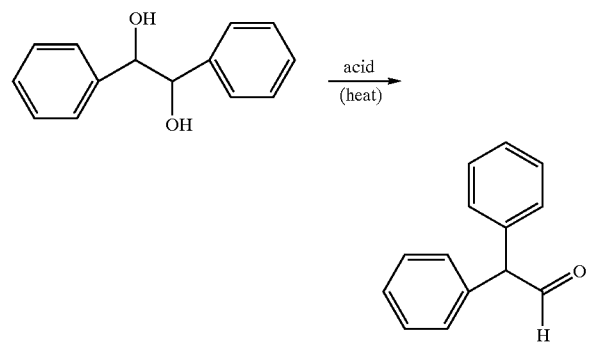

That is, the alkali-soluble pinacol is affected by the acid and heat, being rendered alkali-insoluble. However, such chemical amplification resists have a problem in terms of resolution. Although the pinacol itself is rendered alkali-insoluble by the acid-catalyzed reaction as explained above, the alkali-soluble base resin itself does not react and it is therefore impossible to achieve a sufficient dissolution rate difference.

Chemical amplification resists are also disclosed in Japanese Unexamined Patent Publications (Kokai) Nos. 4-165359, 7-104473, 11-133606, and elsewhere. For example, Japanese Unexamined Patent Publication (Kokai) No. 4-165359 discloses a radiation-sensitive composition characterized by containing an alkali-soluble polymer compound, a secondary or tertiary alcohol with a hydroxyl group on a carbon directly bonded to an aromatic ring, and an acid precursor that generates an acid upon radiation exposure. The secondary or tertiary alcohol used here may be, for example, a phenylmethanol derivative represented by the following formula.

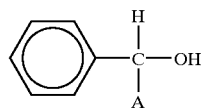

where A represents an alkyl or methylol group of no more than 4 carbons.

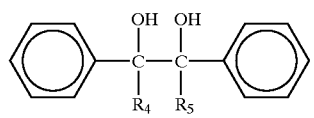

where $R_4$ and $R_5$ may be the same or different, and each represents a hydrogen atom or a phenyl group. The acid-catalyzed reaction in the resist proceeds in the following fashion.

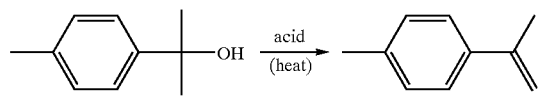

As mentioned above, the alkali-soluble polymer compound is affected by the acid and heat so that the secondary or tertiary alcohol forms a dehydration bond, thus becoming alkali-insoluble. However, because an aromatic ring is included in the secondary or tertiary alcohol that contributes to the acid-catalyzed reaction, although its presence in the chemical amplification resist is believed to be for improved etching resistance, this raises the problem of restrictions on the exposure light source. This is because the aromatic ring has high light absorption and is therefore particularly unsuitable for application to short wavelength KrF lasers and ArF lasers (argon fluoride excimer laser: wavelength: 193 nm). The other purpose of the aromatic ring is thought to be conjugated stabilization of the double bond produced by dehydration, but the hydroxyl group is bonded to the carbon directly bonded to the aromatic ring. With this structure, the dehydration in the alcohol molecule constitutes the primary reaction whereas reaction does not occur with the polar groups (phenolic hydroxyl group, etc.) of the base resin, such that the intended polar change is reduced. Furthermore, since no double bond is produced by dehydration with a primary alcohol, the use is limited to a secondary or tertiary alcohol, and it is desirable to eliminate this restriction in order to allow a wider scope of application.

Chemical amplification resists utilizing the latter acid-catalyzed crosslinking reaction typically make use of crosslinking reaction of an alkali-soluble resin with a melamine-based crosslinking agent such as methoxymethy-lol melamine, and such are disclosed, for example, in M. T. Allen et al., J. Photopolym. Sci. Technol., 7, 4(3), 379–387 (1991). The crosslinking reaction in the resist proceeds in the following fashion.

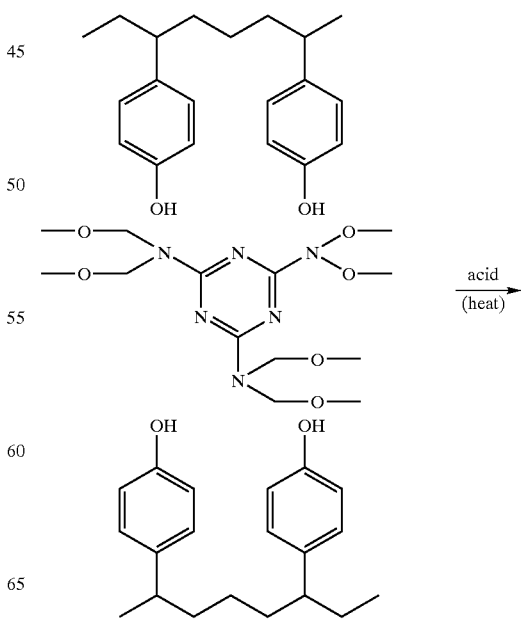

-continued

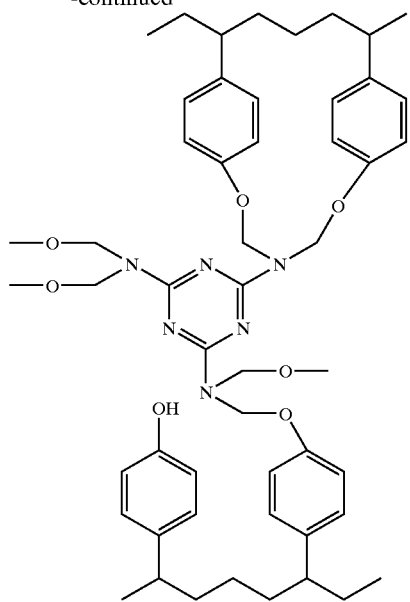

The use of a melamine-based crosslinking agent such as in this type of chemical amplification resist can provide an effect of lower alkali solubility through gelling reaction of the base resin (increased molecular weight by crosslinking of the resin) and through depolarization of the resin polar groups (phenolic hydroxyl groups) as a result of the crosslinking. However, the methoxymethylol melamine used here as the crosslinking agent inherently has low polarity, and therefore a sufficient dissolution rate difference cannot be produced. It is desirable to provide a resist that has high polarity of the resin and additives prior to light exposure, and low polarity of the resin and additives after light exposure.

SUMMARY OF THE INVENTION

The present invention is directed to overcome the aforementioned prior art problems.

In one aspect thereof, the present invention is directed to provide a novel resist composition that allows the use of basic aqueous solutions (standard alkali developers) as the developers, that have practical sensitivity and that can form intricate negative resist patterns with no swelling.

It is another object of the invention to provide a novel resist composition that is suitable for deep ultraviolet image-forming radiation, typical of which are KrF and ArF excimer lasers, as well as electron beams, and that also has excellent dry etching resistance.

It is yet another object of the invention to provide a novel resist composition that gives a high polarity difference between the exposed sections and unexposed sections, to form intricate patterns with high sensitivity, high contrast and high resolution.

It is still another object of the invention to provide a resist pattern forming method that employs the novel resist composition.

In another aspect, it is an object of the present invention to overcome the aforementioned problems associated with the prior art techniques by providing a resist composition that has a large dissolution rate difference between the exposed sections and unexposed sections, to allow formation of intricate patterns with high sensitivity, high contrast and high resolution.

It is another object of the invention to provide a resist composition that allows the use of basic aqueous solutions (standard alkali developers) as the developers.

It is yet another object of the invention to provide a resist composition that is suitable for deep ultraviolet image-forming radiation, typical of which are KrF and ArF excimer lasers, as well as electron beams, and that also has excellent dry etching resistance.

It is still yet another object of the invention to provide a resist pattern forming method employing a resist composition according to the invention.

In still another aspect, one object of the present invention is to provide a novel negative resist composition free of the problem of pattern swelling and capable of forming a fine pattern with practically usable sensitivity using a short wavelength light source for exposure. The object of the present invention includes providing a novel resist composition capable of coping with an exposure light source in the deep ultraviolet region, represented by KrF or ArF excimer laser, and having excellent dry etching resistance. The object of the present invention further includes providing a novel resist composition capable of greatly differentiating the polarity between the exposed area and the unexposed area and thereby forming a fine pattern favored with all of high sensitivity, high contrast and high resolution.

Another object of the present invention is to provide a method for forming a resist pattern using the above-described resist composition.

In addition to the above problems, there is another problem to be solved by the present invention.

The present inventors have already proposed in Japanese Patent Application No. 11-260815 a novel polarity-changing, high-performance negative resist composition as a resist that can meet the demands described above. The proposed resist composition employs an alicyclic alcohol, and preferably a tertiary alcohol with a stereochemically fixed structure, as the alkali-insolubilizing additive. The resist composition can form an intricate negative resist pattern with a larger polarity difference between the exposed and unexposed sections and higher sensitivity, contrast and resolution compared to conventional resists, by the reaction shown in formula (13) below, for example.

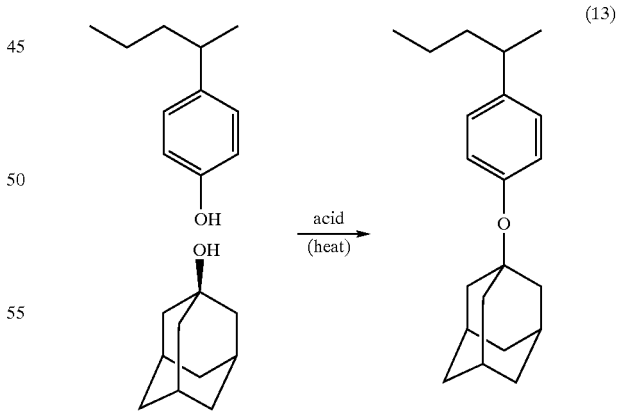

(13)

As a result of more diligent research on the aforementioned negative resists, the present inventors have completed the present invention upon determining the most suitable conditions for obtaining resist patterns with high sensitivity and high resolution.

That is, the present invention has been completed upon finding that it is possible to provide a negative resist composition with even higher-sensitivity and higher resolution by setting numerical limits on the molecular weight distribution of the base resin used according to the first aspect of the invention, and by limiting the range for the molecular weight of the base resin used according to the second aspect.

It is therefore one object of the invention to provide a novel negative resist composition with vastly improved sensitivity and resolution.

It is another object to provide a negative resist pattern forming method employing the novel negative resist composition.

Further, the present invention has an object to provide a process for the production of electronic devices using novel negative resist composition of the present invention, and electronic devices produced upon application of such production process.

The above objects and other objects of the present invention will be appreciated from the following descriptions of the present invention referring to preferred embodiments thereof.

First Invention:

As a result of diligent research aimed at achieving the objects in the first aspect of the present invention, the present inventors have completed the present invention upon discovering that for chemical amplification resist compositions, it is important to use as the base resin a film-forming polymer which has an alkali-soluble group in the molecule and is soluble in basic aqueous solutions, and to include in the polymer a monomer unit with an alcohol structure, preferably a tertiary alcohol structure, on the side chain. When the photo acid generator used in combination with the film-forming polymer in the resist composition of the invention absorbs image-forming radiation and decomposes, it produces an acid which either induces reaction between the alcohol structure on the side chain of the monomer unit in the polymer and the portion of the same polymer with the alkali soluble group, or else protects the alkali-soluble group. As a result, the exposed sections that have absorbed the image-forming radiation are rendered alkali-insoluble, allowing formation of a negative resist pattern.

The present invention (first invention) resides in a negative resist composition which is developable in basic solutions, characterized by comprising (1) a film-forming polymer which is itself soluble in basic aqueous solutions, and contains a first monomer unit with an alkali-soluble group and a second monomer unit with an alcohol structure capable of reacting with the alkali-soluble group, and (2) a photo acid generator which, when decomposed by absorption of image-forming radiation, is capable of generating an acid that can induce reaction between the alcohol structure of the second monomer unit and the alkali-soluble group of the first monomer unit, or protect the alkali-soluble group of the first monomer unit, and by being itself soluble in basic aqueous solutions, but upon exposure to the image-forming radiation being rendered insoluble in basic aqueous solutions at its exposed sections as a result of the action of the photo acid generator.

In another aspect of the present invention, the present invention resides in a negative resist pattern forming method, characterized by comprising the following steps:

coating a negative resist composition of the invention onto a target substrate, selectively exposing the formed resist film to image-forming radiation that can induce decomposition of the photo acid generator of the resist composition, and developing the exposed resist film with a basic aqueous solution.

Second Invention:

As a result of diligent research aimed at achieving the objects in the second aspect of the present invention, the present inventors have completed the present invention upon discovering that for chemical amplification resist compositions, it is effective to include, in addition to a base resin composed of an alkali-soluble polymer and a photoacid generator capable of decomposing upon absorption of image-forming radiation to generate an acid, also an alicyclic alcohol, and especially a tertiary alcohol with a stereochemically fixed structure, as an additive that can render the resist alkali-insoluble.

The present invention (second invention) therefore provides a negative resist composition characterized by comprising a combination of the following reaction components:

(1) a base resin composed of an alkali-soluble polymer, (2) a photoacid generator capable of decomposing upon absorption of image-forming radiation to generate an acid, and (3) an alicyclic alcohol with a reactive site that can undergo dehydration bonding reaction with the polymer of the base resin in the presence of the acid generated by the photoacid generator.

The present invention also provides a negative resist pattern forming method, characterized by comprising the following steps:

coating a negative resist composition according to the invention onto a target substrate, selectively exposing the formed resist film to image-forming radiation that can induce decomposition of the photoacid generator of said resist composition, and developing said resist film with a basic aqueous solution after post exposure baking.

The resist composition of the invention encompasses, as a preferred mode in addition to the description in the claims, a negative resist composition characterized in that the base resin is a phenol-based polymer, a (meth)acrylate-based polymer or a mixture thereof.

Third Invention:

As a result of extensive investigations to solve the above-described problems in the third aspect of the present invention, the present inventors have found that for the chemically amplified resist composition, the matter of importance is to use a film-forming first polymer having an alkali-soluble group and being soluble in a basic aqueous solution as the base resin and at the same time to contain a second polymer having an alcohol structure on the side chain in the resist composition. The present invention has been accomplished based on this finding.

More specifically, the above-described object of the present invention can be attained, by a negative resist composition comprising a first polymer having an alkali-soluble group, a second polymer having on the side chain an alcohol structure capable of reacting with the alkali-soluble group, and a photoacid generator capable of generating an acid which decomposes by absorbing a radiation for forming an image and excites a reaction between the alkali-soluble group of the first polymer and the alcohol of the second polymer, wherein the composition itself is soluble in a basic aqueous solution and upon exposure to the radiation for forming an image, the exposed area becomes insoluble in the basic aqueous solution under the action of the photoacid generator.

According to the present invention, when the negative resist composition is exposed to a radiation for forming an image, the photoacid generator generates an acid capable of exciting an reaction between the alkali-soluble group of the first polymer and the alcohol of the second polymer, as a result, an acid catalytic reaction takes place, whereby the exposed area can be insolubilized in a basic aqueous solution.

Furthermore, in the negative resist composition of the present invention, the reaction excited by the photoacid generator can be a protection-type reaction of protecting the alkali-soluble group and/or an insolubility promotion-type reaction of promoting the insolubilization of the alkali-soluble group in a basic aqueous solution.

Upon reaction of the alcohol with the alkali-soluble group of the first polymer, the reaction site of the alcohol forms an ether bond, an ester bond or the like to protect the alkali-soluble group of the first polymer and thereby insolubilize the alkali-soluble group in a basic aqueous solution. As a result, a great difference arises in the polarity between the unexposed area and the exposed area. By virtue of this, the negative resist composition can be free of the problem that the exposed area swells, and favored with all of high sensitivity, high contrast and high resolution.

Accompanying the above-described protection-type reaction, an alkali insolubility promotion-type reaction of diminishing the property of the alkali-soluble group in the first polymer may be allowed to proceed. In this case, the difference in the solubility from the unexposed area increases, therefore, a negative fine resist pattern can be similarly formed.

Furthermore, in the negative resist composition of the present invention, the alcohol structure is preferably a tertiary alcohol structure. When the second polymer contains a tertiary alcohol structure on the side chain, a dehydration reaction readily takes place with the alkali-soluble group of the first polymer and the reaction between the first polymer and the second polymer can be accelerated.

In addition, in the negative resist composition of the present invention, the tertiary alcohol structure may be a structure represented by any one of the following formulae (1) to (4):

(1)

wherein R represents an atomic group connected to the main chain of the second polymer and $R_1$ and $R_2$ each is an arbitrary alkyl group having from 1 to 8 carbon atoms containing a linear or branched structure or a cyclic structure;

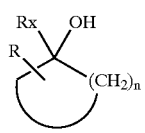
(2)

wherein R has the same meaning as defined above, n is a number of 2 to 9 and $R_x$ is a group having from 1 to 8 carbon atoms containing a linear or branched structure or a cyclic structure;

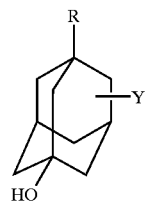
(3)

wherein R has the same meaning as defined above, Y represents hydrogen atom or an arbitrary alkyl group having from 1 to 6 carbon atoms, an alkoxycarbonyl group, a ketone group, a hydroxyl group or a cyano group;

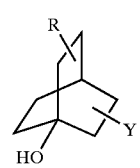
(4)

wherein R and Y each has the same meaning as defined above.

The tertiary alcohol having the structure shown above can undertake the reaction of insolubilizing the alkali-soluble group of the first polymer in the presence of an acid generated from the photoacid generator and thereby more surely insolubilize the exposed area in a basic aqueous solution.

It is sufficient if the second polymer has compatibility with the first polymer, and the first polymer and the second polymer each is not particularly limited on the main chain moiety thereof. However, in the negative resist composition of the present invention, the first polymer and the second polymer each may comprise at least one monomer unit selected from the group consisting of acrylic acid-type, methacrylic acid-type, itaconic acid-type, vinylbenzoic acid-type, vinylphenol-type, bicyclo[2.2.1]hept-5-ene-2-carboxylic acid-type and N-substituted maleimide-type compounds and derivatives thereof. The monomer unit of the first polymer and the monomer unit of the second polymer may be the same or different. Each polymer may be formed of a single monomer or may be in the form of a copolymer.

In the first polymer as the base resin, the ratio occupied by the monomer unit having an alkali-soluble group is not limited as long as the resin itself shows appropriate alkali solubility, however, it is necessary to take account of obtaining an appropriate alkali solubility speed which is considered practicable as the negative resist (in a 2.38% TMAH developer, a solubility speed of approximately 100 to 30,000 Å/s). If such an alkali solubility speed is satisfied, a homopolymer comprising one component monomer unit may be used as the alkali-soluble base resin and this composition is preferred. Examples of such a resin include polyvinyl phenol, polyvinylbenzoic acid, polymethacrylic acid and polyacrylic acid.

In the case where the polymer comprises a monomer unit consisting of two or more components and the alkali-soluble group is a carboxyl group, the monomer unit content is preferably from 10 to 90 mol %, more preferably from 30 to 70 mol %. If the monomer unit content is less than 1 mol %, the alkali solubility is insufficient and the patterning cannot be satisfactorily performed, whereas if it exceeds 90 mol %, the alkali solubility is too strong and the dissolution in a basic aqueous solution proceeds at an excessively high speed, as a result, the patterning by the change in the polarity cannot be obtained. The monomer unit content is still more preferably from 30 to 50 mol %.

In the case where the alkali-soluble group is a phenolic hydroxyl group, the monomer unit content is preferably from 20 to 99 mol %, more preferably from 50 to 95 mol %. If the monomer unit content is less than 30 mol %, the alkali solubility is insufficient and the patterning cannot be satisfactorily performed. The monomer unit content is still more preferably from 80 to 95 mol %.

In this negative resist composition, the content of the second polymer is not particularly limited, and it may be sufficient if in view of the relationship with the first polymer, the content is large enough to maintain the alkali solubility of the composition as a whole and at the same time insolubilize the alkali-soluble group of the first polymer. In this negative resist composition, the second polymer content is preferably from 0.1 to 80 wt % based on the total polymer weight of the first and second polymers.

Furthermore, in this negative resist composition of the present invention, the molecular weight of the second polymer is not particularly limited and it may be sufficient if in view of the relationship with the first polymer, the alkali solubility of the composition as a whole can be maintained. In this negative resist composition, the molecular weight of the second polymer is preferably from 500 to 100,000.

In the negative resist composition of the present invention, a compound having an alcohol structure may further be added. In the case where the alcohol structure of the second polymer is lacking, by further adding another compound having an alcohol structure, the insolubilization of the exposed area of this negative resist in a basic aqueous solution can be accelerated without fail.

The above-described compound having an alcohol structure preferably contains a tertiary alcohol structure. This compound reacts, similarly to the second polymer having an alcohol structure, with the alkali-soluble group of the first polymer, so that the insolubilization of the alkali-soluble group of the first polymer in a basic aqueous solution can be accelerated in the exposed area.

Examples of the alcohol structure which can be used include an allyl alcohol structure and a secondary or tertiary alcohol structure. Among these, a tertiary structure is preferred. The compound having this structure is particularly effective because it can reacts with the alkali-soluble group and greatly contributes to the formation of a negative pattern.

From the standpoint that the compound having an alcohol structure must have a boiling point sufficiently high not to vaporize during the ordinary resist processing and lose its function, the boiling point of the compound having an alcohol structure is preferably at least 130° C. or more.

In this negative resist, the compound having an alcohol structure preferably contains an alicyclic structure or a polynuclear alicyclic structure. By having such a structure, the etching resistance at the etching can also be improved.

In this negative resist composition, the compound having an alcohol structure preferably contains at least one hydroxyl group, ketone group or alkyloxycarbonyl group.

Furthermore, in this negative resist composition, the first polymer may further contain an alkali-soluble group selected from a lactone ring, an imide ring and an acid anhydride. When the first polymer contains this weak alkali-soluble group as the second monomer unit, the alkali solubility speed can be easily controlled.

In the negative resist composition of the present invention, the molecular weight of the first polymer is suitably from 2,000 to 1,000,000.

In the negative resist composition of the present invention, the photoacid generator (PAG) content depends on the strength of the acid generated after the composition is exposed to an exposure light source, however, usually, the content is suitably from 0.1 to 50 wt % (a percentage to the total polymer weight of the first and second polymers), preferably from 1 to 15 wt %. The molecular weight (weight average molecular weight) of the base resin is suitably from 2,000 to 1,000,000, preferably from 5,000 to 100,000, more preferably from 3,000 to 50,000. The molecular weight (weight average molecular weight) of the second polymer having on the side chain an alcohol structure capable of reacting an alkali-soluble group is suitably from 300 to 1,000,000, preferably from 500 to 100,000, more preferably from 1,000 to 10,000.

The resist composition of the present invention is preferably provided in the form of a solution obtained by dissolving it in a solvent selected from the group consisting of ethyl lactate, methyl amyl ketone, methyl-3-methoxypropionate, ethyl-3-ethoxypropionate, propylene glycol methyl ether acetate and a mixture thereof. The resist composition may further contain, if desired, a solvent selected from the group consisting of butyl acetate, γ-butyrolactone, propylene glycol methyl ether and a mixture thereof, as an auxiliary solvent.

Another object of the present invention can be achieved by a method for forming a resist pattern, comprising a series of steps for coating the negative resist composition on a treated substrate, i.e., target substrate as defined hereinafter, to form a resist film, for selectively exposing the resist film by a radiation for forming an image to accelerate the decomposition of said photoacid generator, and for developing the exposed resist film with a basic aqueous solution.

In the method for forming a resist pattern according to the present invention, the resist film formed on a treated substrate is preferably subjected to a heat treatment before and after the step of performing the selective exposure thereof. More specifically, in the present invention, the resist film is preferably subjected to a pre-baking treatment before the exposure thereof and at the same time to a post-baking treatment described above as PEB (post exposure baking) after the exposure but before the development. These heat treatments can be advantageously performed by an ordinary method.

Although the resist composition of the present invention preferably has an absorbance of 1.75/μm or less at the wavelength of the exposure light source (from 150 to 300 nm) for obtaining satisfactory patterning characteristics, in the case of using EB as the light source, the absorbance is not particularly limited.

Examples of the basic aqueous solution used as the developer include an aqueous solution of a metal hydroxide belonging to Group I or II, represented by potassium hydroxide, and an aqueous solution of an organic base not containing a metal ion, such as tetraalkylammonium hydroxide. Among these, preferred is an aqueous solution of tetramethylammonium hydroxide. In order to improve the development effect, additives such as surfactant may also be added.

Fourth Invention:

The objects in the fourth aspect of the present invention are achieved by a negative resist composition wherein the molecular weight distribution of the sections rendered insoluble by light exposure is between 1 and 2 inclusive, as an invention based on limitation of the molecular weight distribution.

According to the present invention, since the insolubilized sections are formed primarily by a reaction based on polarity changes, it is possible to provide a resist composition with vastly improved sensitivity and resolution without the problem of pattern swelling.

The molecular weight distribution is the value obtained by dividing the weight average molecular weight by the number average molecular weight. With conventional resists, the molecular weight varies considerably depending on crosslinking reaction and the variation differs widely for the particular molecule; the molecular weight distribution of the insolubilized sections is therefore usually a value of from 3 to 4 or higher, whereas that of the resist composition of the invention is in the range of 1 to 2 inclusive, so that the polymer used is more uniform. Since this type of resist does not undergo "gelling" by molecular weight increase, it has an advantage in that the resist that has transferred the required pattern can be easily released with an organic solvent or the like.

The negative resist composition may also have the structure described in the claim, containing a base resin which comprises an alkali-soluble polymer, a photo acid generator which is capable of decomposing upon absorption of image-forming radiation to generate an acid, and an alicyclic alcohol with a reactive site that can undergo dehydration bonding reaction with the alkali-soluble group of the base resin in the presence of the acid generated by the photo acid generator.

According to the present invention, there is included an alicyclic alcohol with a reactive site that can undergo dehydration bonding reaction with the alkali-soluble group of the base resin, and therefore the polarity change is increased when it is added to an alkali-soluble polymer, while the etching resistance can also be improved. Furthermore, since the molecular weight distribution at the sections insolubilized by light exposure is in the range of 1 to 2 inclusive, it is possible to give a negative resist composition with higher sensitivity and higher resolution.

The base resin in the negative resist composition preferably has a molecular weight distribution of between 1 and 1.5 inclusive. Using a base resin with a molecular weight distribution in this range will allow the molecular weight distribution of the sections insolubilized by light exposure to be more reliably confined to the range of 1 to 2 inclusive.

Throughout this specification, a base resin with a molecular weight distribution of from 1 to 1.5 inclusive before light exposure will sometimes be referred to as a "monodisperse resin". The monodisperse resin need only be uniform to fall within the above-mentioned range, and the base resin may also have the construction of a copolymer containing a number of different monomer units.

The negative resist composition of the present invention preferably has a base resin with a weight average molecular weight of at least 2000 as described in claim 3, and more preferably the weight average molecular weight of the base resin is 3000 to 20,000. If the weight average molecular weight of the base resin is too low the sensitivity and resolution may be reduced, and if it is too high the lower solubility may result in a lower dissolution rate for the reaction, creating an undesirably low solubility. The most preferred range for the weight average molecular weight is from 5000 to 10,000. Using a base resin with a weight average molecular weight in this range can give a negative resist composition with high solubility and high resolution. Here, the preferred molecular weight is specified by the weight average molecular weight because the base resin is composed of a polymer.

From the standpoint of controlling the molecular weight of each molecule of the polymer composing the base resin used according to the second aspect of the invention, the object described above is also achieved by a negative resist composition containing a base resin which comprises an alkali-soluble polymer, a photo acid generator which is capable of decomposing upon absorption of image-forming radiation to generate an acid, and an alicyclic alcohol with a reactive site that can undergo dehydration bonding reaction with the alkali-soluble group of the base resin in the presence of the acid generated by the photo acid generator, wherein no more than 10 wt % thereof consists of components with a molecular weight of under 2000 in said base resin.

The present inventors have confirmed that using a base resin containing a low molecular weight portion with a molecular weight of under 2000 drastically reduces the sensitivity and resolution of the resist. This low molecular weight portion is believed to hamper the solubility-suppressing effect in basic aqueous solutions. It was found that when the low molecular weight components of under 2000 are limited to no more than 10 wt %, it is possible to obtain a favorable negative resist composition in which the aforementioned undesirable effect is inhibited. The low molecular weight components of below 2000 more preferably constitute no more than 3 wt % of the base resin. Here, the molecular weight is not the weight average molecular weight explained above, but rather the (actual) molecular weight of each polymer molecule composing the base resin.

By limiting the low molecular weight components with a molecular weight of below 2000 to no more than 10 wt % of the base resin it is possible to give a resist composition with high sensitivity and high resolution, but a resist composition with even higher sensitivity and resolution can be obtained by giving the base resin a monodisperse property, as mentioned above.

The base resin of a negative resist composition according to the present invention preferably contains a phenol-based compound. A phenol-based resin facilitates adjustment of the molecular weight distribution and cutting of the low molecular weight portions.

The base resin is preferably polyvinylphenol or a copolymer of vinylphenol with another monomer. Polyvinylphenol is preferred as the base resin because it is readily obtainable and its monodispersion is easy to accomplish.

The alicyclic alcohol of a negative resist composition according to the present invention preferably has an adamantane structure, as described in claim 6. An alicyclic alcohol with an adamantane structure can more readily promote insolubilization of the light exposed sections.

The alicyclic alcohol of a negative resist composition of the present invention preferably has a tertiary alcohol structure with a stereochemically fixed structure. An alcohol with such a structure can more readily promote insolubilization of the light exposed sections.

The tertiary alcohol of a negative resist composition of this invention is preferably a 1-adamantanol or a derivative thereof.

The photo acid generator of a negative resist composition according to the present invention is preferably one selected from the-group consisting of onium salts, halogenated organic substances and sulfonic acid esters.

The onium salt in the negative resist composition of this invention may be any one selected from the group consisting of the following formulas (A) to (D).

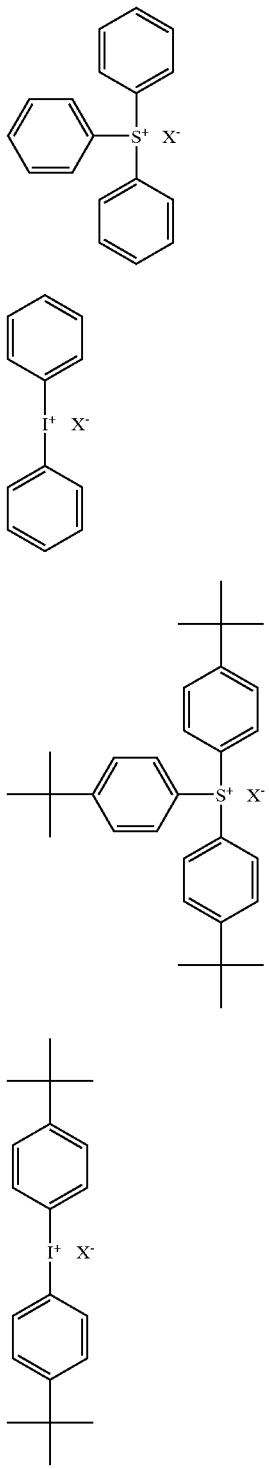

where X=CF$_3$SO$_3$, CF$_3$CF$_2$CF$_2$SO$_3$, SbF$_6$, AsF$_6$, BF$_4$ and PF$_6$.

The halogenated organic substance in the negative resist composition of this invention may be a triazine with a halogen in the structure or an isocyanurate with a halogen in the structure.

A high sensitivity, high resolution resist pattern may be obtained by a negative resist pattern forming method which comprises the series of steps including coating a negative resist composition according to the present invention onto a target substrate, selectively exposing the formed resist film to image-forming radiation that can induce decomposition of the photo acid generator of the resist composition, and developing the exposed resist film with a basic aqueous solution.

Furthermore, according to the present invention, there is also provided a method for the production of electronic devices using the negative resist composition of the present invention, i.e., first to fourth inventions described above.

The production process of electronic devices according to the present invention is characterized by using as a masking means a resist pattern formed from the negative resist composition of the present invention to selectively removing the underlying target substrate, thereby forming a predetermined functional element layer. The definition of the term "functional element layer" will be described hereinafter.

The production process of electronic devices is preferably carried out by the following steps:

coating the negative resist composition onto the target substrate, selectively exposing the formed resist film to image-forming radiation that can induce decomposition of the photo acid generator of the resist composition, developing the exposed resist film with a basic aqueous solution to form a resist pattern, and etching the target substrate in the presence of the resist pattern as a masking means to form the functional element layer.

DESCRIPTION OF THE PREFERRED EMBODIMENTS

Figure 1A:
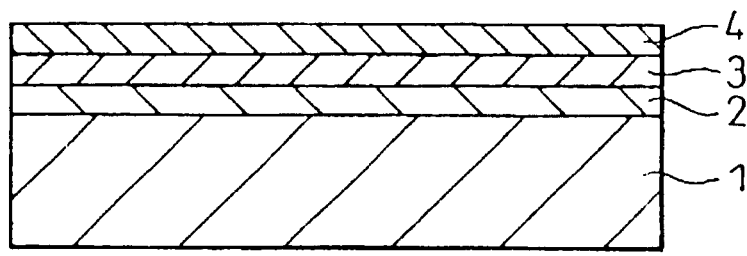
FIGS. 1A to 1F illustrate, in sequence, the production process of the MOS transistor according to the present invention.

The present invention will be further described with regard to the negative resist composition of the present invention (each of the first to fourth inventions) as well as the method for the formation of resist patterns and method for the production of electric devices using the resist composition of the present invention. Note, however, with regard to, the resist composition, that the descriptions of the components in the resist composition according to each invention will be omitted or simplified if they are neglectable, to avoid duplication of the descriptions.

First Invention:

The negative resist composition of the present invention (first invention) comprises, as an essential constituent element, a film-forming polymer that is itself soluble in basic aqueous solutions and includes a first monomer unit with an alkali-soluble group and a second monomer unit with an alcohol structure that can react with the alkali-soluble group, which serves as the base resin. Here, the term "polymer" is used in a wide sense which will be explained in greater detail below, but it encompasses not only binary copolymers and terpolymers, but also simple polymers (homopolymers). In the case of a homopolymer the first monomer unit and second monomer unit will be the same, with the alkali-soluble group and the alcohol structure that can react with the alkali-soluble group coexisting in one monomer unit. This type of film-forming polymer may have any structure so long as it can basically retain suitable alkali solubility in the basic aqueous solution used as the developer. Even poly copolymers such as terpolymers may have any structure so long as they can retain suitable alkali solubility.

The film-forming copolymer used as the base resin in a resist composition according to the invention may include a variety of moieties as the polymer main chain, and preferred for the first and second monomer units are (meth)acrylic acid-based monomer units, itaconic acid-based monomer units, vinylphenol-based monomer units, vinylbenzoic acid-based monomer units, styrene-based monomer units, bicyclo [2.2.1]hept-5-ene-2-carboxylic acid-based monomer units, N-substituted maleimide-based monomer units and monomer units with an ester group containing a multiple or polycyclic alicyclic hydrocarbon portion. These monomer units are useful from the standpoint of giving dry etching resistance comparable to that of novolac resists. The first and second monomer units may also be the same or different. Also, when the first and second monomer units are the same as explained above, the monomer unit may be any of those mentioned above.

Of the monomer units mentioned above, (meth)acrylate-based monomer units are particularly important from the standpoint of low absorption of light with a wavelength in the deep ultraviolet region, when deep ultraviolet rays are used as the exposure light source. In other words, when deep ultraviolet rays are used as the exposure light source, it is generally preferred to use a copolymer with a structure containing no aromatic rings that absorb significant light in the deep ultraviolet region or chromophoric groups with a large molar absorption coefficient, such as conjugated double bonds.

The first monomer unit of the film-forming polymer must have an alkali-soluble group in its structure. The alkali-soluble groups that may be introduced here include the various groups that are commonly introduced into base resin polymers in the field of chemical amplification resists, but the preferred ones are usually carboxylic acid groups, sulfonic acid groups, amido groups, imido groups, phenol groups, acid anhydride groups, thiol groups, lactonic acid ester groups, azalactone groups, hydroxyamide groups, oxazone groups, pyrrolidone groups and hydroxyoxime groups, with carboxylic acid groups, sulfonic acid groups, amido groups, imido groups and hydroxyamide groups being preferred.

In the film-forming polymer of the invention, the proportion of the first monomer unit in the polymer is not particularly restricted so long as the polymer itself exhibits appropriate alkali solubility, but in order to achieve a suitable alkali dissolution rate (ADR) (measured with a 2.38% tetramethylammonium hydroxide aqueous solution, 100–10, 000 Å/sec) considered to be practical for the negative resist intended for the invention, for example, when the copolymer contains a carboxylic acid as the alkali-soluble group in a copolymer of two or more components, the proportion is preferably in the range of 10–90 mole percent, and even more preferably in the range of 30–70 mole percent. If the content of the first monomer unit is under 10 mole percent, the alkali solubility becomes insufficient, making it impossible to accomplish satisfactory patterning. Conversely, if the content of the first monomer unit is above 90 mole percent the alkali solubility becomes too strong, resulting in an excessively high dissolution rate in basic aqueous solutions and making it impossible to accomplish patterning that depends on polarity changes. The content of the first monomer unit is even more preferably in the range of 30–50 mole percent.

When the first monomer unit of the film-forming polymer contains a phenolic hydroxyl group as the alkali-soluble group, the content of that monomer group is preferably in the range of 30–99 mole percent, and more preferably in the range of 50–95 mole percent. If the content of the first monomer unit is under 30 mole percent the alkali solubility becomes insufficient, making it impossible to accomplish satisfactory patterning. Likewise, it becomes impossible to accomplish satisfactory patterning if the content of the first monomer unit is above 99, mole percent. The preferred content for the first monomer unit is in the range of 80–95 mole percent.

The second monomer unit of the film-forming polymer must have on its side chain an alcohol structure capable of reacting with the alkali-soluble group of the first monomer unit. The alcohol structure to be introduced here may be widely modified depending on the desired effect, but according to the experience of the present inventors a tertiary alcohol structure is particularly useful. A tertiary alcohol structure more readily undergoes dehydration reaction than a secondary alcohol structure.

Suitable tertiary alcohol structures for carrying out the invention include those represented by any of the following formulas (I) to. (IV).

Preferred tertiary alcohol structure (I):

(I)

where R is linked to the main chain of the monomer unit and represents any bonding group that is copolymerizable with the first monomer. This bonding group R is therefore copolymerizable with the monomer unit with the alkali-soluble group, and its structure is not particularly specified so long as it does not adversely influence the effect intended by the invention. Examples of suitable bonding groups for R include linear or branched hydrocarbon groups of 1–6 carbons such as methyl or ethyl, and the group —O—.

$R_1$ and $R_2$ are the same or different and each represents a linear, branched or cyclic hydrocarbon group, for example, an alkyl group of 1–8 carbons such as methyl or ethyl, or an alicyclic or aromatic hydrocarbon group such as phenyl; otherwise, as explained below, the two substituents $R_1$ and $R_2$ may be bonded together to form a cyclic system, such as an alicyclic or aromatic hydrocarbon group or heterocyclic group.

Preferred tertiary alcohol structure (II):

(II)

where R is the same as defined above.

$R_x$ represents a hydrocarbon group of 1–8 carbons, for example, a linear or branched or cyclic hydrocarbon group such as methyl, ethyl or phenyl, and p is an integer of 2–9.

Preferred tertiary alcohol structure (III):

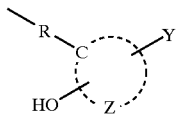
(III)

where is the same as defined above.

Y represents a hydrogen atom or an optional substituent selected from the group consisting of alkyl, alkoxycarbonyl, ketone, hydroxyl and cyano groups. The bonding site of substituent Y with respect to the following alicyclic hydrocarbon group is not particularly restricted.

Z represents a plurality of atoms necessary to complete the alicyclic hydrocarbon group. The alicyclic hydrocarbon group may be any of a variety of groups, but preferably has on of the following compounds as the skeleton.

Adamantane and its derivatives,

Norbornane and its derivatives,

Perhydroanthracene and its derivatives,

Perhydronaphthalene and its derivatives,

Tricyclo[5.2.1.0$^{2.6}$]decane and its derivatives,

Bicyclohexane and its derivatives,

Spiro[4,4]nonane and its derivatives,

Spiro[4,5]decane and its derivatives, and the like. Particularly preferred among these alicyclic hydrocarbon groups are those with adamantane and its derivatives as skeletons, an example of which is the compound represented by the following formula (III-1):

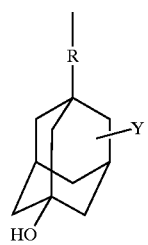
(III-1)

where R and Y are both the same as defined above.
Preferred tertiary alcohol structure (IV):

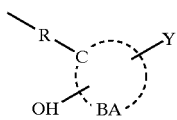
(IV)

where R and Y are both the same as defined above.

BA represents a plurality of atoms necessary to complete the bicycloalkane ring. The bicycloalkane ring may be any of a variety of groups, but is preferably bicyclohexane, bicyclooctane, bicyclodecane or the like, and more preferably bicyclooctane. Bicyclooctane may be represented by the following formula (IV-1):

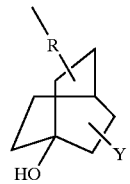
(IV-1)

where R and Y are both the same as defined above.

The proportion of the second monomer unit in the film-forming polymer of the invention may be widely varied depending on the properties desired for the resist composition, but its preferred range will usually be 0.1–70 mole percent based on the total amount of the film-forming polymer.

The film-forming polymer used as the base resin according to the invention contains the aforementioned first and second monomer units. According to a preferred mode of the invention, the first or second monomer unit, or both monomer units may further contain, in addition to the alkali-soluble group to be included in the first monomer unit, a weaker alkali-soluble group. The additional alkali-soluble group will normally be bonded to the side-chain of the monomer unit. Suitable alkali-soluble groups include, but are not limited to, for example, lactone rings, imide rings and acid anhydrides. In some cases, the additional alkali-soluble group in the film-forming polymer of the invention may be included in a third, fourth or more monomer units used in addition to the first and second monomer units.

The above explanation is a summary of the film-forming polymer used as the base resin in the negative resist composition of the invention. The invention will become more clearly understood by the following explanation of the chemical amplification mechanism in the resist composition of the invention, with reference to a specific film-forming polymer.

The film-forming polymer referred to here is a binary copolymer comprising a first monomer unit containing a phenol group as the alkali-soluble group on the side chain, and a second monomer unit containing an adamantyl group similar to formula (III-1) above as the tertiary alcohol structure on the side chain, as illustrated by the reaction formula shown below. In the formulas, Y is the same as defined above and X is an optional substituent, for example, a hydrogen atom, a halogen atom (such as chlorine or bromine), a lower alkyl group (such as methyl or ethyl), etc. The letters m and n are the numbers of monomer units (repeating units) necessary to give the prescribed molecular weight desired for the copolymer.

When the resist composition comprising both the film-forming polymer and the photo acid generator (PAG) is coated onto a target substrate and the resist film is prebaked and then exposed to image-forming radiation, the PAG in the resist composition absorbs the radiation and decomposes to generate an acid. Subsequent post exposure baking (PEB) allows the generated acid to act as a catalyst to produce a reaction illustrated below at the exposed sections of the film. That is, a dehydration reaction occurs at the tertiary alcohol structure of the second monomer unit of the film-forming polymer, and the tertiary alcohol structure produced by the reaction then reacts with the nearby phenol ring. Numerous such reactions proceed simultaneously, as shown, result in products of reaction between the phenol rings and the tertiary alcohol structures, and products of protection of the phenol rings with the tertiary alcohol structures, thus altering the alkali solubility of the polymer.

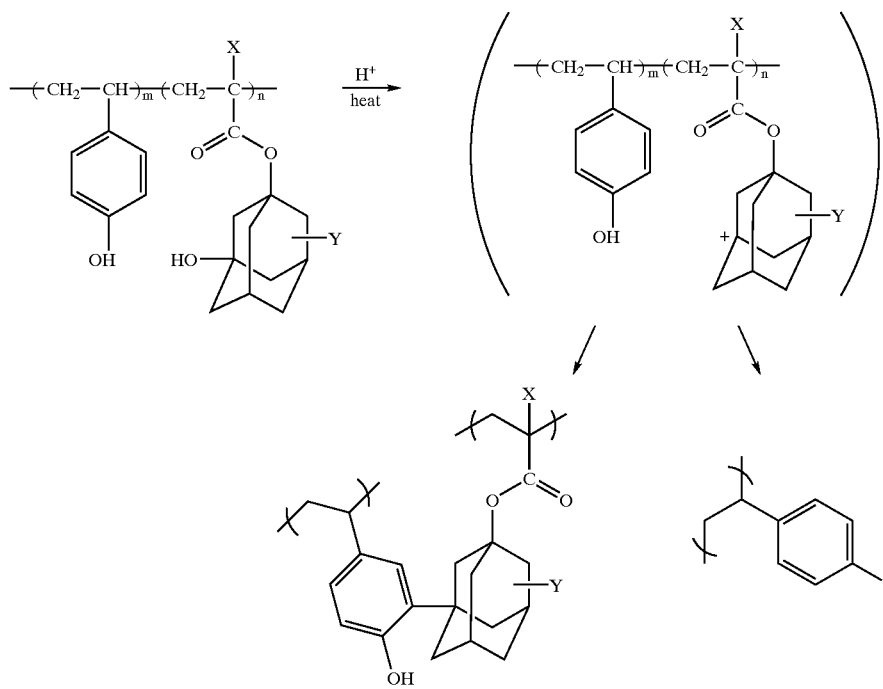

In this reaction, the cation resulting from the dehydration reaction initiates an electrophilic substitution reaction with the hydroxyl group of the vinylphenol ring or the ortho carbon of the ring, In the former case, the cation reacts directly with the alkali soluble group to reduce the alkali solubility, while in the latter case the strong hydrophobicity and steric hindrance of the adamantyl group lowers the alkali solubility. Thus, the alkali solubility is considerably lowered at the light exposed sections, giving a negative pattern.

The next illustration, as shown by the reaction formula below, is a case where the base resin used is a binary copolymer comprising a first monomer unit containing a carboxyl group as the alkali-soluble group on the side chain, and a second monomer unit containing the same adamantyl group as above as the tertiary alcohol structure on the side chain. Here, Y, X, m and n are all the same as defined above. In this case of a binary copolymer-containing resist composition as well, irradiation with image-forming radiation results in dehydration reaction with the alcohol and reaction of the tertiary alcohol structure with its neighboring carboxyl group. As a result-of this reaction, the alkali solubility of the polymer is reduced. The alkali solubility is therefore considerably lowered at the light exposed sections, giving a negative pattern.

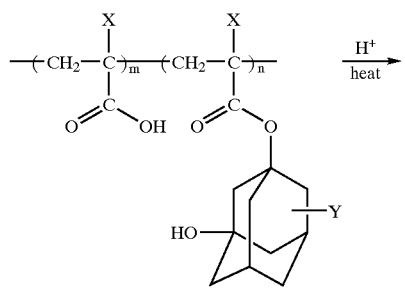

-continued

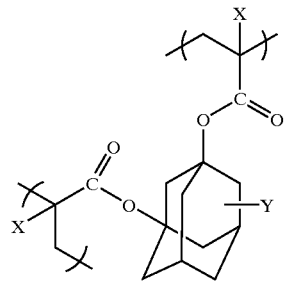

The resist composition of the invention is an "amplification composition" that includes an alcohol structure in the film-forming polymer used as the base resin, whose reaction can regenerate a proton acid; a high resolution can thereby be achieved. Furthermore, since the resist composition loses its alkali soluble group after the sensitive group is protected (specifically, it is converted to an ether or ester), the exposed sections of the resist film become alkali-insoluble, thus allowing formation of a negative pattern after development with a basic aqueous solution. Moreover, since the present invention accomplishes pattern formation using a polarity change produced in the polymer, the pattern formation can be accomplished without swelling.

If the polymer in the film-forming polymer used as the base resin in the resist composition of the invention is in the form of a terpolymer, it preferably has a relative strong alkali-soluble group represented by carboxylic acid or phenol introduced into the first monomer unit, and a weaker alkali-soluble group such as a lactone structure, an acid anhydride such as succinic anhydride or glutaric anhydride, an imide ring structure, etc. introduced into the second monomer unit. In such cases, the contents of the strong alkali-soluble group and weak alkali-soluble group may be controlled to allow easy adjustment of the alkali dissolution rate of the base resin to the preferred value. The third monomer unit preferably has a functional group with etching resistance. Thus, by appropriately selecting the substituents introduced into each of the monomer units and effectively taking advantage of the respective functional group functions, it is possible to achieve a higher performance resist.

The alcohol structure in the film-forming polymer of the resist composition is preferably a tertiary alcohol structure. This is because the presence of a tertiary alcohol structure more readily allows dehydration reaction. According to the present invention, a compound with an alcohol structure that makes such a reaction possible (referred to as "alcohol structure-containing compound" throughout the present specification) is included in the resist composition as an additive, together with introduction of the aforementioned alcohol structure into a monomer unit of the polymer. The structure of this added alcohol structure-containing compound is not particularly restricted, but considering that its main purpose is to contribute to improved etching resistance, it is preferably a polycyclic alicyclic compound or a compound with a benzene ring in the molecule. Furthermore, the compound preferably has a tertiary alcohol structure that more readily undergoes dehydration reaction with an acid.

Returning to the explanation of the film-forming polymer, a preferred structure of a polymer suitable for carrying out the invention will now be discussed.

The film-forming polymer used as the base resin in the resist composition of the invention is not particularly restricted so long as the above-mentioned conditions, especially the condition of a suitable alkali dissolution rate, are satisfied. In consideration of giving dry etching resistance comparable to that of novolac resists, useful film-forming polymers include, but are not limited to, the following: (meth)acrylate-based polymers, vinylphenol-based polymers, vinylbenzoic acid-based polymers, N-substituted maleimide-based polymers, styrene-based polymers, bicyclo[2.2.1]hept-5-ene-2-carboxylic acid-based polymers, etc., that have with polycyclic alicyclic hydrocarbon compounds in ester groups.

Of the film-forming polymers mentioned above, (meth) acrylate-based polymers, i.e. acrylate-based or methacrylate-based polymers, are important from the standpoint of low absorption of light with a wavelength in the deep ultraviolet region, when a deep ultraviolet ray source and especially a light source with a wavelength of 220 nm or smaller is used as the exposure light source. In other words, when deep ultraviolet rays are used as the exposure light source, it is generally preferred to use a copolymer with a structure containing no aromatic rings that absorb significant light in the deep ultraviolet region or chromophoric groups with a large molar absorption coefficient, such as conjugated double bonds.

Since the use of an extremely short wavelength exposure light source such as an ArF excimer laser as the light source requires transparency at that wavelength (193 nm) along with dry etching resistance, it is recommended to use as the film-forming polymer a polymer with a polycyclic alicyclic hydrocarbon structure-containing ester group with high dry etching resistance such as mentioned above, typical examples of which are adamantyl, bicyclo[2.2.2]octane and norbornyl groups.

The molecular weight (weight average molecular weight, Mw) of the film-forming polymer described above may be varied within a wide range depending on the structure of the polymer, but it is normally preferred to be in the range of 2,000–1,000,000, and more preferably in the range of 3,000–50,000.

The monomer unit (second monomer unit) with an alcohol structure to be included in the film-forming polymer described above encompasses, but is not limited to, for example, the following vinyl monomers with alcohol structures as the ester groups or ether groups.

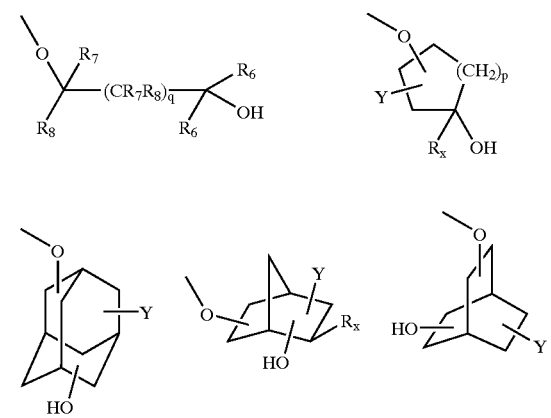

In these formulas, Y and $R_x$ are the same as defined above, and $R_6$–$R_8$ may be the same or different and each represents a hydrogen atom or an optional substituent, for example, a halogen atom such as chlorine or bromine, a cyano group or a linear, branched or cyclic alkyl group of 1–4 carbons such as methyl, ethyl or methylol, the substituent being further substituted when necessary, and p and q each represent an integer or 1–6.

Film-forming compositions that may be advantageously used for carrying out the invention include, but are not limited to, the following preferred polymers. In the general formulas that follow, X, Y and $R_x$ are the same as defined above, ALC represents the alcohol structure described above, and l, m and n are the respective numbers of monomer units (repeating units) necessary to obtain the aforementioned weight average molecular weight.

(1) Acrylate-based or methacrylate-based polymers

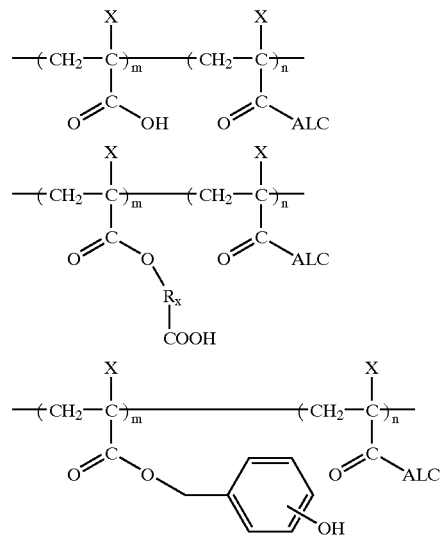

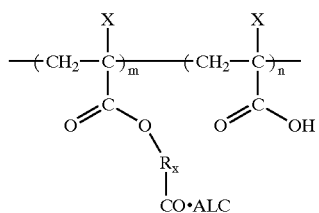

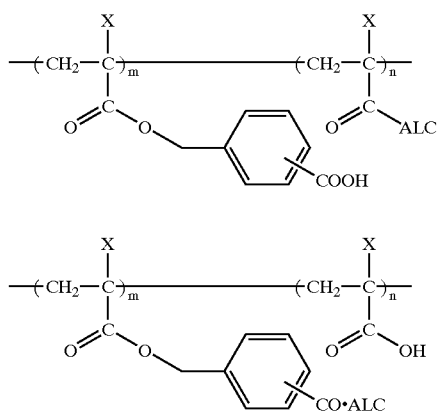

(2) Norbornane-based polymers

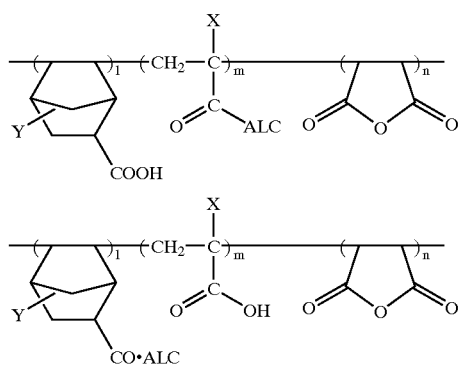

(3) Vinylphenol-based polymers

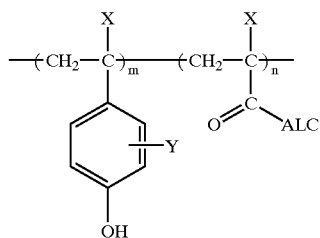

(4) Vinylbenzoic acid-based polymers

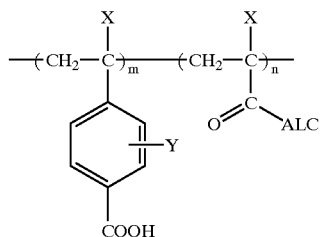

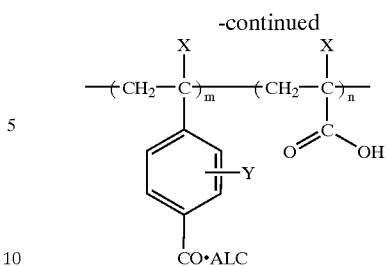

In addition to the aforementioned typical film-forming polymers for carrying out the invention, there may also be advantageously used half-esters of maleic acid or fumaric acid, and monoesters of itaconic acid.

The film-forming polymer to be used as the base resin for the invention may be prepared using a polymerization process commonly utilized in the field of polymer chemistry. For example, a (meth)acrylate-based copolymer can be successfully prepared by free radical polymerization of the prescribed monomers required for its preparation, by way of heating in the presence of a free radical initiator. As examples of free radical initiators there may be mentioned 2,2'-azobisisobutyronitrile (AIBN) and dimethyl-2,2-azoisobisbutyrate (MAIB). Film-forming polymers other than (meth)acrylate-based polymers may also be successfully prepared by similar commonly employed polymerization processes.

As alluded to above, the resist composition of the invention preferably also contains a compound with an alcohol structure in the molecule, in addition to the aforementioned film-forming polymer. The alcohol structure of the alcohol structure-containing compound which is also added may be either a secondary alcohol structure or tertiary alcohol structure, but a tertiary alcohol structure is more advantageous. The tertiary alcohol structure may be the same as the previously mentioned one, or depending on the case it may be a different one. The alcohol structure-containing compound also preferably has a boiling point of at least 130° C. If the boiling point of the alcohol structure-containing compound is below 130° C., the heating of the prebaking step carried out prior to light exposure may cause escape of the compound itself, thus making it impossible to achieve the expected effect.

The alcohol structure-containing compound preferably includes an alicyclic structure or polycyclic alicyclic structure. The compound preferably also includes a substituent which is the same as the substituent Y included in the alcohol structure of the second monomer unit of the film-forming polymer, for example, a hydroxyl group, ketone group or alkoxycarbonyl group. Examples of alcohol structure-containing compounds that are useful for carrying out the invention include, but are not limited to, the compounds represented by the following general formulas. In these general formulas, Y and $R_x$ are the same as defined above, and p is an integer of 1–6.

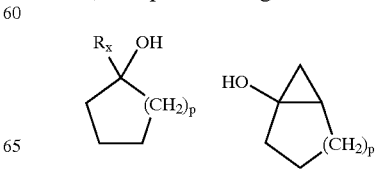

-continued

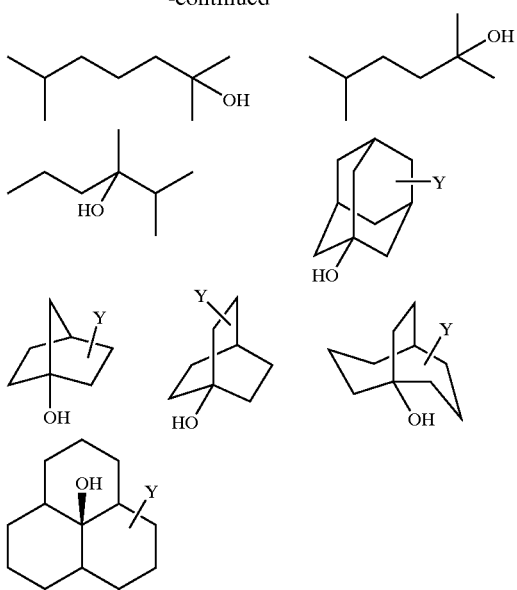

The proportion of the aforementioned alcohol structure-containing compound in the resist composition of the invention will depend on the amount of the alkali-soluble group included in the film-forming polymer, or in other words on the alkali dissolution rate of the polymer, but for a polymer with a suitable alkali dissolution rate such as described above, the amount of addition is preferably in the range of 1–100 wt %, and more preferably in the range of 10–50 wt %, based on the total amount of the polymer.

The manner of using the alcohol structure-containing compound will now be further explained. Of the film-forming polymers that are useful for carrying out the invention, (meth)acrylate-based copolymers are well known to have high transparency in the deep ultraviolet range, and appropriate selection of this polymer structure and a structure containing no chromophoric groups with a large molar absorption coefficient near the exposure wavelength range for the structure of the alcohol structure-containing compound used therewith, in combination with a suitable amount of a photo acid generator, can give a highly sensitive resist that is advantageously suited for light exposure using deep ultraviolet rays.

The photo acid generator (PAG) used in combination with the aforementioned film-forming polymer in the chemical amplification resist of the invention may be a photo acid generator that is commonly used in the field of resist chemistry, i.e., a substance the produces a proton acid upon irradiation with radiation such as ultraviolet rays, far ultraviolet rays, vacuum ultraviolet rays, an electron beam, X-rays, laser light or the like. Suitable photo acid generators that may be used for the invention include, but are not limited to, those represented by the following formulas.

(1) Onium salts, for example:

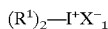

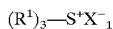

where each $R^1$ may be the same or different and represents, for example, a substituted or unsubstituted aromatic group, such as a phenyl group substituted with phenyl, a halogen, methyl, t-butyl, an aryl group or the like, or an alicyclic group, and $X_1$ represents, for example, $BF_4$, $BF_6$, $PF_6$, $AsF_6$, $SbF_6$, $CF_3SO_3$, $ClO_4$, etc.

In spite of simple structure thereof, onium salts have particularly notable effects of inducing a condensation reaction, and thus they are preferably used as the photo acid generator. Typical examples of useful onium salts include:

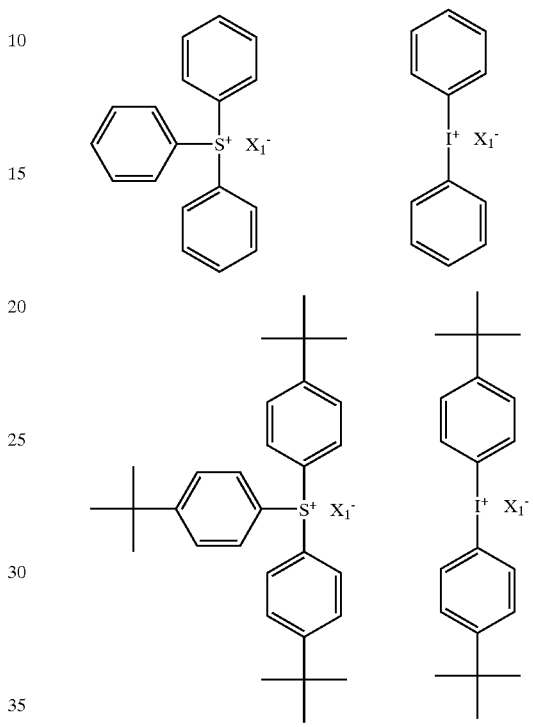

wherein $X_1$ is as defined above.

(2) Sulfonic acid esters, for example:

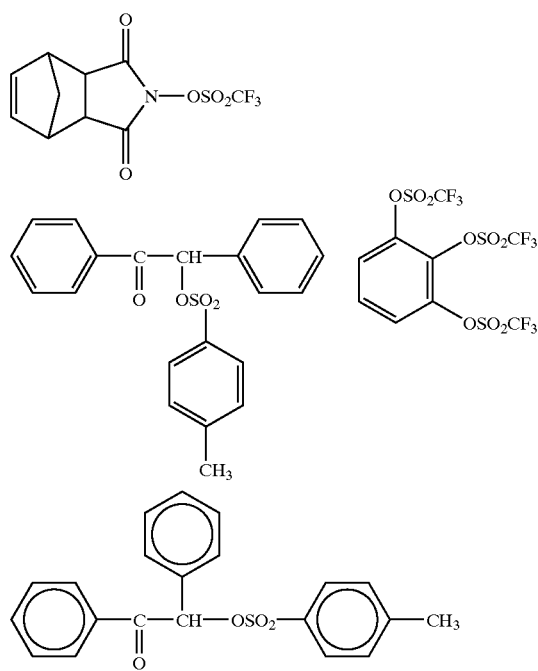

-continued

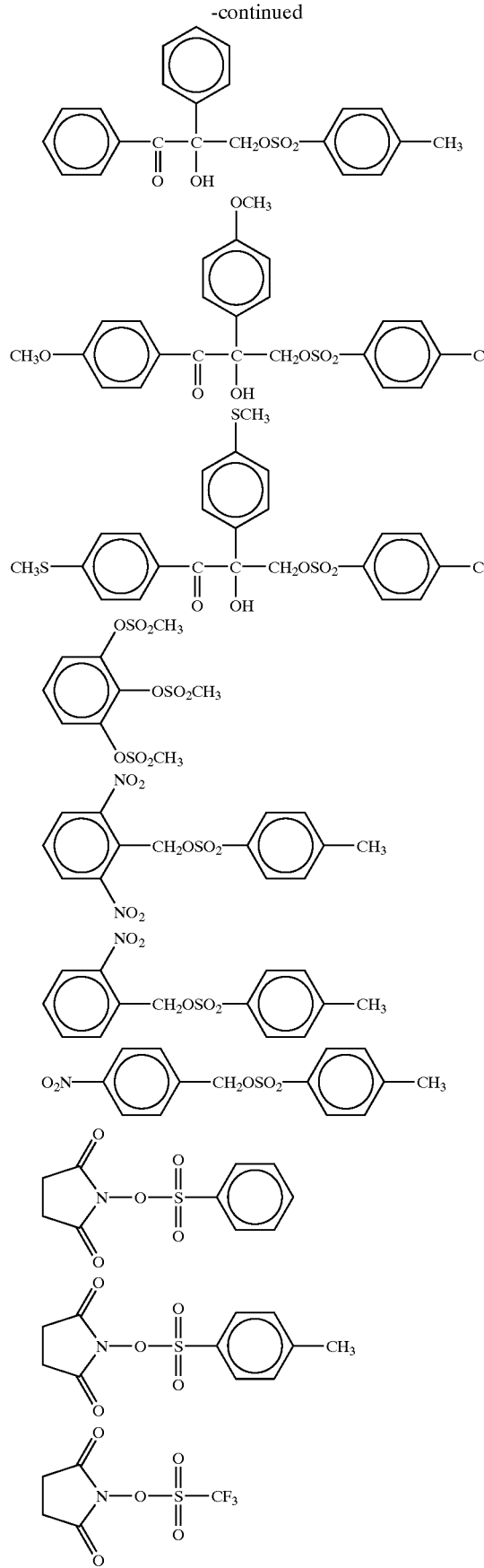

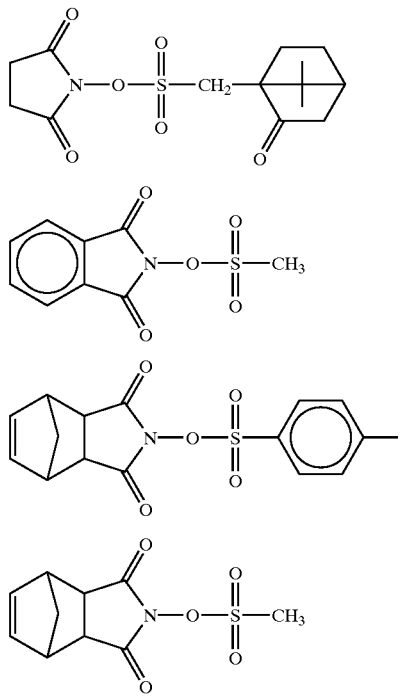

(3) Halogenated compounds, for example:

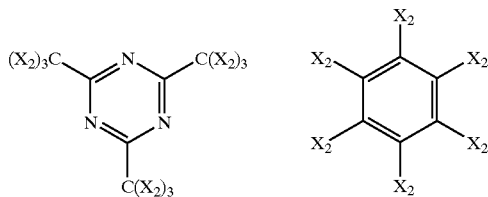

where $X_2$ represents a halogen atom such as Cl, Br or I, each being the same or different, and one of the $-C(X_2)_3$ groups in the formula may be a substituted or unsubstituted aryl group or alkenyl group.

Particularly, triazines or isocyanates containing halogen atom(s) in a molecule thereof may be advantageously used as the photo acid generator in the scope of the halogenated compounds. Typical examples of such halogenated compounds include:

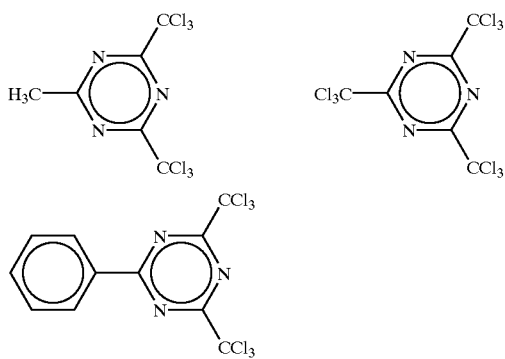

-continued

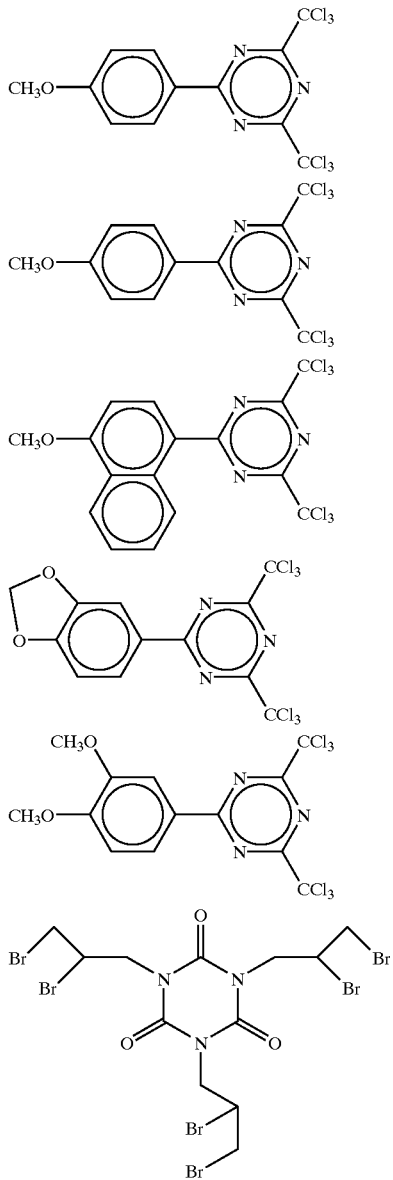

In addition to these photo acid generators, there may be also used, if necessary, the photo acid generators disclosed in Japanese Unexamined Patent Publication (Kokai) No. 9-90637 and No. 9-73173, for example.

The photo acid generators mentioned above can be used in the resist composition of the invention in various amounts suited for the desired effect. The present inventors have found that the photo acid generator is preferably used in a range of 0.1 to 50 wt % based on the total amount of the film-forming polymer used as the base resin. When the amount of the photo acid generator is over 50 wt %, excessive light absorption will prevent successful patterning. The amount of the photo acid generator used is even more preferably in the range of 1 to 15 wt % based on the total amount of the polymer.

The resist composition of the invention preferably has a specific transmittance at the exposure light wavelength; that is, when the resist composition is used to form a resist film with a thickness of 1 $\mu$m by application onto a quartz substrate, it preferably has an absorbance of no greater than 1.75 $\mu m^{-1}$ at the wavelength of the deep ultraviolet exposure light source (180 to 300 nm), and therefore the structure of the film-forming polymer and photo acid generator and the amount of the photo acid generator used should be considered in light of achieving such transmittance. Naturally, when an electron beam is used as the exposure light source it is possible to avoid the problem of transmittance transparency, so that there is no particular need to consider the amount of photo acid generator that is used.

The resist composition of the invention can usually be advantageously used in the form of a resist solution, by dissolving the aforementioned film-forming polymer and photo acid generator, and if necessary the alcohol structure-containing compound and other optional additives, in an appropriate organic solvent. Organic solvents that are useful for preparation of resist solutions include, for example, ethyl lactate, methyl amyl ketone, methyl-3-methoxypropionate, ethyl-3-ethoxypropionate, propyleneglycol methyl ether acetate, etc., but there is no limitation to these solvents. The solvents may be used alone, or if necessary two or more solvents may be used in admixture. The amount of these solvents to be used is not particularly restricted, but they are preferably used in an amount sufficient to achieve an appropriate viscosity for coating by spin coating or the like, as well as for the desired resist film thickness.

Co-solvents may also be used with the aforementioned solvent (referred to as "primary solvent" throughout the present specification for distinction from additionally used solvents) if necessary in the resist solution of the invention. The use of a co-solvent is not necessary when the solubility of the solutes is satisfactory or when the solution can be evenly coated, but in cases where solutes with low solubility are used or the solution cannot be evenly coated as desired, it will usually be added in an amount of preferably 1–30 wt % and more preferably 10–20 wt %, with respect to the primary solvent. Examples of useful co-solvents include, but are not limited to, butyl acetate, γ-butyrolactone and propyleneglycol methyl ether. These co-solvents, like the aforementioned primary solvent, may also be used alone or in mixtures.

Second Invention:

The chemical amplification resist composition of the present invention (second invention) has a combination of:

(1) a base resin composed of an alkali-soluble polymer, (2) a photoacid generator capable of decomposing upon absorption of image-forming radiation to generate an acid, and (3) an alicyclic alcohol with a reactive site that can undergo dehydration reaction with the polymer of the base resin in the presence of the acid generated by the photoacid generator, as components that directly participate in the reaction for formation of the resist pattern.

Each of the reaction components will be explained in detail below, but first the acid-catalyzed reaction in the resist composition of the invention will be explained to more clearly elucidate the concept of the invention.

The alicyclic alcohol has a highly polar group such as an alcoholic hydroxyl group in the molecule. In the presence of an acid catalyst, such a substance reacts with the polar group of the base resin (a phenolic hydroxyl group or the like) to produce an ester or ether. Assuming the use of polyvinylphenol as the base resin and addition of a 1-adamantanol as the alicyclic alcohol, primarily the following reaction occurs by the action of the acid catalyst.

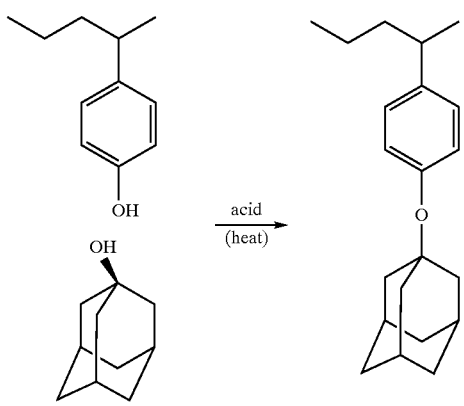

This one reaction results in a polarity change due to etherification of both the phenolic hydroxyl group of the base resin and the alcoholic hydroxyl group of the alicyclic alcohol, such that both are rendered alkali-insoluble. That is, by way of this reaction the object of the invention which is "high polarity of the resin and additives prior to light exposure, and low polarity of the resin and additives after light exposure" is achieved.

The pathway of the acid-catalyzed reaction in the resist composition of the invention is not limited to the one pathway shown above, and other reactions may also accompany it. As examples there may be mentioned a reaction in which an adamantanol is added to the carbon atom at the position adjacent to the phenolic hydroxyl group of the base resin, and a reaction in which the adamantanol groups are condensed together. These accompanying reactions can also contribute to the polarity reduction due to ether conversion of the hydroxyl groups and steric hindrance by the bulky alicyclic groups adjacent to the hydroxyl groups.

The alicyclic alcohol used as the third reaction component in the resist composition of the invention has a reaction site that can undergo a dehydration bond reaction with the base resin (alkali-soluble polymer) as the first reaction component, in the presence of the acid generated by the photoacid generator as the second reaction component. The merits of using the alicyclic alcohol according to the invention include the following, which will be clarified by the explanation given below.

(1) The bulky structure results in a greater polarity change upon addition to the alkali-soluble polymer;
(2) When used as a resist, it is possible to achieve high etching resistance.

For carrying out the invention, the alicyclic alcohol may have a single alcoholic hydroxyl group as the reaction site, or else it may have two or more alcoholic hydroxyl groups. Including a plurality of alcoholic hydroxyl groups in the molecule can provide an effect based on crosslinking in addition to the effect based on altered polarity.

It is preferred for an optional bonding group to lie between the alicyclic skeleton and the alcoholic hydroxyl group bonded to the alicyclic skeleton in the alicyclic alcohol that is used. As suitable bonding groups there may be mentioned groups of 1–6 atoms such as linear, branched or cyclic hydrocarbon groups, which include alkyl, for example. Such alcohols therefore encompass primary alcohols, secondary alcohols and stereochemically unfixed alcohols.

Alicyclic alcohols with a variety of different structures may be used alone or in combinations. Basically speaking, the alicyclic alcohol used when carrying out the invention is preferably one with a bulky structure. Specifically, useful alicyclic alcohols include monocyclic alcohol compounds of 4 or more carbons, for example, alcohol compounds with a cyclohexane structure in the molecule, polycyclic alcohol compounds of 6 or more carbons including bicyclic alcohol compounds with 6 or more carbons, for example, alcohol compounds with a norbornane structure or bicyclo[2.2.2]octane structure in the molecule, and tricyclic alcohol compounds of 8 or more carbon atoms, for example, alcohol compounds with a perhydroanthracene structure or perhydrophenanthrene structure in the molecule. Especially preferred alicyclic alcohols for carrying out the invention are alcohols with an adamantane structure in the molecule, with 1-adamantanols and their derivatives being preferred. 1-adamantanols and their derivatives are useful in that they can be easily obtained commercially.

The alicyclic alcohol also preferably has a boiling point of at least 130° C. If the boiling point of the alcohol is below 130° C. the heating of the prebaking step carried out prior to light exposure may cause escape of the compound itself, thus making it impossible to achieve the expected effect. Stated differently, it is recommended for the heating temperature for the prebaking step prearranged for the desired effect to be considered beforehand, in order to allow selection of an alicyclic alcohol with a boiling point above that temperature.

The following general formulas are typical instances of alicyclic alcohols that may be advantageously used for carrying out the invention.

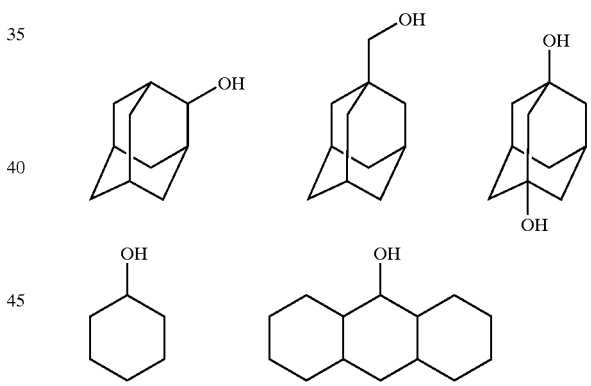

In addition to these alicyclic alcohols, results of research by the present inventors have demonstrated that alicyclic alcohols that provide the most desirable and greatest effect when carrying out the invention are tertiary alcohols with a stereochemically fixed structure. This is attributed to the fact that reaction between the phenolic hydroxyl group and tertiary alcohol of the base resin makes it difficult for the resulting ether bond to be decomposed again after bonding, thus returning to the phenolic hydroxyl group as shown below.

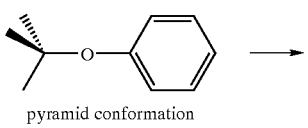

pyramid conformation

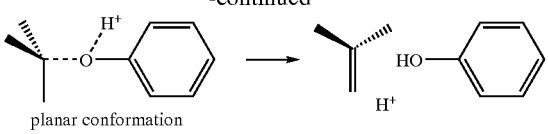
planar conformation

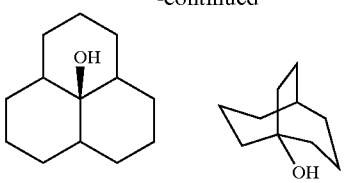

Here, for the ether bond to be decomposed again to become a phenolic hydroxyl group, it is believed necessary for the alkyl portion to shift from the pyramid conformation to the planar conformation. Primary alcohols, secondary alcohols and even tertiary alcohols which have a non-stereochemically fixed structure as does tert-butyl, can rotate freely in the planar conformation. It is believed that regeneration of the phenolic hydroxyl groups by decomposition therefore occurs competitively, preventing the reaction from occurring as expected.

In contrast, 1-adamantanols and their derivatives that are used for the invention have a structure that cannot readily adopt a planar conformation, and therefore it is believed that such regeneration of the phenolic hydroxyl groups by extraction occurs very rarely (see following structure formulas).

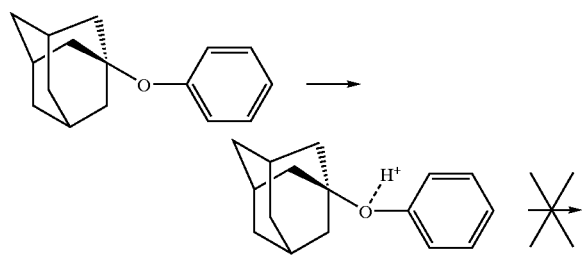

According to the invention, the aforementioned substituent will be referred to as a "stereochemically fixed" substituent or simply a "rigid substituent".

A few examples of 1-adamantanols that can be advantageously used for the invention include the following. 1-adamantanol derivatives that may likewise be used also include, but are not limited to, the compounds shown below.

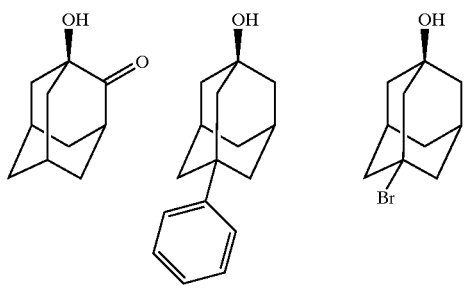

Other alicyclic alcohols that may be advantageously used for the invention include the following.

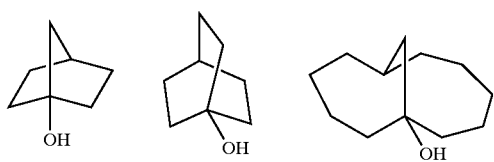

None of these alicyclic alcohols can easily adopt a planar conformation, or in other words, they are stereochemically fixed tertiary alcohols.

The alicyclic alcohol in the resist composition of the invention may be used in various amounts required for the desired effect. The amount of alicyclic alcohol used is usually preferred to be in the range of 2 to 60 wt %, and even more preferably in the range of 15 to 40 wt %, based on the total amount of the alkali-soluble polymer used as the base resin. If the amount of the alicyclic alcohol is under 2 wt %, the reaction may still occur but the polarity change will be lower, making it impossible to achieve the essential contrast as a negative resist. Conversely, if the amount of the alicyclic alcohol is above 60 wt %, a greater exposure dose will simply be necessary to complete the substituent reaction, creating a poorly cost-effective situation. In addition, when the alicyclic alcohol is added in such a large amount, the thermal properties of the resist as a whole may be inferior and other undesirable problems such as precipitation during resist coating may occur.

A base resin, i.e. an alkali-soluble polymer, is used as the first reaction component in the resist composition of the invention. Here, "polymer" is used in the wide sense, to include not only homopolymers formed from a single type of monomer, but also copolymers including binary copolymers and terpolymers. When necessary, a polymer that does not react with the alicyclic alcohol may also be used as an additional base resin.

Polymers that may be used for carrying out the invention basically have any structure that can maintain appropriate alkali-solubility in basic aqueous solutions used as developers, while contributing to the dehydration reaction with the alicyclic alcohol. In particular, from the standpoint of achieving dry etching resistance comparable to that of a novolac resist, useful alkali-soluble polymers include, but are not limited to, the following: (meth)acrylate-based polymers, phenol-based polymers (including vinylphenol-based polymers, vinylbenzoic acid-based polymers, etc.), N-substituted maleimide-based polymers, styrene-based polymers and bicyclo[2.2.1]hept-5-ene-2-carboxylic acid-based polymers. These polymers may be used alone or in combinations of two or more types of polymers. (Meth)acrylate-based polymers and phenol-based polymers are recommended for use according to the invention because they are easily obtainable.

Such alkali-soluble polymers must have an alkali-soluble group in the structure in order to maintain alkali-solubility. Alkali-soluble groups that may be introduced here include those that are commonly introduced into polymers as base resins in the field of chemical amplification resists, but usually phenolic hydroxyl groups, carboxylic acid groups, sulfonic acid groups, amido groups, imido groups, acid anhydride groups, thiol groups, lactonic acid ester groups, azalactone groups, hydroxyamide groups, oxazone groups, pyrrolidone groups and hydroxyoxime groups are preferred, with phenolic hydroxyl groups, carboxyl acid groups, sulfonic acid groups, amido groups, hydroxyamide groups, and imido groups being especially preferred.

The alkali dissolution rate (ADR) derived from the alkali-soluble group in the polymer is not particularly restricted so long as the polymer itself exhibits suitable alkali solubility, but as measured with a 2.38% tetramethylammonium hydroxide aqueous solution, a range of 100 to 10,000 Å/sec is considered to be practical for the negative resist intended for the invention. For example, when the copolymer contains a carboxylic acid as the alkali-soluble group in a copolymer of two or more components, the proportion of the monomer unit with the carboxylic acid is usually preferably in the range of 10–90 mole percent, and even more preferably in the range of 30–70 mole percent. If the content of this monomer unit is under 10 mole percent, the alkali solubility becomes insufficient, making it impossible to accomplish satisfactory patterning. Conversely, if the content of the monomer unit is above 90 mole percent the alkali solubility becomes too strong, resulting in an excessively high dissolution rate into basic aqueous solutions and making it impossible to accomplish patterning that depends on polarity changes.

When one monomer unit of the alkali-soluble polymer contains a phenolic hydroxyl group as the alkali-soluble group, the content of that monomer group is preferably in the range of 30 to 99 mole percent, and more preferably in the range of 50 to 95 mole percent. If the content of this monomer unit is under 30 mole percent the alkali solubility becomes insufficient, making it impossible to accomplish satisfactory patterning. Likewise, it becomes impossible to accomplish satisfactory patterning if the content of the monomer unit is above 99 mole percent.

When the alkali-soluble polymer is in the form of a terpolymer, it is preferred to introduce a relative strong alkali-soluble group such as a carboxylic acid or phenol into the first monomer unit, and to introduce into the second monomer unit a weaker alkali-soluble group with, for example, a lactone structure, an acid anhydride such as succinic-anhydride or glutaric anhydride, or an imide ring structure. In this case, the contents of the strong alkali-soluble group and weak alkali-soluble group in each monomer unit may be controlled to allow easy adjustment of the alkali dissolution rate of the base resin to the preferred value. The third monomer unit preferably has a functional group with etching resistance. Thus, by appropriately selecting the substituents introduced into each of the monomer units and effectively taking advantage of the respective functional group functions, it is possible to achieve a higher performance resist.

Among the aforementioned alkali-soluble groups, (meth) acrylate-based polymers, i.e. acrylate-based or methacrylate-based polymers (polyacrylates, polymethacrylates, copolymers of acryl and other monomers, etc.) are important from the standpoint of low absorption of light with a wavelength in the deep ultraviolet region, when a deep ultraviolet ray source and especially a light source with a wavelength of 220 nm or smaller is used as the exposure light source. In other words, when deep ultraviolet rays are used as the exposure light source, it is generally preferred to use a copolymer with a structure containing no aromatic rings that absorb significant light in the deep ultraviolet region or chromophoric groups with a large molar absorption coefficient, such as conjugated double bonds.

Since the use of an extremely short wavelength exposure light source such as an ArF excimer laser as the light source requires transparency at that wavelength (193 nm) along with dry etching resistance, it is recommended to use a (meth)acrylate-based polymer with a polycyclic alicyclic hydrocarbon structure-containing ester group with high dry etching resistance, typical examples of which are adamantyl, bicyclo[2.2.2]octane and norbornyl groups.

As concerns the combined use of an alicyclic alcohol as the third reaction component, (meth)acrylate-based polymers are well known to have high transparency in the deep ultraviolet range, and appropriate selection of a structure having no chromophoric groups with a large molar absorption coefficient near the exposure wavelength for the structure of this polymer as well as the structure of the alicyclic alcohol used therewith, in combination with a suitable amount of a photoacid generator (the second reaction component), can provide a high sensitivity resist composition that can also be advantageously applied for deep ultraviolet ray exposure.

As phenol-based polymers, particular advantages may be afforded by using polyvinylphenol, phenol-novolac copolymers, cresol-novolac copolymers and the like. Copolymers of a monomer with a phenolic hydroxyl group and another monomer may also be used. For adjustment of the solubility, there may be used a resin in which a portion of the phenolic hydroxyl groups have been etherified.

The desired polarity change can also be achieved using a polymer with carboxyl groups as the base resin instead of a phenol-based polymer, since it can produce an esterification reaction with the alcoholic hydroxyl groups of the alicyclic alcohol that is added (see following formula):

The molecular weight (weight average molecular weight, Mw) of the alkali-soluble polymer described above may be varied within a wide range depending on the structure of the polymer, but it is normally preferred to be in the range of 2,000–1,000,000, and more preferably in the range of 3,000–50,000.

The alkali-soluble polymer to be used as the base resin for the invention may be prepared using a polymerization process commonly utilized in the field of polymer chemistry. For example, a (meth)acrylate-based copolymer can be successfully prepared by free radical polymerization of the prescribed monomers required for its preparation, by way of heating in the presence of a free radical initiator. As examples of free radical initiators there may be mentioned 2,2'-azobisisobutyronitrile (AIBN) and dimethyl-2,2-azoisobisbutyrate (MAIB). Film-forming polymers other than (meth)acrylate-based polymers may also be successfully prepared by similar commonly employed polymerization processes.

With regard to the resist composition of this invention (second invention), its details including the composition, properties and production should be referred to the above descriptions with regard to the resist composition of the first invention.

Third Invention:

The resist composition and the method for forming a resist pattern according to the present invention (third invention) can be practiced in various preferred embodiments as described in detail below.

The present invention relates to a chemically amplified negative resist composition for forming a negative resist pattern on a treated substrate, which can be developed with a basic aqueous solution.

This resist composition comprises (a) a film-forming first polymer having an alkali-soluble group, (b) a second polymer having on the side chain an alcohol structure, and (c) PAG (photoacid generator) capable of generating an acid which can decompose by absorbing a radiation for forming an image and cause a reaction of the moiety having an alcohol structure in the second polymer with the alkali-soluble group of the first polymer, and the composition itself is soluble in a basic aqueous solution.

The mechanism of chemical amplification in the resist composition of the present invention is described below. An example where a resin having vinyl phenol in the alkali-soluble moiety is used as the first polymer having an alkali-soluble group and a resin having on the side chain an alcohol structure represented by formula (3) is used as the second polymer, is described below.

Upon exposure to an image-forming radiation for development after the formation of the resist film, the PAG in the resist composition absorbs the radiation and generates an acid. In a preferred embodiment, the resist film is heated after this exposure. When the resist film is heated, the acid previously generated catalytically acts and a dehydration reaction of the tertiary alcohol takes place on the exposed area of the film as shown below, as a result, the alkali-soluble group of the polymer reacts with the phenol ring in the vicinity and the property thereof changes to be insoluble in a basic aqueous solution.

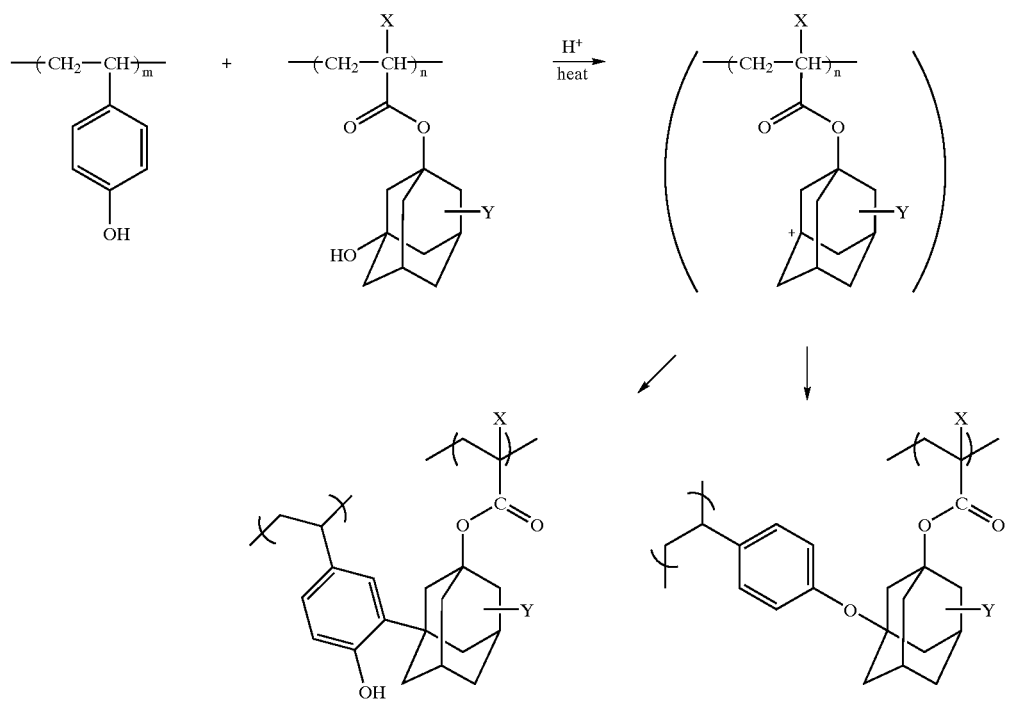

In this reaction, the cation after the dehydration reaction causes an electrophilic displacement reaction with the hydroxyl group of the vinyl phenol or the carbon at the ortho-position thereof. In the former, the reaction takes place directly with the alkali-soluble group to reduce the alkali solubility and in the latter, the alkali solubility is reduced by the strong hydrophobicity of the adamantyl group and the steric hindrance thereof. More specifically, in the former case, a reaction takes place to protect the hydroxyl group of the phenol ring in the first polymer by the OH group as a reaction site of the alcohol in the second polymer, so that the polarity of the exposed area changes and the alkali solubility greatly decreases in the exposed area. In the latter case, the phenol ring of the first polymer combines at the ortho-position with the OH group of the alcohol in the second polymer to cause a steric hindrance, so that the alkali solubility decreases in the exposed area. As such, the alkali solubility greatly decreases in the exposed area to give a negative pattern. Either one of the protection-type reaction or the alkali insolubility promoting reaction based on the steric hindrance may take place. The reaction is preferably predominated by the protection-type reaction because the change in the polarity on the exposed area can be maximally used. The reaction described in this example can be manly applied to the case where the exposure is performed using a KrF or EB light source.

Another example where an acrylic acid having a carboxylic acid unit is used for the alkali-soluble moiety of the first polymer and a polymer having on the side chain a compound of formula (3) is used as the second polymer having an alcohol structure, is described below. Similarly to the above-described case, a dehydration reaction takes place to cause a reaction with a carboxylic acid in the vicinity and thereby the alkali solubility of the first polymer decreases. Therefore, the alkali solubility extremely decreases in the exposed area to give a negative pattern. In this example, by the dehydration reaction of alcohol, only a reaction of protecting the carboxylic acid is generated. The reaction described in this example can be manly applied to the case where the exposure is performed using an ArF light source.

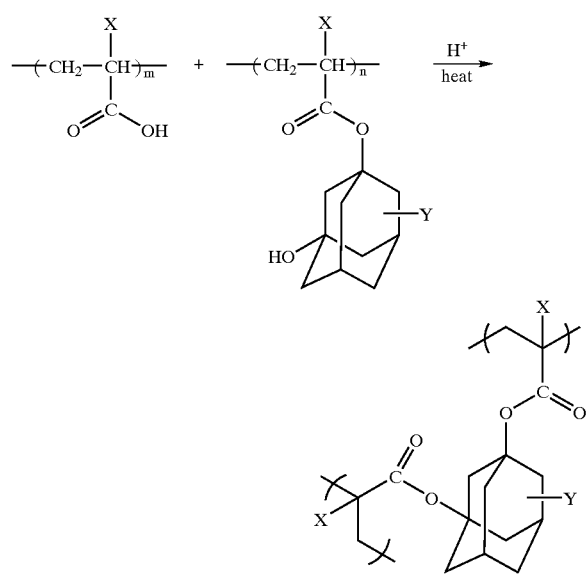

As is apparent from the description in the foregoing pages, the resist composition of the present invention is amplification type of containing a second polymer (additional resin) having an alcohol capable of reacting with the alkali-soluble group in the first polymer (base resin) and re-generating a protonic acid by the reaction, therefore, high sensitivity can be achieved. After the functional group is protected, due to the loss of the alkali-soluble group (change into an ether or an ester), the exposed area of the resist film becomes alkali-insoluble, therefore, a negative pattern can be formed by the development with a basic aqueous solution. Incidentally, in the present invention, the pattern formation is performed by using the change in the polarity generated in the polymer, therefore, a pattern free of swelling can be obtained.

The alkali-soluble polymer used as the base material in the resist composition of the present invention, particularly when the polymer is a terpolymer, may use a relatively strong alkali-soluble group represented by carboxylic acid or phenol, for the first monomer unit and a weak alkali-soluble group having, for example, a lactone ring structure, an acid anhydride or an imide ring structure, for the second monomer unit. If the case is so, the alkali solubility speed of the base resin can be easily controlled to a preferred value by controlling the contents of the strong alkali-soluble group and the weak alkali-soluble group. For the third monomer unit, a compound containing a functional group having etching resistance may be used and this is very preferred as the resist.

In the case where the alcohol structure contained in the second polymer of this resist composition is a tertiary alcohol, the dehydration reaction more readily occurs and this is very preferred. Other than this unit having an alcohol structure in the resin, a compound having an alcohol structure expected to undertake the above-described reaction may be separately contained as an additive and such a material construction is also preferred. The structure of this alcohol structure-containing compound is not particularly limited, however, on taking account of the contribution to the etching resistance, a polynuclear alicyclic compound or a compound having a benzene ring is preferred. Furthermore, it is also very preferred that this alcohol structure-containing compound has, similarly to the side chain of the second polymer, a tertiary alcohol structure which is easily dehydrated by an acid.

The structure of the alkali-soluble first polymer used as the base resin in the resist composition of the present invention is not particularly limited as long as the above-described conditions, particularly, the condition that the polymer has an appropriate alkali solubility speed, are satisfied. However, for obtaining dry etching resistance comparable to the novolak resist, a polymer with an acrylate- or methacrylate-type monomer unit having a polynuclear alicyclic hydrocarbon compound in the ester group, a vinyl phenol-type polymer, an N-substituted maleimide-type polymer or a styrene-type polymer is preferably used. Among these, the acrylate- or methacrylate-type polymer is preferred when a light source having a wavelength in the deep ultraviolet region, particularly at 220 nm or less is used, because the absorption of light at that wavelength is small. In other words, in the case of using a deep ultraviolet ray as the light source for exposure, it is preferred to use a polymer having a structure containing no aromatic ring which greatly absorbs the light in the deep ultraviolet region, or no chromophore having a large molar extinction coefficient, such as conjugate double bond.

Particularly, in the case of using a light source having an exposure wavelength in the ultrashort wavelength region, such as ArF excimer laser, not only the dry etching resistance but also the transparency at that wavelength (193 nm) are necessary, therefore, the above-described polymer having an ester group containing a polynuclear alicyclic hydrocarbon structure capable of exhibiting high dry etching resistance, represented by adamantyl group, bicyclo[2.2.1]octyl group and norbornyl group, is preferably used.

The structure of the second polymer having an alcohol structure, which can be advantageously used in the practice of the present invention, is not particularly limited, but in the case of using a polymer having a relatively high molecular weight, care must given to the compatibility so as not to cause phase separation from the base resin. In order to cause no phase separation, a combination with a polymer having a molecular weight as low as an oligomer is preferred, but this does not apply in the case of a combination with a polymer having high compatibility represented by vinyl phenols and acrylic resin, and a combination with such a resin system is also preferred. For the main chain of the second polymer, the same monomer as in the first polymer may be used.

Examples of the alcohol structure on the side chain of the second polymer include the following structures, however, the present invention is not limited thereto.

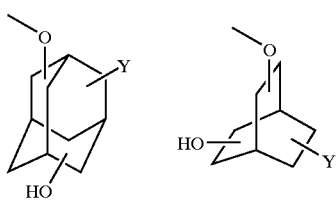
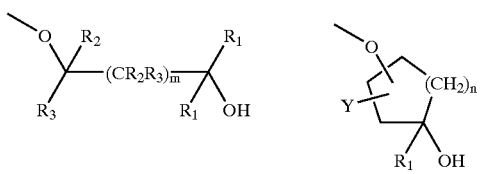
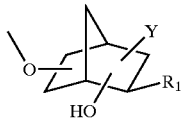

wherein $R_1$ to $R_3$, which may be the same or different, each represents hydrogen atom or an alkyl group having from 1 to 6 carbon atoms which may have a linear or branched structure or a cyclic structure, X represents hydrogen atom or a methyl group, Y is an arbitrary substituent containing hydrogen and represents an arbitrary alkyl group having from 1 to 6 carbon atoms, an alkoxycarbonyl group, a ketone group, a hydroxyl group or a cyano group, and n represents an integer of 1 to 6.

Examples of the second polymer having an alcohol structure includes the following polymers, however, the present invention is not limited thereto. In the following formulae, 1, mm and n each is a number of monomer units (repeating units) necessary for obtaining the above-described weight average molecular weight.

(1) Acylate- and Methacrylate-Type Polymers

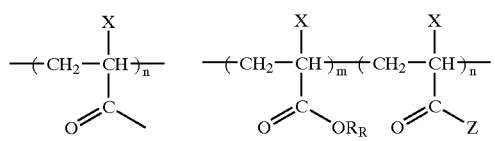

wherein Z is the moiety having an alcohol structure, X represents hydrogen atom or an alkyl group, and $R_R$ represents an arbitrary alkyl group which may have a linear, branched or cyclic structure and which may contain an aromatic group in the substituent.

(2) Norbornene-Type Polymers

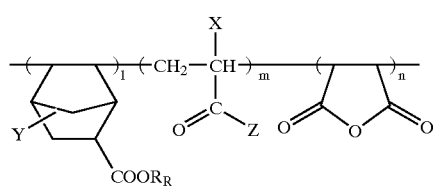

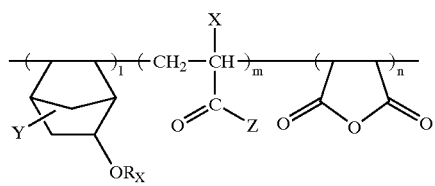

wherein X, Y, Z and $R_R$ have the same meanings as defined above, and $R_X$ represents an arbitrary alkyl group which may have a linear, branched or cyclic structure and which may contain an aromatic group in the substituent.

(3) Vinyl Phenol-Type Polymers

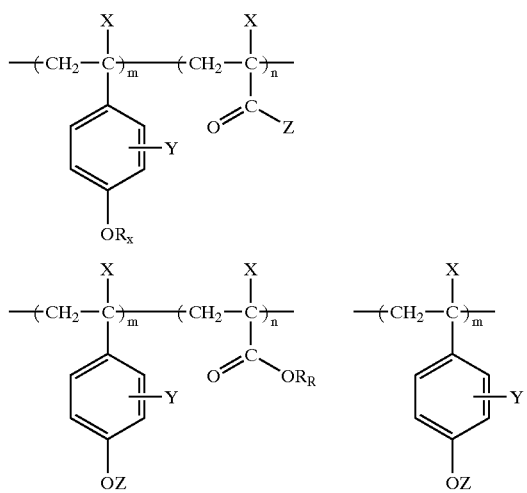

wherein X, Y, Z, $R_R$ and $R_X$ have the same meanings as defined above.

(4) Vinylbenzoic Acid-Type Polymer

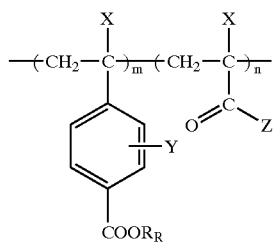

wherein X, Y, Z and $R_R$ have the same meanings as described above.

In addition, diesters of malecic acid, fumaric acid, itaconic acid and other similar acids may be used in the formation of the polymer, if desired.

As the compound having an alcohol structure, which is added to the resist composition of the present invention, for example, the following alcohol compounds can be advantageously used. Among these alcohol structures, a tertiary alcohol is preferred.

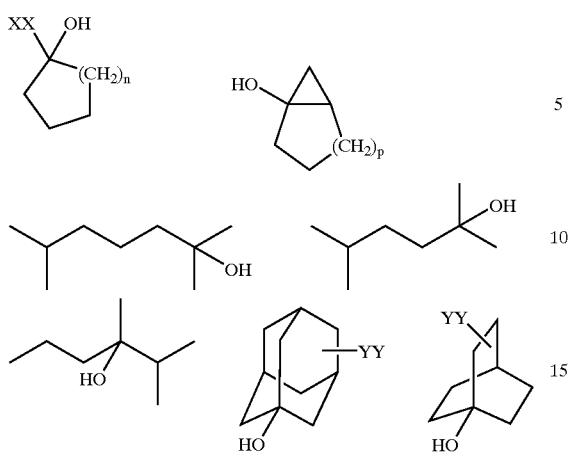

wherein XX is hydrogen atom or an alkyl group having from 1 to 8 carbon atoms which may have a linear, branched or cyclic structure and which may have a substituent, n is a number of 1 to 6, YY is an arbitrary substituent and represents an arbitrary alkyl group having from 1 to 6 carbon atoms, an alkoxycarbonyl group, a ketone group, a hydroxyl group or a cyano group.

The first polymer having an alkali-soluble group and the second polymer having on the side chain an alcohol structure for use in the present invention can e prepared by a polymerization method commonly used. For example, the polymer may be advantageously prepared by heating a predetermined monomer component in the presence of AIBN (2,2'-azobisisobutyronitrile) as a free radical initiator.

The methacrylate polymer is well known to have high transparency in the deep ultraviolet region, therefore, when for the first and second polymers, a structure not containing a chromophore having a large molar extinction coefficient in the vicinity of the exposure wavelength is appropriately selected, the resist obtained by combining these polymers with an appropriate amount of PAG (photoacid generator) can have high sensitivity capable of advantageously coping with the exposure using a deep ultraviolet ray.

As described above, the alkali-soluble first polymer has an alkali-soluble group which undertakes a reaction of insolubilizing the polymer in a basic aqueous solution under the acid catalytic reaction in the presence of an alcohol, and a protonic acid can be re-generated by these reactions, therefore, high sensitivity can be achieved. After the reaction, the alkali-solubility decreases because the alkali-soluble group disappears or due to the steric hindrance, as a result, the exposed area of the resist film becomes insoluble in a basic aqueous solution and when the resist film is developed, the unexposed area is dissolved and a negative pattern is obtained. In this case, the change in the polarity generated in the base resin is used, therefore, a pattern free of swelling can be obtained.

With regard to the resist composition of this invention (third invention), its details including the composition, properties and production should be referred to the above descriptions with regard to the resist composition of the first invention.

The resist composition of the present invention is further described in the following items.

(1) A negative resist composition comprising a first polymer having an alkali-soluble group, a second polymer having on the side chain an alcohol structure capable of reacting with the alkali-soluble group, and a photoacid generator capable of generating an acid which decomposes by absorbing a radiation for forming an image and excites a reaction between the alkali-soluble group of the first polymer and the alcohol of the second polymer, wherein the composition itself is soluble in a basic aqueous solution and upon exposure to the radiation for forming an image, the exposed area becomes insoluble in the basic aqueous solution under the action of the photoacid generator.

(2) The negative resist composition as described in item 1, wherein the reaction excited by the photoacid generator is a protection-type reaction of protecting the alkali-soluble group and/or an insolubility promotion-type reaction of promoting the insolubilization of the alkali-soluble group in a basic aqueous solution.

(3) The negative resist composition as described in item 1 or 2, wherein the alcohol structure is a tertiary alcohol structure.

(4) The negative resist composition as described in item 3, wherein the tertiary alcohol structure is represented by any one of formulae (1) to (4).

(5) The negative resist composition as described in any one of items 1 to 4, wherein the first polymer and the second polymer each comprises at least one monomer unit selected from the group consisting of acrylic acid-type, methacrylic acid-type, itaconic acid-type, vinylbenzoic acid-type, vinylphenol-type, bicyclo[2.2.1]hept-5-ene-2-carboxylic acid-type and N-substituted maleimide-type compounds and derivatives thereof.

(6) The negative resist composition as described in any one of items 1 to 5, wherein the content of the second polymer is from 0.1 to 80 wt % based on the total polymer weight of the first polymer and the second polymer.

(7) The negative resist composition as described in any one of items 1 to 6, wherein the molecular weight of the second polymer is from 500 to 100,000.

(8) The negative resist composition as described in any one of items 1 to 7, wherein a compound having an alcohol structure is further added.

(9) The negative resist as described in item 8, wherein the compound having an alcohol structure contains a tertiary alcohol structure.

(10) The negative resist composition as described in item 8 or 9, wherein the compound having an alcohol structure has a boiling point of at least 130° C.

(11) The negative resist composition as described in any one of items 8 to 10, wherein the compound having an alcohol structure contains an alicyclic structure or a polynuclear alicyclic structure.

(12) The negative resist composition as described in any one of items 8 to 11, wherein the compound having an alcohol structure contains at least one hydroxyl group, ketone group or alkyloxycarbonyl group.

(13) The negative resist composition as described in any one of items 1 to 12, wherein the first polymer further contains an alkali-soluble group selected from the group consisting of a lactone ring, an imide ring and an acid anhydride.

(14) The negative resist composition as described in any one of items 1 to 13, wherein the molecular weight of the first polymer is from 2,000 to 1,000,000.

(15) The negative resist composition as described in any one of items 1 to 14, wherein the absorbance at the wavelength of the exposure light source is $1.75/\mu m$ or less.

(16) The negative resist composition as described in any one of items 1 to 14, which contains a solvent selected from the solvent group consisting of ethyl lactate, methyl amyl ketone, methyl-3-methoxypropionate, ethyl-3-ethoxypropionate and propylene glycol methyl ether acetate, as a sole solvent or a mixed solvent comprising a plurality of solvents.

(17) The negative resist composition as described in item 16, which further contains a solvent selected from the group consisting of butyl acetate, γ-butyrolactone, propylene glycol methyl ether and a mixture thereof, as an auxiliary solvent.

(18) A method for forming a resist pattern, comprising a series of steps for coating the negative resist composition described in any one of items 1 to 8 on a treated substrate to form a resist film, for selectively exposing the resist film by a radiation for forming an image to accelerate the decomposition of the photoacid generator, and for developing the exposed resist film with a basic aqueous solution.

Fourth Invention:

A preferred mode of the negative resist composition utilizing a chemical amplification resist according to the present invention (fourth invention) will now be explained.

First, the negative resist composition comprises, as components directly contributing to the reaction for formation of the resist pattern, (1) a base resin composed of an alkali-soluble polymer, (2) a photo acid generator capable of decomposing upon absorption of image-forming radiation to generate an acid, and (3) an alicyclic alcohol with a reactive site that can undergo dehydration bonding reaction with the polymer of the base resin in the presence of the acid generated by the photo acid generator.

The above components insolubilize the light exposed sections by the reaction represented by formula (13). That is, the alicyclic alcohol has a highly polar group such as an alcoholic hydroxyl group in the molecule. The alicyclic alcohol is preferably a tertiary alcohol with a stereochemically fixed structure. This is because the bond produced by the reaction between the alkali-soluble group and tertiary alcohol of the base resin, resulting for example in an ether structure, is irreversibly fixed due to its stereochemical structure. Throughout this specification, a condition in which the situation prior to the reaction cannot be readily regenerated due to stereochemistry will be referred to as being "stereochemically fixed". A tertiary alcohol is preferred because it has high reactivity and more readily undergoes dehydration reaction. Such substances react with the polar groups of the base resin (phenolic hydroxyl groups, etc.) in the presence of an acid catalyst, resulting in stable esterification or etherification.

Then, diligent research by the present inventors has shown that the molecular weight distribution value is no greater than 1.5, and preferably no greater than 1.3 for the base resin in the negative resist composition of the invention. Using a base resin with a weight average molecular weight in the prescribed range can give even higher sensitivity and resolution.

A smaller molecular weight distribution of the base resin used can produce the insolubilization reaction at the exposed sections in a more preferred fashion. This is assumed to be because reduction of the molecular weight distribution of the base resin to achieve a uniform molecular weight results in almost simultaneous insolubilization of each molecule.

When a negative resist composition employing such a monodisperse resin as the base resin is exposed to light, even if the base resin is directly crosslinked by the image-forming radiation, the proportion is exceedingly minimal and therefore the molecular weight distribution of those sections even after the insolubilization reaction will not exceed 2.

Furthermore, a resist composition with even higher sensitivity and resolution can be obtained if there are no sections with a weight average molecular weight of 2,000 or less, and preferably all sections are in the range of 3,000 to 20,000. If the goal is to achieve a still higher sensitivity and higher resolution resist, it is recommended for the weight average molecular weight to be in the range of 5,000 to 10,000.

When the base resin is monodispersed, it may be blended with a polymer having a different weight average molecular weight. That is, even blending with polymers containing no portions with a weight average molecular weight of not more than 2,000 and having different weight average molecular weights of, for example, 5,000, 6,000 and 7,000 to form the base resin, will still allow the same effect as a monodisperse condition.

Since most monodisperse resins have a very high dissolution rate in developers, it may be prepared as a copolymer of another monomer (for example, styrene, methoxystyrene, etc.) and vinylphenol to lower the dissolution rate. For a lower dissolution rate of the monodisperse resin, a small amount of novolac or the like with a comparatively slower dissolution rate may be included.

Incidentally, a resist with high sensitivity and high resolution can also be achieved by controlling each of the individual molecules of the polymer composing the base resin so that no low molecular weight polymers are included with an (actual) molecular weight of not more than 2000. The present inventors have concluded that the resist sensitivity is reduced because the low molecular weight components essentially do not contribute to the insolubilizing effect.

When using a base resin with no more than 10 wt %, and preferably no more than 3 wt % of its content consisting of low molecular weight components of molecular weight below 2000, it is possible to form a satisfactory resist composition with practical high sensitivity and high resolution. As mentioned above, the base resin is preferably a monodisperse system, but a satisfactory negative resist composition can also be obtained simply by keeping a minimal content of low molecular weight components.

The base resin described above may be a polymer that is commonly used in the prior art, and phenol-based resins are preferred. As phenol-based resins there may be used the novolac types such as phenol-novolac and cresol-novolac, or the vinyl types such as polyvinylphenol; it is preferred to use polyvinylphenol which facilitates preparation of the molecular weight distribution and cutting of the low molecular weight portions.

Preparation of the molecular weight distribution and cutting of the low molecular weight portions of the base resin may be accomplished using separation methods such as living anion polymerization or gel permeation chromatography (GPC).

The effect due to monodispersion of the base resin is seen even with alicyclic alcohols having a plurality of hydroxyl groups, but it is particularly notable in the polarity-altering reaction system represented by formula (3) above, which involves no crosslinking reaction. That is, the negative-conversion (insolubilization) reaction in the resist of the invention is based primarily on a polarity change and there is virtually no increase in molecular weight. Consequently, no swelling occurs with development. When the aforementioned monodisperse resin is applied as the base resin, the molecular weight distribution of the insolubilized sections after light exposure is no greater than 2 even considering direct crosslinking by the image-forming radiation resulting in an increased molecular weight.

The alicyclic alcohol which is the third reaction component and the photoacid generator which is the second component will now be explained.

The alicyclic alcohol used may be one having one of the following structures.

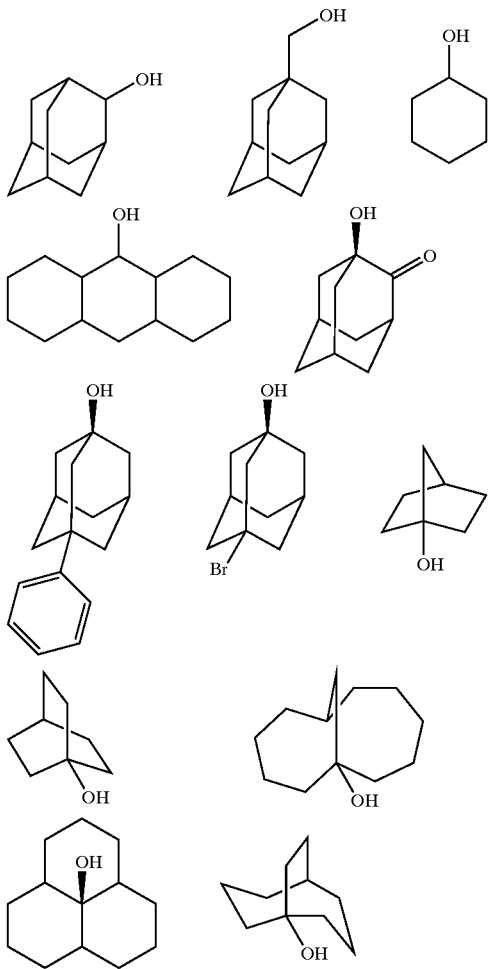

The alicyclic alcohol is used at about 2 parts to 60 parts, and preferably 15 parts to 40 parts, with respect to 100 parts of the base resin. If the amount of the alicyclic alcohol is too small, the polarity change occurring with the reaction will be lower making it impossible to achieve the essential contrast as a negative resist. On the other hand, if the amount of the alicyclic alcohol is too large, a greater exposure dose will be necessary to complete the substituent reaction, creating a poorly cost-effective situation. In addition, when the alicyclic alcohol is added in such a large amount, the thermal properties of the resist composition as a whole may be inferior and other undesirable problems such as precipitation during resist coating may occur.

With regard to the resist composition of this invention (fourth invention), its details including the composition, properties and production should be referred to the above descriptions with regard to the resist composition of the first invention.

The resist composition of the present invention is further described in the following items.

(1) A negative resist composition wherein the molecular weight distribution of the sections rendered insoluble by light exposure is between 1 and 2 inclusive.

(2) A negative resist composition according to (1), characterized by containing a base resin which comprises an alkali-soluble polymer, a photo acid generator which is capable of decomposing upon absorption of image-forming radiation to generate an acid, and an alicyclic alcohol with a reactive site that can undergo dehydration bonding reaction with the alkali-soluble group of the base resin in the presence of the acid generated by the photo acid generator.

(3) A negative resist composition according to (1) or (2), characterized in that the molecular weight distribution of the base resin is between 1 and 1.5 inclusive.

(4) A negative resist composition according to (2) or (3), characterized in that the weight average molecular weight of the base resin is at least 2000.

(5) A negative resist composition according to (4), characterized in that the weight average molecular weight of the base resin is from 3,000 to 20,000.

(6) A negative resist composition containing a base resin which comprises an alkali-soluble polymer, a photo acid generator which is capable of decomposing upon absorption of image-forming radiation to generate an acid, and an alicyclic alcohol with a reactive site that can undergo dehydration bonding reaction with the alkali-soluble group of the base resin in the presence of the acid generated by the photo acid generator, characterized in that no more than 10 wt % thereof consists of components with a molecular weight of not more than 2000 in the base resin.

(7) A negative resist composition according to any of (1) to (6), characterized in that the base resin contains a phenol-based compound.

(8) A negative resist composition according to (7), characterized in that the base resin is polyvinylphenol or a copolymer of vinylphenol and another monomer.

(9) A negative resist composition according to any of (1) to (8), characterized in that the alicyclic alcohol has an adamantane structure.

(10) A negative resist composition according to any of (1) to (9), characterized in that the alicyclic alcohol has a tertiary alcohol structure with a stereochemically fixed structure.

(11) A negative resist composition according to (10), characterized in that the tertiary alcohol is a 1-adamantanol or a derivative thereof.

(12) A negative resist composition according to any of (1) to (11), characterized in that the photo acid generator is one selected from the group consisting of onium salts, halogenated organic substances and sulfonic acid esters.

(13) A negative resist composition according to (12), characterized in that the onium salt is selected from the group consisting of compounds (A) to (D) mentioned above.

(14) A negative resist composition according to (12), characterized in that the halogenated organic substance is a triazine with a halogen in the structure or an isocyanurate with a halogen in the structure.

(15) A negative resist pattern forming method, which comprises the series of steps including coating a negative resist composition according to any of (1) to (14) onto a target substrate, selectively exposing the formed resist film to image-forming radiation that can induce decomposition of the photo acid generator of the resist composition, and developing the exposed resist film with a basic aqueous solution.

According to yet another aspect of the invention, there is provided a method for forming resist patterns, and particularly negative resist patterns, on target substrates using any one of the resist compositions of the present invention (first to fourth inventions). As already explained above, the negative resist pattern forming method of the invention is characterized by comprising the following steps:

coating a negative resist composition according to the invention onto a target substrate, selectively exposing the formed resist film to image-forming radiation that can induce decomposition of the photo acid generator of the resist composition, and developing the exposed resist film with a basic aqueous solution.

In the resist pattern forming method of the invention, the resist film formed on the target substrate is preferably subjected to heat treatment (or baking) after the selective exposure to image-forming radiation. Specifically, according to the method of the invention, the resist film may be prebaked before exposure, and then heat treated as post exposure baking (PEB) after exposure and before development, as explained above. The heat treatment may be successfully carried out according to a common method.

The negative resist pattern forming method of the invention may generally be carried out in the following manner.

First, the resist composition of the invention is coated onto a target substrate to form a resist film. The target substrate may be a substrate that is commonly used for manufacture of semiconductor devices and other such devices, a few examples of which are silicon substrates, glass substrates, non-magnetic ceramic substrates, compound semiconductor substrates and alumina and other insulating crystal substrates. If necessary, an additional layer such as a silicon oxide layer, a wiring metal layer, an interlayer insulating film, a magnetic film or the like may be present on these substrates, or different wirings, circuits and the like may be built therein. These substrates may be subjected to hydrophobic treatment by common methods to increase the cohesion of the resist film therewith. As an example of an appropriate hydrophobic treatment agent there may be mentioned 1,1,1,3,3,3-hexamethyldisilazane (HMDS).

As mentioned above, the resist composition is usually coated onto the target substrate in the form of a resist solution. The coating of the resist solution may be accomplished by a common technique such as spin coating, roll coating, dip coating or the like, but spin coating is particularly useful. The thickness of the resist film is not particularly restricted, but is normally preferred to be in the range of about 0.1–200 $\mu$m, and in the case of exposure with a KrF or ArF excimer laser, for example, the recommended range is about 0.1–1.5 $\mu$m. The thickness of the resist film to be formed can be varied within a wide range depending on such factors as the purpose for which the resist film will be used.

The resist film coated onto the substrate is preferably prebaked at a temperature of about 60–180° C. for about 30–120 seconds prior to its selective exposure with the image-forming radiation. The prebaking may be carried out using common heating means for resist processes. As examples of suitable heating means there may be mentioned a hot plate, an infrared heating oven or the like.

The prebaked resist film is then selectively exposed to image-forming radiation with a conventional light exposure apparatus. Suitable light exposure apparatuses include commercially available ultraviolet ray (far ultraviolet ray, deep ultraviolet ray) exposure apparatuses, X-ray exposure apparatuses, electron beam exposure apparatuses, excimer steppers and the like. The light exposure conditions may be selected as appropriate for the procedure. As was mentioned above, excimer lasers (KrF lasers with a wavelength of 248 nm, ArF lasers with a wavelength of 193 nm and other lasers) are particularly advantageous as light exposure sources for the invention. Throughout the present specification, therefore, the term "radiation" will mean light from these various types of light sources, i.e. ultraviolet rays, far ultraviolet rays, deep ultraviolet rays, an electron beam (EB), X-rays, laser light and the like. The selective light exposure results in absorption of the radiation by the film-forming polymer in the light exposed sections of the resist film by the mechanism described above, resulting in its decomposition and acid generation.

The exposed resist film is then subjected to post exposure baking (PEB) to cause an alkali-soluble group-protecting reaction catalyzed by the acid. The conditions for the post exposure baking are not particularly limited so long as they cause and adequately promote the intended protecting reaction, and for example, the baking may be carried out under the same conditions as the previous prebaking. For example, the post exposure baking temperature may be about 60–180° C., and preferably about 100–150° C., with a baking time of about 30–120 seconds. The post exposure baking conditions are preferably adjusted according to the desired pattern size, form, etc.

After completion of the post exposure baking, the exposed resist film is developed in a basic aqueous solution as the developer. For the development there may be used a common developing apparatus such as a spin developer, dip developer, spray developer or the like. The type of basic aqueous solution that may be advantageously used as the developer in this case is an aqueous solution containing the hydroxide of a metal of Group I or II of the Periodic Table, typical of which is potassium hydroxide, or an aqueous solution of an organic base containing no metal ions, such as a tetraalkylammonium hydroxide. The basic aqueous solution is more preferably an aqueous solution of tetramethylammonium hydroxide (TMAH) or tetraethylammonium hydroxide (TEAH). The basic aqueous solution may also contain an additive such as a surfactant to enhance the developing effect. The development results in dissolution and removal of the unexposed sections of the resist film, leaving a resist pattern of only the exposed sections on the substrate. In other words, according to the method of the invention it is possible to obtain an intricate negative resist pattern. Of particular importance is that a resist pattern according to the invention may be advantageously used for formation of wiring patterns with narrow line widths of 0.15 $\mu$m or smaller.

In addition, the present invention resides in a process for the production of electronic devices using the negative resist compositions of the present invention described above, and the electronic devices thus produced. Note that the "electronic devices" means a wide variety of electronic apparatuses including semiconductor devices and magnetic recording heads and thus they should not be restricted to the electronic devices having the specific structure. Further, as will be appreciated from: the above description, the negative resist composition of the present invention used in the production of the electronic devices according to the present invention includes all of the negative resist compositions according to the first to fourth inventions of the present invention.

The production process of electronic devices according to the present invention is characterized by using as a masking means a resist pattern formed from the negative resist composition of the present invention to selectively removing the underlying target substrate such as substrate, thinfilm and coating, thereby forming a predetermined functional element layer. Preferably, etching is used to selectively remove the target substrate.

As described above in connection with the formation of resist patterns, the underlying substrate, thinfilm and like to be selectively or patternwise removed upon etching is generally referred herein to "target substrate" (or "treated substrate"). That is, the target substrate means all of the substrates, thinfilms and coatings to be etched in the production of electronic devices such as semiconductor devices and magnetic heads. Although not restricted to, examples of suitable target substrates include a semiconductor substrate such as silicon substrate and GaAs substrate, an electrically insulating crystalline substrate such as compound semiconductor and alumina ($Al_2O_3$), and the following thinfilms or coatings:

PSG, TEOS, SiON, TiN, amorphous carbon, metal silicide such as Al—Si, Al—Si—Cu and WSi, polysilicon (Poly-Si), amorphous silicon, $SiO_2$, GaAs, TiW and others.

In addition to the above thinfilms and coatings, (giant) magnetoresistive layers including Cu, Co, FeMn, NiFe, LaSrMnO and others are also included in the scope of the target substrate.

According to the production process of the electronic devices according to the present invention, the target substrate remains as a patterned substrate, thinfilm or coating, and such a patterned product is referred herein to as a "functional element layer", because it can show the predetermined functions and effects in the produced electronic devices.

Preferably, the production process of electronic devices according to the present invention can be carried out by the following steps:

coating the negative resist composition of the present invention onto the target substrate, selectively exposing the formed resist film to image-forming radiation that can induce decomposition of the photo acid generator of the resist composition, developing the exposed resist film with a basic aqueous solution to form a resist pattern, and etching the target substrate in the presence of the resist pattern as a masking means to form a functional element layer.

As described hereinbefore, the image-forming radiation used in the exposure step of the resist film is not restricted to the specific one, and include a wide variety of light sources used in the resist process in the production of semiconductor devices and other devices. Typical examples of suitable light sources include Hg lamp such as g-line and i-line, KrF, ArF and other excimer lasers, electron beam and X-rays.

According to the present invention, there is also provided an electronic device comprising at least one patterned substrate, thinfilm or coating (functional element layer) in any suitable position(s) of the device, the functional element layer being formed using as a masking means a resist pattern formed from the negative resist composition of the present invention, in the selective removal process of the target substrate.

Next, the electronic device of the present invention and its production process will be further described referring to, particularly, semiconductor devices and magnetic heads.

The semiconductor device manufacturing process of the invention is preferably carried out using the following steps:

coating of a resist composition according to the invention onto a target substrate, selectively exposing the formed resist film to image-forming radiation capable of inducing decomposition of the photo acid generator in the resist composition, developing the exposed resist film with a basic aqueous solution to form a resist pattern, and etching the underlying target substrate for its removal, using the resist pattern as the masking means.

According to this semiconductor device manufacturing process, the step of forming the resist film, the step of selective light exposure with radiation and the step of forming the resist pattern may each be successfully accomplished in the manner described above.

The subsequent step of etching the resist pattern may be accomplished by wet etching or dry etching according to a common technique, but considering the recent progress in micronization and the trend toward environmental friendliness, dry etching is more advantageous. As is well known, dry etching accomplishes etching of a target substrate in a gas phase, and examples of suitable dry etching techniques are plasma etching techniques, such as reactive ion etching (RIE), reactive ion beam etching (RIBE) and ion beam etching. These dry etching techniques may be carried out under prescribed conditions using commercially available etching apparatuses.

For most purposes, the resist pattern formed by the method of the invention can be advantageously used as masking means for selective etching removal of an underlying target substrate in the manner described above, but so long as the resist pattern satisfies the prescribed conditions in terms of required properties, it can also be used as one of the elements of a semiconductor device, for example, as the insulating film itself.

The term "semiconductor device" as used throughout the present specification refers to semiconductor devices in the general sense and is not particularly limited. As is generally recognized in the technical field, typical semiconductor devices include common semiconductor integrated circuits such as ICs, LSIs and VLSIs, as well as other related devices.

More specifically, a MOS transistor, which is a typical instance of a semiconductor device, may be manufactured according to the invention in the following manner for illustration.

First, a gate oxidation film, polysilicon film and WSi film that are necessary for construction of a transistor are formed in that order as thin films on a silicon substrate. The thin films may be formed using a common thin film forming technique such as thermal oxidation, chemical vapor deposition (CVD) or the like.

Next, the resist composition of the invention is coated onto the WSi film to form a resist film of the prescribed thickness. The resist film is selectively exposed to radiation suitable for the patterning, and it is then developed in a basic aqueous solution for dissolution and removal of the exposed sections. More specifically, the series of steps to this point may be carried out in the manner described above for formation of the resist pattern.

In order to form a gate electrode structure, the resist pattern formed in the manner described above is used as a mask for simultaneous dry etching of the underlying WSi film and the polysilicon film under it. After thus forming a gate electrode comprising a polysilicon film and a WSi film, phosphorus is injected by ion injection to form an N⁻ diffusion layer for an LDD structure.

Next, after the resist pattern used in the previous step is released off from the electrode, an oxidation film is formed over the entire surface of the substrate by CVD, and the formed CVD oxidation film is subjected to anisotropic etching to form a side wall on the side of the gate electrode formed by the polysilicon film and WSi film. The WSi film and side wall are then used as a mask for ion injection to form an N⁺ diffusion layer, thereby coating the gate electrode with a thermal oxidation film.

Finally, an interlayer insulation film is formed over the entire uppermost layer of the substrate by CVD, and the resist composition of the invention is again coated thereover and selectively etched to form a hole pattern (resist pattern) in the wiring formation sections. The resist pattern is used as a mask for etching of the underlying interlayer insulation film, to form contact holes. The formed contact holes are then filled in with aluminum (Al) wiring. An N-channel intricate MOS transistor is thus completed.

In addition to the semiconductor described above, the present invention include magnetic recording heads as one embodiment of the electronic devices. That is, using the negative resist composition of the present invention in the resist process, it becomes possible to provide high performance thinfilm magnetic recording heads. The magnetic recording heads can be advantageously used in the production of magnetic recording and reading devices such as magnetic disk devices and magnetic tape devices.

The production process of the magnetic heads according to the present invention can be preferably carried out by the following steps:

coating the negative resist composition of the present onto the target substrate, selectively exposing the formed resist film to image-forming radiation that can induce decomposition of the photo acid generator of the resist composition, developing the exposed resist-film with a basic aqueous solution to form a resist pattern, and etching the target substrate in the presence of the resist pattern as a masking means to form a functional element layer.

Magnetic heads will be further described. Recently, magnetic recording and reading devices such as magnetic disk devices are being changed to a small size along with increase of the recording density, and, to satisfy the requirements in such recent devices, a magnetoresistive head (so-called "MR head") capable of converting a change of the signal magnetic field in the magnetic recording medium to a change of the electric resistance based on the magnetoresistive effects are widely used as a reproducing or reading head in such devices. Among the MR heads, the attractive one is a GMR head, i.e., giant magnetoresistive head, since it can exhibit high output without relying upon a moving speed of the magnetic recording medium. In particular, spin valve-type MR heads utilizing the magnetoresistive effects of the spin valve has been already practically used, because they can be relatively easily produced and, comparing with other MR heads, they can provide higher variation rate of the electric resistance at a low magnetic field. In the production of these and other magnetic heads, the negative resist compositions of the present invention can be advantageously used, since such resist composition can be fabricated into finely patterned film which is suitable as functional element(s) of the head.

To assist in further understanding of the magnetic head, the spin valve-type magnetic head will be further described with regard to the structure and production thereof. Note, however, that the magnetic heads of the present invention should not be restricted to the following heads.

As is well-known in the art, generally, the spin valve head comprises a magnetoresistive film (spin valve film) and, electrically connected thereto, a pair of electrodes which define a signal detection area and apply a signal detecting electric current to the signal detection area, and a pair of longitudinal bias magnetic field application films which apply longitudinal bias magnetic field to the spin valve head. The longitudinal bias magnetic field application films are generally formed from a hard magnetic film such as CoPt and CoCrPt. The application of the longitudinal bias magnetic field application films of hard magnetic material to those other than the magnetosensitive area (signal detection area) of the spin valve head in such a manner that such films are disposed in both sides or upper sides of the head can inhibit formation of Barkhausen's noise due to movement of the magnetic wall of free magnetic layer of the spin valve film, thus enabling to obtain stable reading profile without noise.

Further, generally, the spin valve film having a laminated structure which comprises a free magnetic layer, a nonmagnetic interlayer, a pinned magnetic layer and a regular anti-ferromagnetic layer, in sequence, on an underlayer. The application of such a layer structure is effective to control an angle by the magnetization directions of two magnetic layers (free magnetic layer and pinned magnetic layer) laminated through the nonmagnetic interlayer, thereby changing the electric resistance as desired.

More particularly, the spin valve film is generally formed on an alutic substrate, i.e., substrate comprising a TiC base having applied on a surface thereof an alumina film. The underlayer as the lowermost layer may be formed from a Ta coating an the like, because the Ta coating can give a good crystalinity to the free magnetic layer. The Ta coating or other underlayers can be generally formed using a conventional process such as sputtering, vacuum deposition and chemical vapour deposition (CVD).

The free magnetic layer may be formed from any soft magnetic material. For example, generally used CoFe alloy may be used in the formation of the free magnetic layer. Although not restricted to, the free magnetic layer may be preferably produced $(Co_yFe_{100-y})_{100-x} Z_x$ alloy having a face-centered cubic lattice structure in which Z represents any elements other Co and Fe, preferably boron B or carbon C, and x and y each is atomic percentage (at %), because heads having high sensitivity to magnetic field and a high heat resistance can be produced. The free magnetic field is preferably formed as a double layer structure than as a single layer, in view of the resulting properties. The free magnetic layer can be generally formed by using the conventional process such as sputtering.

In the spin valve film, it is preferred to sandwich a nonmagnetic interlayer with the free magnetic layer and a pinned magnetic layer which will be described below. As the nonmagnetic interlayer, generally, nonmagnetic metal such as copper (Cu) may be used. The Cu interlayer can be formed using the conventional process such as sputtering.

As in the formation of the free magnetic layer, the pinned magnetic layer may be formed from any soft magnetic material. That is, CoFe alloy may be used in the formation of the pinned magnetic layer, however, it may be preferably formed $(Co_yFe_{100-y})_{100-x} Z_x$ alloy having a face-centered cubic lattice structure in which Z represents any elements other Co and Fe, preferably boron B or carbon C, and x and y each is atomic percentage (at %), because heads having high output, high sensitivity to magnetic field and a high heat resistance can be produced. The pinned magnetic layer can be generally formed by using the conventional process such as sputtering.

A regular anti-ferromagnetic layer is formed over the pinned magnetic layer. The anti-ferromagnetic layer is generally formed from FeMn, NiMn, PtMn, PdMn, PdPtMn, CrMn, IrMn and the like, for example. As in the layers mentioned above, the anti-ferromagnetic layer can be generally formed by using the conventional process such as sputtering.

Generally, the spin valve film has a cap layer as the uppermost layer. The cap layer may be formed from, for example, Ta coating. As in the layers mentioned above, the cap layer can be generally formed by using the conventional deposition process.

The spin valve heads may be produced in accordance with any conventional methods. Particularly, according to the present invention, the above-mentioned functional element layers can be produced as an exactly and finely fabricated patter having the desired profile, when the resist process using the negative resist composition of the present invention is introduced into any desired step(s) of the head production process. The following is one example of producing a spin valve head according to the present invention.

First, tantalum (Ta) is deposited through sputtering on an alutic substrate to form a Ta underlayer. Next, the following layers are deposited, in sequence, by using a lift-off process, ion milling process and any other conventional processes, through an electrode (for example, Au) over the Ta underlayer exclusive of the magnetosensitive portion of the signal detection area of the head to be produced:

Underlayer, for example, Ta/NiFe-based alloy or NiFe-based alloy such as NiFe, NiFeCr, NiFeNf and NiFeMo;

Longitudinal bias magnetic field application layer, for example, anti-ferromagnetic material such as PtMn, PdPtMn, NiMn, CrMn and CrPtMn; and Underlayer, for example, NiFe-based alloy.

Next, to completely remove any contamination substances (so-called "contamination layer") from a surface of the resulting head, an uppermost surface of the Ta underlayer and NiFe underlayer is subjection to a cleaning process using sputter-etching, ion milling or other methods.

After completion of the above cleaning process, a free magnetic layer, a nonmagnetic interlayer, a pinned magnetic layer and a regular anti-ferromagnetic layer is deposited in the described order to form a spin valve film. Each layer may be formed by using sputtering, vapour deposition or CVD process, for example.

Thereafter, to obtain a spin valve film with the desired pattern, the spin valve layer is deposited over a full surface of the longitudinal bias magnetic field application layer, followed by forming a patterned resist layer from the negative resist composition of the present invention and then removing the undesired spin valve film with ion milling, for example.

After formation of the patterned spin valve film, a pair of electrodes is formed over the spin valve film exclusive of the magnetosensitive portion of the signal detection area of the head. The electrodes may be preferably formed upon lift-off fabrication of the Au layer. Of course, any other electrode material may be used in place of Au, if desired. The spin valve head is thus produced.

EXAMPLES

The present invention will now be explained by way of examples relating to preparation of resist compositions, formation of resist patterns and production of electronic devices including semiconductor devices and magnetic recording heads. It is to be understood, however, that the scope of the invention is not limited by these examples.

Example 1

A 3-hydroxy-adamantyl methacrylate/γ-butyrolacton-2-yl methacrylate/methacrylic acid copolymer (compositional ratio: 6:1:3) was dissolved in propyleneglycol methyl ether acetate (PGMEA) to make a 15 wt % solution. To this copolymer solution there was added γ-butyrolactone as a co-solvent to 9 wt % with respect to the copolymer. Triphenylsulfonium trifluoromethanesulfonate was added to the solution to 2 wt % with respect to the copolymer, and thoroughly dissolved therein. After filtering the resulting resist solution with a 0.2 μm Teflon™ membrane filter, it was spin coated at 2000 rpm onto an HMDS-treated silicon substrate and prebaked at 110° C. for 60 seconds. This produced a resist film with a thickness of 0.5 μm. After exposing the resist film to a KrF excimer laser stepper (NA=0.45) it was subjected to post exposure baking (FEB) at 120° C. for 60 seconds, developed with a 2.38% tetramethylammonium hydroxide (TMAH) aqueous solution and rinsed with deionized water for 60 seconds. Measurement of the resolution of the resulting negative resist pattern confirmed that an exposure dose of 14.0 mJ/cm$^2$ allowed resolution of a 0.25 μm line-and-space (L/S) pattern. Also, no swelling at all was found in the resist pattern.

In order to evaluate the dry etching resistance of the resist, the silicon substrate coated with the resist in this manner to 1 μm thickness was placed in a parallel plate RIE apparatus for $CF_4$ sputter etching under the following conditions: Pμ=200 W, pressure=0.02 Torr, $CF_4$ gas=100 sccm, for a period of 5 minutes. As shown in the table below, the etching rate was confirmed to be 689 Å/min.

For comparison, the dry etching resistance with the commercially available novolac resist, Nagase Positive Resist NPR-820 (product of Nagase Industries) and polymethyl methacrylate (PMMA) was evaluated in the same manner as above, giving the following results.

| Tested resist | Etching rate (Å/min) | Rate ratio |
| --- | --- | --- |
| NPR-820 | 530 | 1.00 |
| PMMA | 805 | 1.52 |
| Example 1 | 689 | 1.30 |

As seen from the results shown above, the dry etching resistance of the resist composition of the invention was close to that of the novolac resist, and much superior to that of PMMA.

Example 2

The procedure described in Example 1 was repeated, but for this example an ArF excimer laser exposure apparatus (NA=0.55) was used instead of the KrF excimer laser stepper, as the exposure apparatus. In this example, an exposure dose of 6.2 mJ/cm$^2$ allowed resolution of a 0.20 μm L/S pattern. The other properties of the obtained negative resist pattern were also satisfactorily comparable to the properties of Example 1.

Example 3

The procedure described in Example 1 was repeated, but for this example an electron beam exposure apparatus (output=50 kV) was used instead of the KrF excimer laser stepper, as the exposure apparatus. In this example, an exposure dose of 10 $\mu$C/cm$^2$ allowed resolution of a 0.15 $\mu$m L/S pattern. The other properties of the obtained negative resist pattern were also satisfactorily comparable to the properties of Example 1.

Example 4

A 3-hydroxy-adamantyl methacrylate/γ-butyrolacton-2-yl methacrylate/methacrylic acid copolymer (compositional ratio: 6:1:3) was dissolved in PGMEA to make a 15 wt % solution. To this copolymer solution there was added 20 wt % of 1-adamantanol (as an alcohol structure-containing compound) and 10 wt % of γ-butyrolactone (as a co-solvent), with respect to the copolymer. Diphenyliodonium trifluoromethanesulfonate was added to the solution to 2 wt % with respect to the copolymer, and thoroughly dissolved therein. After filtering the resulting resist solution with a 0.2 $\mu$m Teflon™ membrane filter, it was spin coated at 2000 rpm onto an HMDS-treated silicon substrate and prebaked at 110° C. for 60 seconds. This produced a resist film with a thickness of 0.5 $\mu$m. After exposing the resist film to an ArF excimer laser exposure apparatus (NA=0.55) it was subjected to post exposure baking (PEB) at 130° C. for 60 seconds, developed with a 2.38% TMAH aqueous solution and rinsed with deionized water for 60 seconds. Measurement of the resolution of the resulting negative resist pattern confirmed that an exposure dose of 3.4 mJ/cm$^2$ allowed resolution of a 0.18 $\mu$m L/S pattern. Also, no swelling at all was found in the resist pattern.

Evaluation of the dry etching resistance of the resist according to the method described in Example 1 confirmed an-etching rate of 678 Å/min, as shown in the table below. The table also shows the etching rates for the Nagase positive resist NPR-820 and PMMA.

| Tested resist | Etching rate (Å/min) | Rate ratio |
| --- | --- | --- |
| NPR-820 | 530 | 1.00 |
| PMMA | 805 | 1.52 |
| Example 4 | 678 | 1.28 |

As seen from the results shown above, the dry etching resistance of the resist composition of the invention was close to that of the novolac resist, and much superior to that of PMMA.

Example 5

A 3-hydroxy-adamantyl methacrylate/γ-butyrolacton-2-yl methacrylate/methacrylic acid copolymer (compositional ratio: 6:1:3) was dissolved in PGMEA to make a 15 wt % solution. To this copolymer solution there was added 20 wt % of 3-hydroxybicyclo[2.2.2]octane (as an alcohol structure-containing compound) and 10 wt % of γ-butyrolactone (as a co-solvent), with respect to the copolymer. Diphenyliodonium trifluoromethanesulfonate was added to the solution to 2 wt % with respect to the copolymer, and thoroughly dissolved therein. After filtering the resulting resist solution with a 0.2 $\mu$m Teflon™ membrane filter, it was spin coated at 2000 rpm onto an HMDS-treated silicon substrate and prebaked at 110° C. for 60 seconds. This produced a resist film with a thickness of 0.5 $\mu$m. After exposing the resist film to an ArF excimer laser exposure apparatus (NA=0.55) it was subjected to post exposure baking (PEB) at 120° C. for 60 seconds, developed with a 2.38% TMAH aqueous solution and rinsed with deionized water for 60 seconds. Measurement of the resolution of the resulting negative resist pattern confirmed that an exposure dose of 4.0 mJ/cm$^2$ allowed resolution of a 0.18 $\mu$m L/S pattern. Also, no swelling at all was found in the resist pattern.

Example 6

The procedure described in Example 5 was repeated, but for this example an electron beam exposure apparatus (output=50 kV) was used instead of the ArF excimer exposure apparatus. In this example, an exposure dose of 8 $\mu$C/cm$^2$ allowed resolution of a 0.15 $\mu$m L/S pattern. This resist pattern was also free of any swelling.

Example 7

A 3-hydroxy-adamantyl methacrylate/γ-butyrolacton-2-yl methacrylate/methacrylic acid copolymer (compositional ratio: 6:1:3) was dissolved in PGMEA to make a 15 wt % solution. To this copolymer solution there was added 15 wt % of 2,6-dimethyl-2-heptanol (as an alcohol structure-containing compound) and 10 wt % of γ-butyrolactone (as a co-solvent), with respect to the copolymer. Diphenyliodonium trifluoromethanesulfonate was added to the solution to 2 wt % with respect to the copolymer, and thoroughly dissolved therein. After filtering the resulting resist solution with a 0.2 $\mu$m Teflon™ membrane filter, it was spin coated at 2000 rpm onto an HMDS-treated silicon-substrate and prebaked at 110° C. for 60 seconds. This produced a resist film with a thickness of 0.5 $\mu$m. After exposing the resist film to an ArF excimer laser exposure apparatus (NA=0.55) it was subjected to post exposure baking (PEB) at 110° C. for 60 seconds, developed with a 2.38% TMAH aqueous solution and rinsed with deionized water for 60 seconds. Measurement of the resolution of the resulting negative resist pattern confirmed that an exposure dose of 5.2 mJ/cm$^2$ allowed resolution of a 0.20 $\mu$m L/S pattern. Also, no swelling at all was found in the resist pattern.

Example 8

After polymerizing 3-hydroxy-adamantyl methacrylate and 4-acetoxystyrene at a charging ratio of 1:9, the polymer was further treated with an alkali solution for solvolysis of the acetyl groups. The resulting 3-hydroxy-adamantyl methacrylate/vinylphenol copolymer (compositional ratio: 1:9) was dissolved in PGMEA to make a 15 wt % solution. To this solution there was added triphenylsulfonium trifluoromethanesulfonate to 5 wt % with respect to the copolymer, and it was thoroughly dissolved therein. After filtering the resulting resist solution with a 0.2 $\mu$m Teflon™ membrane filter, it was spin coated at 2000 rpm onto an HMDS-treated silicon substrate and prebaked at 110° C. for 60 seconds. This produced a resist film with a thickness of 0.5 $\mu$m. After exposing the resist film to a KrF excimer laser stepper (NA=0.45) it was subjected to post exposure baking (PEB) at 120° C. for 60 seconds, developed with a 2.38% TMAH aqueous solution and rinsed with deionized water for 60 seconds. Measurement of the resolution of the resulting negative resist pattern confirmed that an exposure dose of 6.8 mJ/cm$^2$ allowed resolution of a 0.25 µm L/S pattern. Also, no swelling at all was found in the resist pattern.

Evaluation of the dry etching resistance of the resist according to the method described in Example 1 confirmed an etching rate of 620 Å/min, as shown in the table below. The table also shows the etching rates for the Nagase positive resist NPR-820 and PMMA.

| Tested resist | Etching rate (Å/min) | Rate ratio |
|---|---|---|
| NPR-820 | 530 | 1.00 |
| PMMA | 805 | 1.52 |
| Example 8 | 541 | 1.02 |

As seen from the results shown above, the dry etching resistance of the resist composition of the invention was very close to that of the novolac resist, and much superior to that of PMMA.

Example 9

The procedure described in Example 8 was repeated, but for this example an electron beam exposure apparatus (output=50 kV) was used instead of the KrF excimer laser stepper. In this example, an exposure dose of 8 µC/cm$^2$ allowed resolution of a 0.12 µm L/S pattern. The other properties of the obtained negative resist pattern were also satisfactorily comparable to the properties of Example 8.

Example 10

A 3-hydroxy-adamantyl methacrylate/vinylphenol copolymer (compositional ratio: 1:9) was dissolved in PGMEA to make a 15 wt % solution. To this copolymer solution there was added 20 wt % of 1-adamantanol (as an alcohol structure-containing compound), with respect to the copolymer. Triphenylsulfonium trifluoromethanesulfonate was added to the solution to 5 wt % with respect to the copolymer, and it was thoroughly dissolved therein. After filtering the resulting resist solution with a 0.2 µcm Teflon™ membrane filter, it was spin coated at 2000 rpm onto an HMDS-treated silicon substrate and prebaked at 110° C. for 60 seconds. This produced a resist film with a thickness of 0.5 µm. After exposing the resist film to a KrF excimer laser stepper (NA=0.45) it was subjected to post exposure baking (PEB) at 110° C. for 60 seconds, developed with a 2.38% TMAH aqueous solution and rinsed with deionized water for 60 seconds. Measurement of the resolution of the resulting negative resist pattern confirmed that an exposure dose of 6.4 mJ/cm$^2$ allowed resolution of a 0.25 µm L/S pattern. Also, no swelling at all was found in the resist pattern.

Evaluation of the dry etching resistance of the resist according to the method described in Example 1 confirmed an etching rate of 599 Å/min, as shown in the table below. The table also shows the etching rates for the Nagase positive resist NPR-820 and PMMA.

| Tested resist | Etching rate (Å/min) | Rate ratio |
|---|---|---|
| NPR-820 | 530 | 1.00 |
| PMMA | 805 | 1.52 |
| Example 10 | 519 | 0.98 |

As seen from the results shown above, the dry etching resistance of the resist composition of the invention was comparable to that of the novolac resist, and much superior to that of PMMA.

Example 11

The procedure described in Example 8 was repeated, but for this example 20 wt % of 3-hydroxybicyclo[2.2.2]octane (as an alcohol structure-containing compound) was also included with respect to the copolymer during preparation of the copolymer solution. After light exposure using the KrF excimer laser stepper, post exposure baking (PEB) was carried out at 110° C. for 60 seconds. Measurement of the resolution of the resulting negative resist pattern confirmed that an exposure dose of 7.2 mJ/cm$^2$ allowed resolution of a 0.25 µm L/S pattern. The other properties of the obtained negative resist pattern were also satisfactorily comparable to the properties of Example 8.

Example 12

The procedure described in Example 10 was repeated, but for this example an electron beam exposure apparatus (output=50 kV) was used instead of the KrF excimer laser stepper, and the post exposure baking (PEB) was carried out at 120° C. for 60 seconds. In this example, an exposure dose of 7 µC/cm$^2$ allowed resolution of a 0.11 µm L/S pattern. The other properties of the obtained negative resist pattern were also satisfactorily comparable to the properties of Example 10.

Example 13

The procedure described in Example 11 was repeated, but for this example an electron beam exposure apparatus (output=50 kV) was used instead of the KrF excimer laser stepper, and the post exposure baking (PEB) was carried out at 120° C. for 60 seconds. In this example, an exposure dose of 8 µC/cm$^2$ allowed resolution of a 0.12 µm L/S pattern. The other properties of the obtained negative resist pattern were also satisfactorily comparable to the properties of Example 11.

Example 14

A vinyl benzoate/3-hydroxy-adamantyl methacrylate copolymer (compositional ratio: 3:7) was dissolved in PGMEA to make a 15 wt % solution. To this copolymer solution there was added 20 wt % of 1-adamantanol (as an alcohol structure-containing compound) and 10 wt % of γ-butyrolactone (as a co-solvent), with respect to the copolymer. Triphenylsulfonium trifluoromethanesulfonate was added to the solution to 2 wt % with respect to the copolymer, and thoroughly dissolved therein. After filtering the resulting resist solution with a 0.2 µm Teflon™ membrane filter, it was spin coated at 2000 rpm onto an HMDS-treated silicon substrate and prebaked at 110° C. for 60 seconds. This produced a resist film with a thickness of 0.5 μm. After exposing the resist film to a KrF excimer laser stepper (NA=0.45) it was subjected to post exposure baking (PEB) at 130° C. for 60 seconds, developed with a 2.38% TMAH aqueous solution and rinsed with deionized water for 60 seconds. Measurement of the resolution of the resulting negative resist pattern confirmed that an exposure dose of 17.5 mJ/cm$^2$ allowed resolution of a 0.28 μm L/S pattern. Also, no swelling at all was found in the resist pattern.

Example 15

The procedure described in Example 14 was repeated, but for this example an electron beam exposure apparatus (output=50 kV) was used instead of the KrF excimer laser stepper, and the post exposure baking (PEB) was carried out at 120° C. for 60 seconds. In this example, an exposure dose of 10 μC/cm$^2$ allowed resolution of a 0.12 μm L/S pattern. This resist pattern was also free of any swelling.

Example 16

The following substances were provided as resist components.
Base Resin 1
  Polyvinylphenol (weight average molecular weight: 12,000; distribution: 2.0)
Additive 1 (as Alicyclic Alcohol)
  1-adamantanol

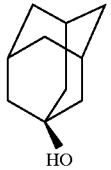

PAG1 (as Photoacid Generator)
  Triphenylsulfonium trifluoromethanesulfonate

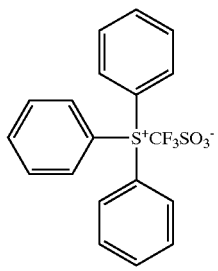

A resist solution was prepared by dissolving base resin 1, additive 1 and PAG1 in ethyl lactate in a weight ratio of 10:2:1. After filtering the resulting resist solution with a 0.2 μm Teflon™ membrane filter, it was spin coated at 2000 rpm onto an HMDS-treated silicon substrate and prebaked at 110° C. for 2 minutes. This produced a resist film with a thickness of 0.8 μm. The resist film was subjected to pattern exposure with the following three types of exposure apparatuses:
  i-ray exposure apparatus (wavelength: 365 nm)
  KrF excimer laser stepper (NA=0.45, wavelength: 248 nm)

Electron beam exposure apparatus (output: 50 kV) The exposure pattern was a 0.4 μm line-and-space (L/S) with i-rays, a 0.25 μm L/S with the KrF laser and a 0.25 L/S with the electron beam. After subsequent post-exposure baking (PEB) at 120° C. for 2 minutes, it was developed with a 2.38% tetramethylammonium hydroxide (TMAH) aqueous solution for 30 seconds and rinsed with deionized water for 60 seconds. Evaluation of the resolution of the resulting negative resist pattern gave the following results.
  i-rays: exposure dose=22 mJ/cm$^2$, resolution=⊙
  KrF laser: exposure dose=16 mJ/mc$^2$, resolution=⊙
  Electron beam: exposure dose=7 μC/cm$^2$, resolution=⊙
The resolution was evaluated based on the following 4-level scale.
  ⊙: Rectangular cross-sectional shape. Difference between dimensions of pattern top and dimension of pattern bottom less than 1% of exposure pattern dimensions.
  ○: Roughly rectangular cross-sectional shape. Difference between dimensions of pattern top and dimension of pattern bottom within 1–5% of exposure pattern dimensions.
  Δ: Somewhat tapered cross-sectional shape. Difference between dimensions of pattern top and dimension of pattern bottom greater than 5% but less than 10% of exposure pattern dimensions.
  X: Tapered cross-sectional shape. Difference between dimensions of pattern top and dimension of pattern bottom greater than 10% of exposure pattern dimensions.

The evaluation results are listed in Table 1 below for comparison with other resist compositions.

In order to next evaluate the dry etching resistance of the resist, a silicon substrate coated with the resist to 1 μm thickness in the same manner as described above was placed in a parallel plate RIE apparatus for CF$_4$ sputter etching under the following conditions: Pμ=200 W, pressure=0.02 Torr, CF$_4$ gas=100 sccm, for a period of 5 minutes. The etching rate was found to be 689 Å/min, thus confirming excellent dry etching resistance.

Examples 17–39

The procedure described in Example 16 was repeated, but for these examples the base resin, additive (alicyclic alcohol) and PAG (photoacid generator) were changed as shown in Table 1. The components used in these examples were as follows.
Base Resin 2
  Methacrylate/methyl methacrylate copolymer (copolymerization ratio: 35:65, weight average molecular weight: 10,000; distribution: 2.3)
Additive 2 (as Alicyclic Alcohol)

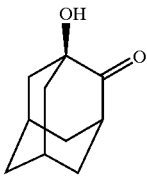

Additive 3 (as Alicyclic Alcohol)

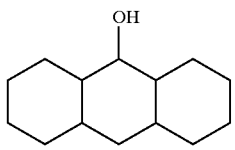

Additive 4 (as Alicyclic Alcohol)

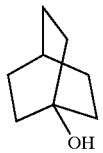

PAG2 (as Photoacid Generator)

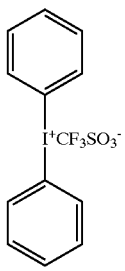

PAG3 (as Photoacid Generator)

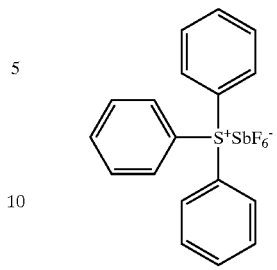

Table 1 below summarizes the results of evaluating the resist compositions for each example.

Comparative Examples 1–4

The procedure described in Example 16 was repeated, but for comparison in these comparative examples, three different commercially available negative melamine-based resists (detailed composition unknown) and a pinacol-based resist prepared for comparison were used, as shown in Table 1. The pinacol used in the pinacol-based resist had the following structure.

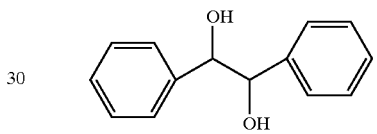

Table 1 summarizes the results of evaluating the resist compositions for each comparative example.

TABLE 1

| | | | | i-rays (365 nm) | | KrF (248 nm) | | Electron ray (50 kV) | |
|---|---|---|---|---|---|---|---|---|---|
| | | Component | | Exposure dose | Resolu- | Exposure dose | Resolu- | Exposure dose | Resolu- |
| Example | Resin | Additive | PAG | (mJ/cm$^2$) | tion | (mJ/cm$^2$) | tion | ($\mu$C/cm$^2$) | tion |
| 16 | 1 | 1 | 1 | 22 | ◎ | 16 | ◎ | 7 | ◎ |
| 17 | 1 | | 2 | 23 | ◎ | 16 | ◎ | 6 | ◎ |
| 18 | 1 | | 3 | 30 | ◎ | 16 | ◎ | 4 | ◎ |
| 19 | 2 | | 1 | 14 | ◎ | 15 | ◎ | 6 | ◎ |
| 20 | 2 | | 2 | 14 | ◎ | 14 | ◎ | 5 | ◎ |
| 21 | 2 | | 3 | 14 | ◎ | 15 | ○ | 2 | ◎ |
| 22 | 1 | 2 | 1 | 24 | ◎ | 18 | ◎ | 10 | ◎ |
| 23 | 1 | | 2 | 25 | ◎ | 15 | ◎ | 10 | ○ |
| 24 | 1 | | 3 | 30 | ◎ | 16 | ○ | 7 | ◎ |
| 25 | 2 | | 1 | 16 | ○ | 17 | ○ | 8 | ◎ |
| 26 | 2 | | 2 | 15 | ◎ | 15 | ◎ | 6 | ◎ |
| 27 | 2 | | 3 | 14 | ◎ | 15 | ◎ | 6 | ○ |
| 28 | 1 | 3 | 1 | 22 | ◎ | 15 | ◎ | 8 | ○ |
| 29 | 1 | | 2 | 22 | ○ | 20 | ○ | 8 | ◎ |
| 30 | 1 | | 3 | 25 | ○ | 20 | ◎ | 8 | ◎ |
| 31 | 2 | | 1 | 16 | ◎ | 18 | ◎ | 7 | ◎ |
| 32 | 2 | | 2 | 16 | ◎ | 15 | ◎ | 3 | ○ |
| 33 | 2 | | 3 | 20 | ◎ | 17 | ○ | 5 | ◎ |
| 34 | 1 | 4 | 1 | 30 | ○ | 18 | ◎ | 6 | ◎ |
| 35 | 1 | | 2 | 25 | ◎ | 17 | ◎ | 10 | ◎ |
| 36 | 1 | | 3 | 30 | ○ | 20 | ◎ | 10 | ◎ |
| 37 | 2 | | 1 | 12 | ◎ | 15 | ◎ | 5 | ○ |
| 38 | 2 | | 2 | 14 | ◎ | 14 | ○ | 8 | ◎ |
| 39 | 2 | | 3 | 12 | ◎ | 15 | ◎ | 7 | ◎ |
| Comp. Ex. 1 | 1 | melamine | 1 | 30 | ○ | 25 | Δ | 25 | Δ |
| Comp. Ex. 2 | 1 | melamine | halogen-based | 35 | ○ | 20 | ○ | 30 | Δ |
| Comp. Ex. 3 | 1 | melamine | ester-based | 32 | Δ | 18 | Δ | 30 | Δ |
| Comp. Ex. 4 | 1 | pinacol | 1 | 40 | Δ | 25 | Δ | 10 | ○ |

The results shown in Table 1 indicate that the resist compositions of the invention gave higher sensitivity and much more satisfactory resolution than the prior art products (the resists of the comparative examples). This is attributed to the greater polarity change which facilitated negative conversion of the resist at the exposed sections, thus creating a greater dissolution rate difference.

Example 40

To polyvinylphenol produced by Maruzen Sekiyu K. K., 7 wt % of a homopolymer (molecular weight: 2,000) of 3-hydroxyadamantyl methacrylate was added. The resulting mixture was dissolved in PGMEA (propylene glycol methyl ether acetate) to prepare a resin solution. To the solution obtained, 5 wt % of triphenylsulfonium trifluoromethanesulfonate was added and thoroughly dissolved. The thus-obtained resist solution was filtered through a 2.0 μm teflon membrane filter, spin-coated on a silicon substrate subjected to an HMDS treatment, and pre-baked at 110° C. for 60 seconds to form a 0.5 μm-thick resist film. This resist film was exposed by a KrF excimer laser stepper (NA=0.45), baked at 120° C. for 60 seconds, developed with a 2.38% tetramethylammonium hydroxide (TMAH) developer, and rinsed with deionized water. With an exposure amount of 14.0 mJ/cm$^2$, a resolution of 0.25 μmL/S was obtained. In this resist pattern, swelling was not generated.

Example 41

Using the resist solution prepared in Example 40, a 0.5 μm-thick resist film was formed on a silicon substrate similarly subjected to an HMDS treatment. This resist film was exposed by an EB exposure apparatus (50 kV), baked at 120° C. for 60 seconds, developed with a 2.38% tetramethylammonium hydroxide (TMAH) developer, and rinsed with deionized water. With an exposure amount of 12 μC/cm$^2$, a resolution of 0.15 μmL/S was obtained. In this resist pattern, swelling was not generated.

Example 42

To the resin solution prepared in Example 40, 10 wt % of 1-adamantanol was added based on the weight of polyvinylphenol and 5 wt % of diphenyliodonium trifluoromethanesulfonate was added based on the resin to prepare a resist solution. This resist solution was spin-coated on a silicon substrate subjected to an HMDH treatment and pre-baked at 110° C. for 60 seconds to form a 0.5 μm-thick resist film. This resist film was exposed by a KrF excimer laser exposure apparatus, baked at 120° C. for 60 seconds, developed with a 2.38% tetramethylammonium hydroxide (TMAH) developer, and rinsed with deionized water. With an exposure amount of 8 μC/cm$^2$, a resolution of 0.25 μmL/S was obtained. In this resist pattern, swelling was not generated.

Example 43

To the resin solution prepared in Example 40, 10 wt % of 3-hydroxybicyclo[2.2.2]octane and 10 wt % of γ-butyrolactone as an auxiliary solvent were added, each based on the weight of resin. Furthermore, 5 wt % of diphenyliodonium trifluoromethanesulfonate was added based on the resin to prepare a resist solution. This resist solution was spin-coated on a silicon substrate subjected to an HMDH treatment and pre-baked at 110° C. for 60 seconds to form a 0.5 μm-thick resist film. This resist film was exposed by a KrF excimer laser exposure apparatus, baked at 120° C. for 60 seconds, developed with a 2.38% tetramethylammonium hydroxide (TMAH) developer, and rinsed with deionized water. With an exposure amount of 9 mJ/cm$^2$, a resolution of 0.25 μmL/S was obtained. In this resist pattern, swelling was not generated.

Example 44

The resist film of Example 43 was exposed by an EB exposure apparatus (50 kV), baked at 120° C. for 60 seconds, developed with a 2.38% tetramethylammonium hydroxide (TMAH) developer, and rinsed with deionized water. With an exposure amount of 15 μC/cm$^2$, a resolution of 0.15 μmL/S was obtained. In this resist pattern, swelling was not generated.

Example 45

3-Hydroxyadamantyl methacrylate and 4-acetoxystyrene were charged at a charge ratio of 2:8 to synthesize a base resin. The resin obtained was treated with an alkali solution to cause soluvolysis of the acetyl group, thereby obtaining a 3-hydroxyadamantyl methacrylate-vinylphenol copolymer (molecular weight: 4,500). To polyvinylphenol produced by Maruzen Sekiyu, 15 wt % of the copolymer obtained was added and the mixture was dissolved in PGMEA (propylene glycol methyl ether acetate). To this solution, 5 wt % of triphenylsulfoium trifluoromethanesulfonate was added and thoroughly dissolved. The thus-obtained resist solution was filtered through a 0.2 μm teflon membrane filter, spin-coated on a silicon substrate subjected to an HMDS treatment, and pre-baked at 110° C. for 60 seconds to form a 0.5 μm-thick resist film. This resist film was exposed by a KrF excimer laser stepper (NA=0.45), baked at 120° C. for 60 seconds, developed with a 2.38% tetramethylammonium hydroxide (TMAH) developer, and rinsed with deionized water. With an exposure amount of 12.0 mJ/cm$^2$, a resolution of 0.25 μmL/S was obtained. In this resist pattern, swelling was not generated.

Example 46

The resist film of Example 45 was exposed by an EB exposure apparatus (50 kV), baked at 120° C. for 60 seconds, developed with a 2.38% tetramethylammonium hydroxide (TMAH) developer, and rinsed with deionized water. With an exposure amount of 18 μC/cm$^2$, a resolution of 0.12 μmL/S was obtained. In this resist pattern, swelling was not generated.

Example 47

To the resin solution prepared in Example 45, 5 wt % of 1-adamantanol was added based on the weight of resin and 5 wt % of triphenylsulfonium trifluoromethanesulfonate was added to prepare a resist solution. This resist solution was filtered through a 0.2 μm teflon membrane filter, spin-coated on a silicon substrate subjected to an HMDH treatment and pre-baked at 110° C. for 60 seconds to form a 0.5 μm-thick resist film. This resist film was exposed by a KrF excimer laser stepper (NA=0.45), baked at 110° C. for 60 seconds, developed with a 2.38% tetramethylammonium hydroxide (TMAH) developer, and rinsed with deionized water. With an exposure amount of 10 μC/cm$^2$, a resolution of 0.25 μmL/S was obtained. In this resist pattern, swelling was not generated.

Example 48

To the resin solution prepared in Example 45, 8 wt % of 3-hydroxybicyclo[2.2.2]octane was added based on the weight of resin to prepare a resist solution. This resist solution was filtered through a 0.2 μm teflon membrane filter, spin-coated on a silicon substrate subjected to an HMDH treatment and pre-baked at 110° C. for 60 seconds to form a 0.5 μm-thick resist film. This resist film was exposed by a KrF excimer laser stepper (NA=0.45), baked at 120° C. for 60 seconds, developed with a 2.38% tetramethylammonium hydroxide (TMAH) developer, and rinsed with deionized water. With an exposure amount of 9 mJ/cm², a resolution of 0.25 μmL/S was obtained. In this resist pattern, swelling was not generated.

Example 49

The resist film of Example 47 was exposed by an EB exposure apparatus (50 kV), baked at 120° C. for 60 seconds, developed with a 2.38% tetramethylammonium hydroxide (TMAH) developer, and rinsed with deionized water. With an exposure amount of 12 μC/cm², a resolution of 0.12 μmL/S was obtained. In this resist pattern, swelling was not generated.

Example 50

The resist film of Example 48 was exposed by an EB exposure apparatus (50 kV), baked at 120° C. for 60 seconds, developed with a 2.38% tetramethylammonium hydroxide (TMAH) developer, and rinsed with deionized water. With an exposure amount of 15 μC/cm², a resolution of 0.12 μmL/S was obtained. In this resist pattern, swelling was not generated.

Example 51

Ethyl vinylbenzoate and 4-hydroxyadamantyl acrylate were charged at a charge ratio of 7:3 to synthesize a resin (molecular weight: 3,000). The resin obtained was added to a monodisperse polyvinylphenol (molecular weight: 5,000) in an amount of 15 wt %, and the resulting mixture was dissolved in PGMEA (propylene glycol methyl ether acetate) to prepare a resin solution. To the solution obtained, 5 wt % of triphenylsulfoium trifluoromethanesulfonate was added and thoroughly dissolved. The thus-obtained resist solution was filtered through a 0.2 μm teflon membrane filter, spin-coated on a silicon substrate subjected to an HMDS treatment, and pre-baked at 110° C. for 60 seconds to form a 0.5 μm-thick resist film. This resist film was exposed by a KrF excimer laser stepper (NA=0.45), baked at 130° C. for 60 seconds, developed with a 2.38% tetramethylammonium hydroxide (TMAH) developer, and rinsed with deionized water. With an exposure amount of 17.5 mJ/cm², a resolution of 0.28 μmL/S was obtained. In this resist pattern, swelling was not generated.

Example 52

To the resin solution prepared in Example 51, 10 wt % of 1-adamantanol was added based on the weight of resin and 10 wt % of γ-butyrolactone was added. To this solution obtained, 5 wt % of triphenylsulfonium trifluoromethanesulfonate was added and thoroughly dissolved. The thus-obtained resist solution was filtered through a 0.2 μm teflon membrane filter, spin-coated on a silicon substrate subjected to an HMDH treatment and pre-baked at 110° C. for 60 seconds to form a 0.5 μm-thick resist film. This resist film was exposed by a KrF excimer laser stepper (NA=0.45), baked at 120° C. for 60 seconds, developed with a 2.38% tetramethylammonium hydroxide (TMAH) developer, and rinsed with deionized water. With an exposure amount of 12 mJ/cm², a resolution of 0.25 μmL/S was obtained. In this resist pattern, swelling was not generated.

Example 53

The resist film of Example 52 was exposed by an EB exposure apparatus (50 kV), baked at 120° C. for 60 seconds, developed with a 2.38% tetramethylammonium hydroxide (TMAH) developer, and rinsed with deionized water. With an exposure amount of 15 μC/cm², a resolution of 0.12 μmL/S was obtained. In this resist pattern, swelling was not generated.

Example 54

The following (I) polyvinylphenol-based base resins, (II) photoacid generators and (III) alicyclic alcohols were provided as components for the resist compositions in the examples.

(I) Base resins (polyvinylphenol)

1) Weight average molecular weight: 12,000 Molecular weight distribution: 2.0 (prior art)
2) Weight average molecular weight: 3,200 Molecular weight distribution: 1.15
3) Weight average molecular weight: 5,000 Molecular weight distribution: 1.11
4) Weight average molecular weight: 10,000 Molecular weight distribution: 1.11 2)+3)+4) above.

(II) Photoacid generators

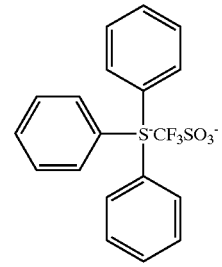

(1)

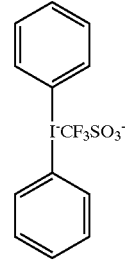

(2)

(III) Alicyclic alcohols

(1)

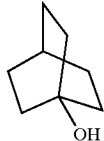

(2)

The above components were combined in order and dissolved in ethyl lactate to prepare a resist solution, and this was compared with a commercially available negative resist composition (melamine-based) and a pinacol-based resist prepared for comparison. The resist composition of the examples and the pinacol-based resist were prepared in a ratio of base resin:alicyclic alcohol:photoacid generator= 10:2:1 (weight ratio). After filtering each resulting resist solution with a 0.2 μm Teflon™ membrane filter, it was spin coated at 2000 rpm onto an HMDS-treated silicon substrate and prebaked at 100° C. for 2 minutes. The pinacol used was the one mentioned under "Prior Art" above. The three types of melamine-based resists used were commercially marketed ones and therefore their detailed compositions were unknown.

The resist film obtained above was subjected to pattern exposure with the following three types of exposure apparatuses:

(1) i-ray exposure apparatus (wavelength: 365 nm)

(2) KrF excimer laser stepper (NA=0.45, wavelength: 248 nm)

(3) Electron beam exposure apparatus (output: 50 kV)

The exposure pattern was a 0.4 μm line-and-space (L/S) with i-rays, a 0.25 μm L/S with the KrF laser and a 0.2 μm L/S with the electron beam. After subsequent post-exposure baking (PEB) at 120° C. for 2 minutes, it was developed with a 2.38% tetramethylammonium hydroxide (TMAH) aqueous solution for 30 seconds and rinsed with deionized water for 60 seconds. The resolution of each of the resulting negative resist patterns was evaluated. The results are shown in Table 2 below.

TABLE 2

| | Resin | Additive | PAG | i-rays (365 nm) Exposure dose (mJ/cm²) | Resolution | KrF (248 nm) Exposure dose (mJ/cm²) | Resolution | Electron beam (50 kV) Exposure dose (μC/cm²) | Resolution |
|---|---|---|---|---|---|---|---|---|---|
| Prior art | 1 | 1 | 1 | 22 | ○ | 16 | ○ | 7 | ○ |
| Non-monodisperse | 1 | | 2 | 23 | ○ | 16 | ○ | 6 | ○ |
| Invention resists | 2 | | 1 | 10 | ◎ | 8 | ◎ | 4 | ◎ |
| | 2 | | 2 | 11 | ◎ | 8 | ◎ | 3 | ◎ |
| | 3 | | 1 | 12 | ◎ | 9 | ◎ | 4 | ◎ |
| | 3 | | 2 | 9 | ◎ | 8 | ◎ | 4 | ◎ |
| | 4 | | 1 | 15 | ◎ | 12 | ◎ | 3 | ◎ |
| | 4 | | 2 | 7 | ◎ | 10 | ◎ | 2 | ◎ |
| | 5 | | 1 | 8 | ◎ | 8 | ◎ | 2 | ◎ |
| | 5 | | 2 | 8 | ◎ | 9 | ◎ | 2 | ◎ |
| Prior art | 1 | 2 | 1 | 30 | Δ | 18 | ○ | 6 | ○ |
| Non-monodisperse | 1 | | 2 | 25 | ○ | 17 | ○ | 10 | ○ |
| Invention resists | 2 | | 1 | 15 | ◎ | 6 | ◎ | 4 | ◎ |
| | 2 | | 2 | 14 | ◎ | 7 | ○ | 3 | ◎ |
| | 3 | | 1 | 12 | ◎ | 12 | ◎ | 2 | ◎ |
| | 3 | | 2 | 10 | ◎ | 9 | ◎ | 2 | ◎ |
| | 4 | | 1 | 15 | ◎ | 8 | ◎ | 5 | ◎ |
| | 4 | | 2 | 14 | ◎ | 9 | ◎ | 2 | ◎ |
| | 5 | | 1 | 14 | ◎ | 6 | ◎ | 2 | ◎ |
| | 5 | | 2 | 13 | ◎ | 9 | ◎ | 4 | ◎ |
| Commercially available resists for comparison | 1 | melamine | 1 | 30 | Δ | 25 | X | 25 | X |
| | 1 | melamine | halogen-based | 35 | Δ | 20 | Δ | 30 | X |
| | 1 | melamine | ester-based | 32 | X | 18 | X | 30 | X |
| | 1 | pinacol | 1 | 40 | X | 25 | X | 10 | Δ |

The symbols (◉, ○, Δ, and X) for the 4-level evaluation scale used in Table 2 are explained below.

◉: Rectangular cross-sectional shape of the formed pattern. Difference between dimensions of pattern top and dimension of pattern bottom less than 0.5% of exposure pattern dimensions.

○: Roughly rectangular cross-sectional shape of the formed pattern. Difference between dimensions of pattern top and dimension of pattern bottom within 0.5–1% of exposure pattern dimensions.

Δ: Somewhat tapered cross-sectional shape of the formed pattern. Difference between dimensions of pattern top and dimension of pattern bottom within 1–5% of exposure pattern dimensions.

X: Tapered cross-sectional shape of the formed pattern. Difference between dimensions of pattern top and dimension of pattern bottom greater than 5% of exposure pattern dimensions.

The results shown in Table 1 confirm that the negative resist compositions of the examples exhibited higher sensitivity and higher resolution than the common prior art products also tested.

Preferred examples of the invention have been described above, but it should be noted that the present invention is not limited to these specific embodiments, and different modifications and variations may also be applied while retaining the gist of the invention as laid out in the claims.

Example 55
Production of MOS transistor

As is illustrated in FIG. 1A, a gate oxide layer 2 was formed on a surface of silicon substrate 1, followed by forming a polysilicon layer (Poly-Si layer) 3 thereon with a CVD process. After formation of the Poly-Si layer 3, n-type impurities such as phosphorus was introduced to make a low resistance area. Then, a WSi layer 4 was formed with a sputtering process (CVD process and others may be used in place of the sputtering process).

Figure 1B:
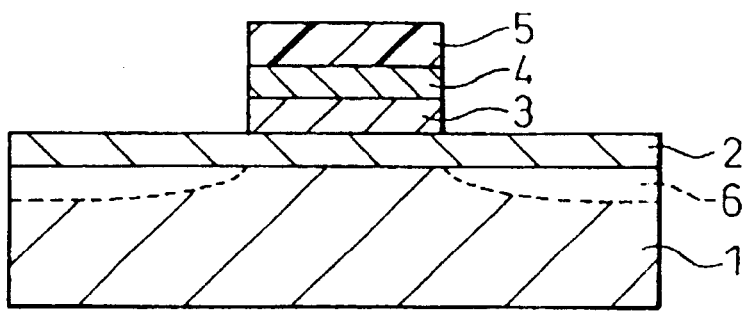

Next, as illustrated in FIG. 1B, to make patterning of the Poly-Si layer 3 and the WSi layer 4, the negative resist composition of the present invention was coated over a full surface of the WSi layer 4 formed in the previous step. After prebaking thereof, the resist layer 5 was exposed in a KrF excimer exposure apparatus, and then was subjected to post-exposure baking (PEB). The exposed resist layer 5 was alkaline developed to obtain resist patterns of 0.25 μm width. Anisotropic etching using the resist pattern as a mask was made to etch the WSi layer 4 and the Poly-Si layer 3 in sequence. A gate electrode consisting of the etched Poly-Si layer 3 and WSi layer 4. Thereafter, phosphorous was introduced through ion implantation process to form a N⁻ diffusion layer of LDD structure. The resist layer 5 was removed with a removing solution, after the pattern shown in FIG. 1B was obtained.

Figure 1C:
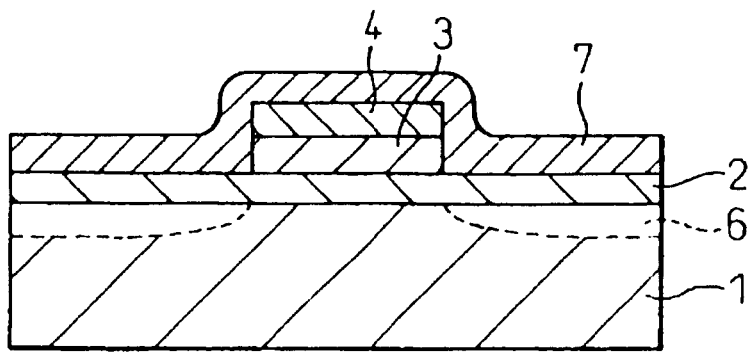

Following the formation of the gate electrode, as shown in FIG. 1C, an oxide layer 7 was fully formed with the CVD process.

Figure 1D:
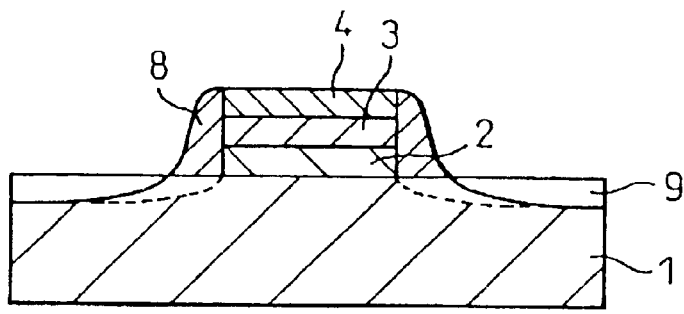

Then, as is shown in FIG. 1D, the oxide layer 7 was anisotropically etched to form a side wall 8 consisting of the WSi layer 4 and the Poly-Si layer 3 on the gate electrode side. Ion implantation was then made in the presence of the WSi layer 4 and the side wall 8 as a mask to form a N⁺ diffusion layer 9.

Figure 1E:
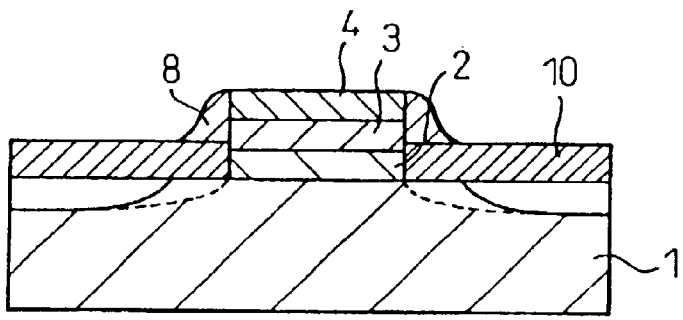

Thereafter, to activate the N⁺ diffusion layer, thermal treatment was made in an atmosphere of nitrogen, followed by heating in an atmosphere of oxygen. As shown in FIG. 1E, the gate electrode was covered with a thermal oxidation layer 10.

Figure 1F:
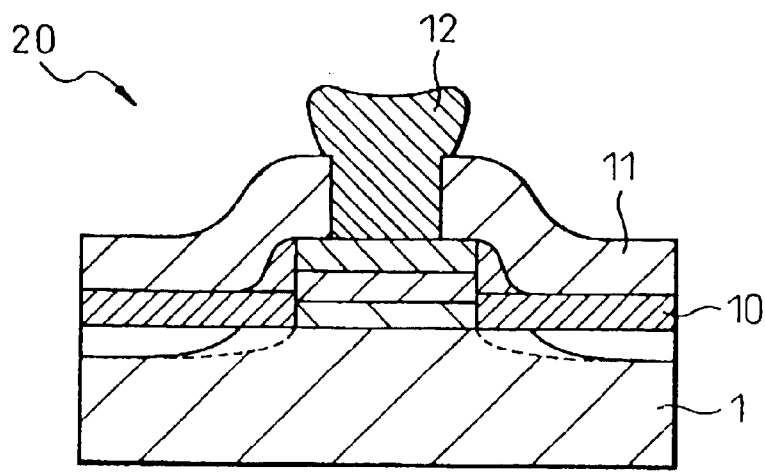

Following the formation of the thermal oxidation layer 10, as is shown in FIG. 1F, an interlayer insulating layer 11 was formed with the CVD process, and the interlayer insulating layer 11 was patterned using again the negative resist composition of the present invention. That is, the resist composition of the present invention was fully coated over the interlayer insulating layer 11, and the resist layer (not shown) was prebaked, exposed in a ArF excimer exposure apparatus and post-exposure baked. Upon alkaline development, hole-like resist patterns of 0.20 μm width were produced. Anisotropic etching using the resist patterns as a mask was made to form a contact holes in the interlayer insulating layer 11. An aluminum (Al) wiring 12 was deposited in the contact holes. As illustrated, a finely fabricated N-channel MOS transistor 20 was produced.

Example 56
Production of Thinfilm Magnetic Head

Figure 2A:
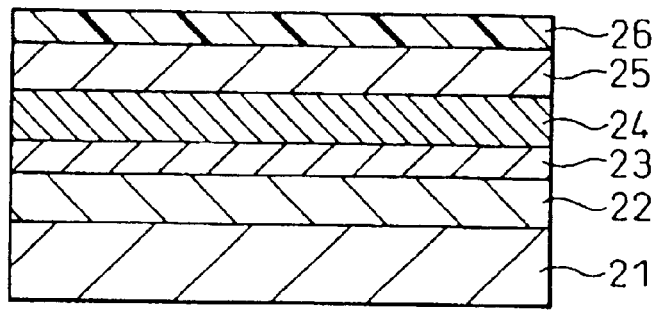
FIGS. 2A to 2I illustrate, in sequence, the production process of the thinfilm magnetic recording head according to the present invention.

As shown in FIG. 2A, a shield layer 22 of FeN and a gap insulating layer 23 of silicon oxide were deposited, in sequence, on an alutic substrate 21, followed by forming a magnetoresistive layer 24 having a thickness of 400 nm from FeNi with a sputtering process. The magnetoresistive layer 24 was coated with conventional PMGI resist (Microlithography Chemical Co., USA) to form a lower resist layer 25, and the lower resist layer 25 was overcoated with the negative resist composition of the present invention to form an upper resist layer 26.

Figure 2B:
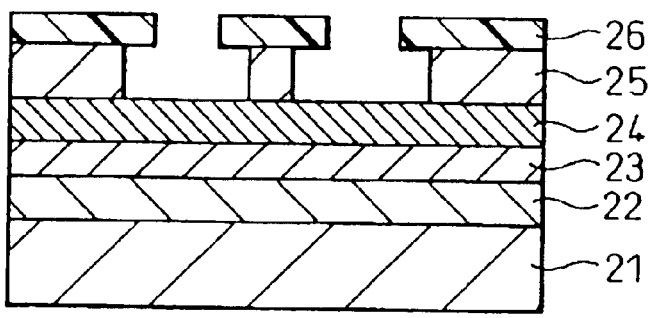

After the double-structured resist layer was formed in accordance with the above-mented method, the upper resist layer 26 was prebaked, exposed in a KrF excimer exposure apparatus and post-exposure baked. Upon alkaline development, resist patterns of 0.25 μm width were obtained. At the same time with the alkaline development, the lower resist layer 25 was isotropically developed to form an undercut profile of the resist patterns shown in FIG. 2B.

Figure 2C:
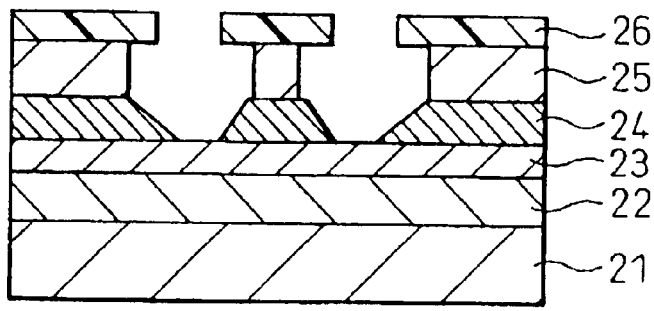
Figure 2D:
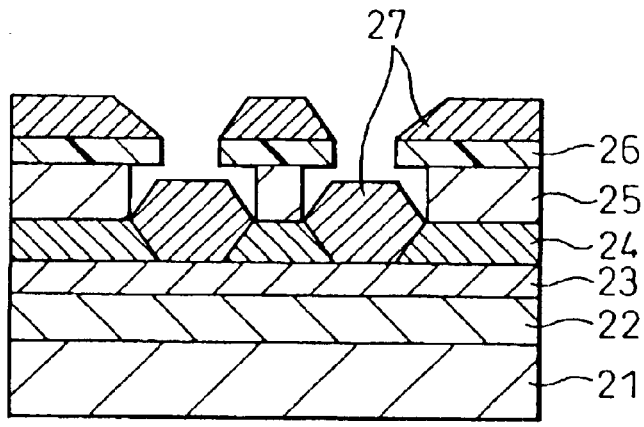

Then, as shown in FIG. 2C, ion milling was made using the resist patterns as a mask to conduct etching, thereby obtaining the tapered magnetoresistive layer 24.

Next, a TiW layer 27 was formed with sputtering on a full surface of the substrate 21. A thickness of the thus formed TiW layer 27 was 800 nm.

Figure 2E:
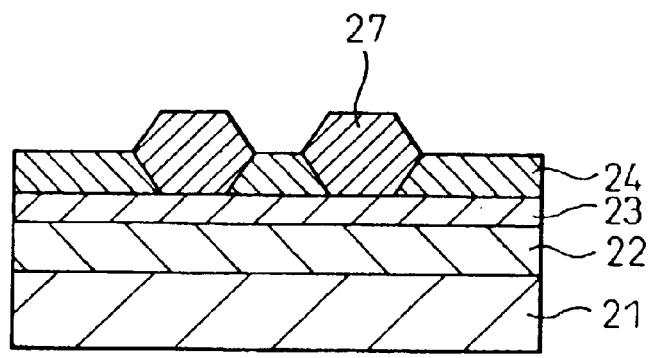

After the formation of the TiW layer 27 was completed, the lower resist layer 25 as well as the overlying upper resist layer 26 and TiW layer 27 were removed in accordance with a lift-off process. As shown in FIG. 2E, the TiW layer 27 were exposed.

Figure 2F:
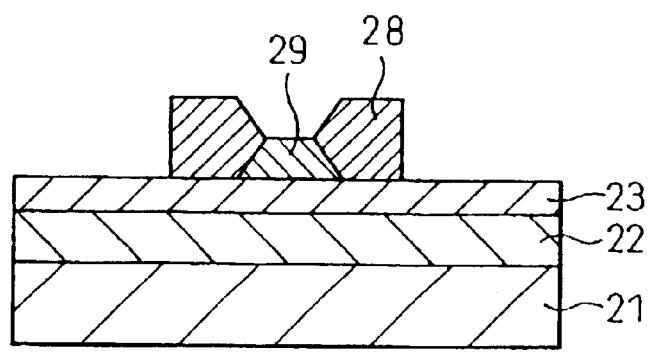

Thereafter, although not shown, the magnetoresistive layer 24 and the TiW layer 27 were patterned in accordance with the manner, described above, using the negative resist composition of the present invention. As shown in FIG. 2F, an electrode 28 and a magnetoresistive (MR) element 29 were thus formed.

Figure 2G:
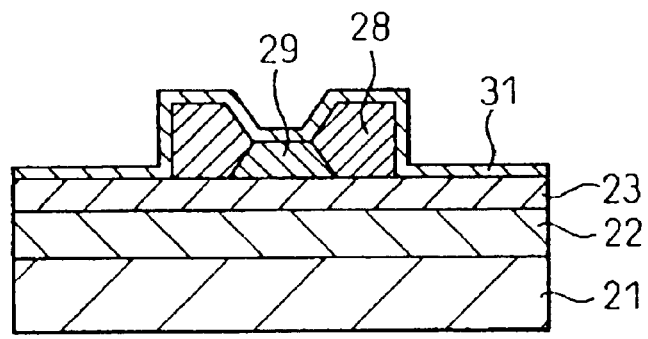

Following the above step, as shown in FIG. 2G, a gap insulating layer 31 having a thickness of 50 nm was formed from silicon oxide ($SiO_2$).

Figure 2H:
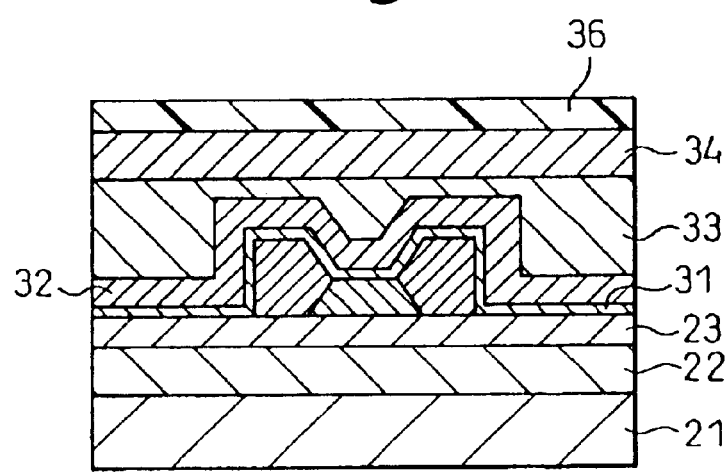

Next, as shown in FIG. 2H, a shield layer 32 of FeNi having a thickness of 3.5 μm, a gap layer 33 of $Al_2O_3$ having a thickness of 0.5 μm and a FeNi layer 34 having a thickness of 3 μm were formed, in sequence, over the gap insulating layer 31. Then, to form a writing magnetic pole upon patterning of the FeNi layer 34, the negative resist composition of the present invention was coated over a full surface of the FeNi layer 34 to form a resist layer 36.

Figure 2I:
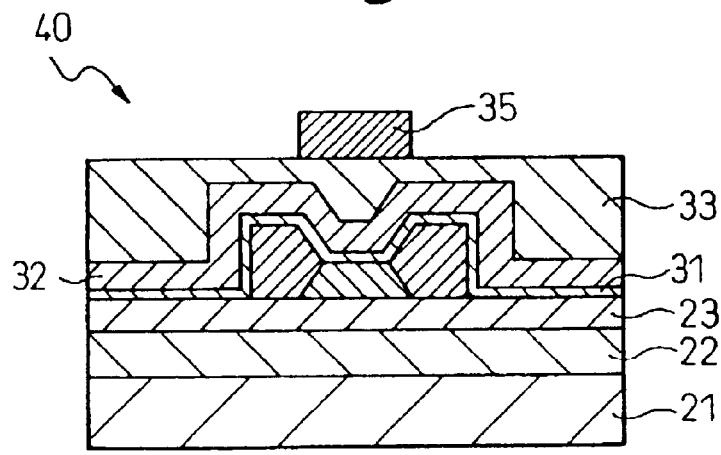

As a final step of the illustrated process, the resist layer 36 formed on the FeNi layer 34 was prebaked, exposed in a KrF excimer exposure apparatus and post-exposure baked. Upon alkaline development, fine resist patterns having opening in the site corresponding to the writing magnetic pole to be formed. Isotropic etching of the FeNi layer 34 using the resist patterns as a mask was made. As shown in FIG. 2I, a thinfilm magnetic head 40 having the writing magnetic pole 35 was thus produced.

EFFECT OF THE INVENTION

The effects of the present invention (first to fourth inventions) are summarized as follows.

(1) As explained above, when a resist composition according to the present invention is used it is possible to use a basic aqueous solution as the developer, thus allowing formation of intricate negative resist patterns with practical sensitivity and no swelling. A resist composition according to the invention is also suitable for deep ultraviolet image-forming radiation, typical of which are KrF and ArF excimer lasers, and has excellent dry etching resistance. Using a resist according to the invention can give a high polarity difference between the exposed sections and unexposed sections, to form intricate negative patterns with high sensitivity, high contrast and high resolution.

(2) As explained above, by using a resist composition according to the invention it is possible to achieve a large polarity difference between the exposed sections and unexposed sections, in order to form intricate negative resist patterns with high sensitivity, high contrast and high resolution. Moreover, basic aqueous solutions may be used as developers for formation of the resist patterns. The resist composition of the invention can also be applied to image-forming radiation sources in the deep ultraviolet range, typical of which are KrF excimer lasers, as well as electron beams, while also exhibiting high dry etching resistance. By using resists according to the invention it is possible to form intricate wiring patterns at high yields for the manufacture of semiconductor devices such as LSIs.

(3) As clearly known from the detailed description above, according to the inventions described in claims 1 to 8, the second polymer having on the side chain an alcohol structure is present together with the first polymer having an alkali-soluble group, so that due to the excitation of the photoacid generator by the exposure, the alcohol undertakes a protection reaction or the like of insolubilizing the alkali-soluble group in a basic aqueous solution and thereby the polarity of the exposed area is greatly changed. Therefore, a novel negative resist composition can be provided, which can form a dense and fine negative resist pattern free of swelling with practically usable sensitivity. Furthermore, the negative resist composition of the present invention can have high sensitivity as compared with conventional resist compositions and therefore the pattern can be formed using the change in the polarity, so that high contrast and high resolution can be easily attained.

In addition, according to the method for forming a resist pattern, the above-described novel negative resist composition is used, therefore, a resist pattern free of swelling can be formed with high sensitivity, high contrast and high resolution.

(4) As explained above, according to the present invention, the insolubilized sections are formed primarily by a reaction based on polarity changes, and therefore it is possible to provide a negative resist composition with vastly improved sensitivity and resolution without the problem of pattern swelling.

According to the present invention, there is included an alicyclic alcohol with a reactive site that can undergo dehydration bonding reaction with the alkali-soluble group of the base resin, and therefore the polarity change is increased when it is added to an alkali-soluble polymer, while the molecular weight distribution, or weight average molecular weight, of the sections insolubilized by light exposure is within a prescribed range, thus making it possible to obtain a negative resist composition with high sensitivity and high resolution.

According to the present invention, it is also possible to obtain a negative resist composition with high sensitivity and resolution.

Further, according to the present invention, it is possible to form an even more preferable negative resist composition.

Furthermore, according to the present invention, it is possible to obtain resist patterns with high sensitivity and high resolution.

We claim:

1. A method for the formation of a negative resist pattern, comprising the following steps:

coating a negative resist composition onto a target substrate, selectively exposing the formed resist film to image-forming radiation that can induce decomposition of the photo acid generator of said resist composition, and developing the exposed resist film with a basic aqueous solution;

said resist composition comprising:

(1) a film-forming polymer which is itself soluble in basic aqueous solutions, and contains a first monomer unit with an alkali-soluble group and a second monomer unit with an alcohol structure capable of reacting with said alkali-soluble group, and (2) a photo acid generator which, when decomposed by absorption of image-forming radiation, is capable of generating an acid that can induce reaction between the alcohol structure of said second monomer unit and the alkali-soluble group of said first monomer unit, or protect the alkali-soluble group of said first monomer unit, and being itself soluble in basic aqueous solutions but, upon exposure to said image-forming radiation, being rendered insoluble in basic aqueous solutions at its exposed sections as a result of the action of said photo acid generator.

2. A method according to claim 1, in which the alcohol structure of said second monomer unit is a tertiary alcohol structure represented by one of the following formulas (I) to (IV):

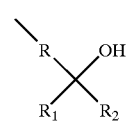

(I)

where R is linked to the main chain of said monomer unit and represents a bonding group that is copolymerizable with said first monomer, and $R_1$ and $R_2$ may be the same or different and each represents a linear, branched or cyclic hydrocarbon group;

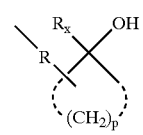

(II)

where R is as defined above,

Rx represents a hydrocarbon group of 1 to 8 carbons, and p is an integer of 2 to 9;

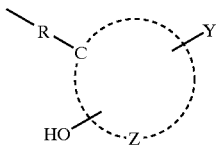

(III)

where R is as defined above,

Y represents a hydrogen atom or an optional substituent selected from the group consisting of alkyl, alkoxycarbonyl, ketone, hydroxyl and cyano groups, and Z represents atoms necessary to complete an alicyclic hydrocarbon group; or

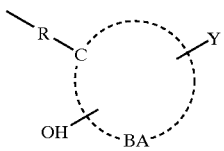

(IV)

where R and Y are as defined above, and

BA represents atoms necessary to complete a bicycloalkane ring.

3. A method according to claim 2, in which the proportion contributed by said second monomer unit is in the range of 0.1 to 70 mole percent based on the total amount of said copolymer.

4. A method according to claim 2, in which said first and second monomer units may be the same or different, and each represents one member selected from the group consisting of (meth)acrylic acid-based monomer units, itaconic acid-based monomer units, vinylphenol-based monomer units, vinylbenzoic acid-based monomer units, styrene-based monomer units, bicyclo[2.2.1]hept-5-ene-2-carboxylic acid-based monomer units, N-substituted maleimide-based monomer units and monomer units with an ester group containing a multiple or polycyclic alicyclic hydrocarbon portion.

5. A method according to claim 1, in which said first and second monomer units may be the same or different, and each represents one member selected from the group consisting of (meth)acrylic acid-based monomer units, itaconic acid-based monomer units, vinylphenol-based monomer units, vinylbenzoic acid-based monomer units, styrene-based monomer units, bicyclo[2.2.1]hept-5-ene-2-carboxylic acid-based monomer units, N-substituted maleimide-based monomer units and monomer units with an ester group containing a multiple or polycyclic alicyclic hydrocarbon portion.

6. A method according to claim 1 which, when it is used to form a film with a thickness of 1 µm by application onto a quartz substrate, has an absorbance of no greater than 1.75 µm−1 at the wavelength of the exposure light source used.

7. A method according to claim 1, in which the first and/or second monomer unit further has a weak alkali-soluble group selected from the group consisting of lactone rings, imide rings and acid anhydrides, bonded to the side chains thereof.

8. A method according to claim 1, which further contains a compound with an alcohol structure in the molecule.

9. A method according to claim 8, in which the alcohol structure of the compound is a tertiary alcohol structure.

10. A method according to claim 8, in which the alcohol structure-containing compound exhibits a boiling point of at least 130° C.

11. A method according to claim 1 which comprises a solvent selected from the group consisting of ethyl lactate, methyl amyl ketone, methyl-3-methoxypropionate, ethyl-3-ethoxypropionate, propyleneglycol methyl ether acetate and mixtures thereof.

12. A method according to claim 11, which further comprises, as a co-solvent, a solvent selected from the group consisting of butyl acetate, γ-butyrolactone, propyleneglycol methyl ether and mixtures thereof.

13. A method according to claim 1 which is used to form wiring patterns with a line width of 0.15 µm or smaller.

14. A method for production of electronic devices, which comprises using as a masking means a resist pattern formed from the negative resist composition to selectively remove the underlying target substrate, thereby forming a predetermined functional element layer, wherein said negative resist composition comprises:

(1) a film-forming polymer which is itself soluble in basic aqueous solutions, and contains a first monomer unit with an alkali-soluble group and a second monomer unit with an alcohol structure capable of reacting with said alkali-soluble group, and (2) a photo acid generator which, when decomposed by absorption of image-forming radiation, is capable of generating an acid that can induce reaction between the alcohol structure of said second monomer unit and the alkali-soluble group of said first monomer unit, or protect the alkali-soluble group of said first monomer unit, and being itself soluble in basic aqueous solutions but, upon exposure to said image-forming radiation, being rendered insoluble in basic aqueous solutions at its exposed sections as a result of the action of said photo acid generator.

15. A method according to claim 14, in which the alcohol structure of said second monomer unit is a tertiary alcohol structure represented by one of the following formulas (I) to (IV):

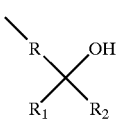

(I)

where R is linked to the main chain of said monomer unit and represents a bonding group that is copolymerizable with said first monomer, and R1 and R2 may be the same or different and each represents a linear, branched or cyclic hydrocarbon group;

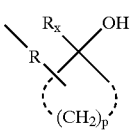

(II)

where R is as defined above,

Rx represents a hydrocarbon group of 1 to 8 carbons, and p is an integer of 2 to 9;

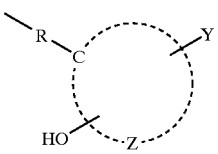
(III)

where R is as defined above,

Y represents a hydrogen atom or an optional substituent selected from the group consisting of alkyl, alkoxycarbonyl, ketone, hydroxyl and cyano groups, and Z represents atoms necessary to complete an alicyclic hydrocarbon group; or

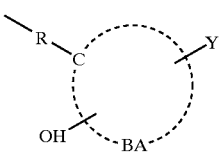
(IV)

where R and Y are as defined above, and

BA represents atoms necessary to complete a bicycloalkane ring.

16. A method according to claim 15, in which the proportion contributed by said second monomer unit is in the range of 0.1 to 70 mole percent based on the total amount of said copolymer.

17. A method according to claim 15, in which said first and second monomer units may be the same or different, and each represents one member selected from the group consisting of (meth)acrylic acid-based monomer units, itaconic acid-based monomer units, vinylphenol-based monomer units, vinylbenzoic acid-based monomer units, styrene-based monomer units, bicyclo[2.2.1]hept-5-ene-2-carboxylic acid-based monomer units, N-substituted maleimide-based monomer units and monomer units with an ester group containing a multiple or polycyclic alicyclic hydrocarbon portion.

18. A method according to claim 14, in which said first and second monomer units may be the same or different, and each represents one member selected from the group consisting of (meth)acrylic acid-based monomer units, itaconic acid-based monomer units, vinylphenol-based monomer units, vinylbenzoic acid-based monomer units, styrene-based monomer units, bicyclo[2.2.1]hept-5-ene-2-carboxylic acid-based monomer units, N-substituted maleimide-based monomer units and monomer units with an ester group containing a multiple or polycyclic alicyclic hydrocarbon portion.

19. A method according to claim 14 which, when it is used to form a film with a thickness of 1 μm by application onto a quartz substrate, has an absorbance of no greater than 1.75 μm−1 at the wavelength of the exposure light source used.

20. A method according to claim 14, in which the first and/or second monomer unit further has a weak alkali-soluble group selected from the group consisting of lactone rings, imide rings and acid anhydrides, bonded to the side chains thereof.

21. A method according to claim 14, which further contains a compound with an alcohol structure in the molecule.

22. A method according to claim 21, in which the alcohol structure of the compound is a tertiary alcohol structure.

23. A method according to claim 21, in which the alcohol structure-containing compound exhibits a boiling point of at least 130° C.

24. A method according to claim 14 which comprises a solvent selected from the group consisting of ethyl lactate, methyl amyl ketone, methyl-3-methoxypropionate, ethyl-3-ethoxypropionate, propyleneglycol methyl ether acetate and mixtures thereof.

25. A method according to claim 24, which further comprises, as a co-solvent, a solvent selected from the group consisting of butyl acetate, γ-butyrolactone, propyleneglycol methyl ether and mixtures thereof.

26. A method according to claim 14 which is used to form wiring patterns with a line width of 0.15 μm or smaller.

27. A method for the production of electronic devices according to claim 14, which comprises the following steps:

coating said negative resist composition onto the target substrate, selectively exposing the formed resist film to image-forming radiation that can induce decomposition of the photo acid generator of said resist composition, developing the exposed resist film with a basic aqueous solution to form a resist pattern, and etching said target substrate in the presence of said resist pattern as a masking means to form said functional element layer.

28. A method according to claim 27, in which the alcohol structure of said second monomer unit is a tertiary alcohol structure represented by one of the following formulas (I) to (IV):

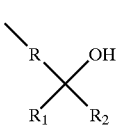
(I)

where R is linked to the main chain of said monomer unit and represents a bonding group that is copolymerizable with said first monomer, and R1 and R2 may be the same or different and each represents a linear, branched or cyclic hydrocarbon group;

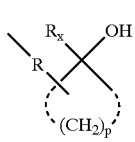
(II)

where R is as defined above,

Rx represents a hydrocarbon group of 1 to 8 carbons, and p is an integer of 2 to 9;

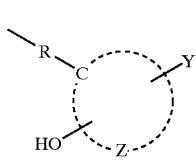
(III)

where R is as defined above,

Y represents a hydrogen atom or an optional substituent selected from the group consisting of alkyl, alkoxycarbonyl, ketone, hydroxyl and cyano groups, and Z represents atoms necessary to complete an alicyclic hydrocarbon group; or

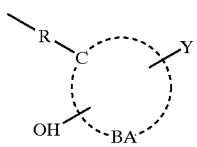

(IV)

where R and Y are as defined above, and

BA represents atoms necessary to complete a bicycloalkane ring.

29. A method according to claim 28, in which the proportion contributed by said second monomer unit is in the range of 0.1 to 70 mole percent based on the total amount of said copolymer.

30. A method according to claim 28, in which said first and second monomer units may be the same or different, and each represents one member selected from the group consisting of (meth)acrylic acid-based monomer units, itaconic acid-based monomer units, vinylphenol-based monomer units, vinylbenzoic acid-based monomer units, styrene-based monomer units, bicyclo[2.2.1]hept-5-ene-2-carboxylic acid-based monomer units, N-substituted maleimide-based monomer units and monomer units with an ester group containing a multiple or polycyclic alicyclic hydrocarbon portion.

31. A method according to claim 27, in which said first and second monomer units may be the same or different, and each represents one member selected from the group consisting of (meth)acrylic acid-based monomer units, itaconic acid-based monomer units, vinylphenol-based monomer units, vinylbenzoic acid-based monomer units, styrene-based monomer units, bicyclo[2.2.1]hept-5-ene-2-carboxylic acid-based monomer units, N-substituted maleimide-based monomer units and monomer units with an ester group containing a multiple or polycyclic alicyclic hydrocarbon portion.

32. A method according to claims 27 which, when it is used to form a film with a thickness of 1 $\mu$m by application onto a quartz substrate, has an absorbance of no greater than 1.75 $\mu$m−1 at the wavelength of the exposure light source used.

33. A method according to claim 27, in which the first and/or second monomer unit further has a weak alkali-soluble group selected from the group consisting of lactone rings, imide rings and acid anhydrides, bonded to the side chains thereof.

34. A method according to claim 27, which further contains a compound with an alcohol structure in the molecule.

35. A method according to claim 33, in which the alcohol structure of the compound is a tertiary alcohol structure.

36. A method according to claim 33, in which the alcohol structure-containing compound exhibits a boiling point of at least 130° C.

37. A method according to claim 27 which comprises a solvent selected from the group consisting of ethyl lactate, methyl amyl ketone, methyl-3-methoxypropionate, ethyl-3-ethoxypropionate, propyleneglycol methyl ether acetate and mixtures thereof.

38. A method according to claim 37, which further comprises, as a co-solvent, a solvent selected from the group consisting of butyl acetate, γ-butyrolactone, propyleneglycol methyl ether and mixtures thereof.

39. A method according to claim 27 which is used to form wiring patterns with a line width of 0.15 $\mu$m or smaller.

* * * * *